United States Patent
Kubota et al.

(10) Patent No.: US 10,437,123 B2
(45) Date of Patent: Oct. 8, 2019

(54) LIQUID CRYSTAL DISPLAY DEVICE AND ELECTRONIC DEVICE

(71) Applicant: Semiconductor Energy Laboratory Co., Ltd., Atsugi-shi, Kanagawa-ken (JP)

(72) Inventors: Daisuke Kubota, Atsugi (JP); Makoto Kaneyasu, Fukuoka (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 97 days.

(21) Appl. No.: 15/738,696

(22) PCT Filed: Jun. 23, 2016

(86) PCT No.: PCT/IB2016/053727
§ 371 (c)(1),
(2) Date: Dec. 21, 2017

(87) PCT Pub. No.: WO2017/006202
PCT Pub. Date: Jan. 12, 2017

(65) Prior Publication Data
US 2018/0180960 A1  Jun. 28, 2018

(30) Foreign Application Priority Data
Jul. 3, 2015  (JP) ................. 2015-134308

(51) Int. Cl.
*G02F 1/1362*  (2006.01)
*G02F 1/1368*  (2006.01)
(Continued)

(52) U.S. Cl.
CPC ...... *G02F 1/136286* (2013.01); *G02F 1/1368* (2013.01); *G09G 3/3648* (2013.01);
(Continued)

(58) Field of Classification Search
CPC ............ G02F 1/136286; G02F 1/1368; G02F 2201/40; G02F 2202/10; H01L 29/786;
(Continued)

(56) References Cited

U.S. PATENT DOCUMENTS 8,278,162 B2  10/2012  Akimoto et al.
8,304,300 B2  11/2012  Sakata et al.
(Continued)

FOREIGN PATENT DOCUMENTS

CN    101944506 A    1/2011
CN    102422426 A    4/2012
(Continued)

OTHER PUBLICATIONS

International Search Report (Application No. PCT/IB2016/053727) dated Sep. 20, 2016.
(Continued)

*Primary Examiner* — Charles S Chang
(74) *Attorney, Agent, or Firm* — Robinson Intellectual Property Law Office; Eric J. Robinson

(57) ABSTRACT

A novel liquid crystal display device is provided.
Two pixels each include a transistor that includes a back gate. The transistor is connected to the common gate line and data line. A threshold voltage is controlled by a control signal supplied to a back gate so that while data is written to one pixel, the transistor of the other pixel is not turned on. The aperture ratio is improved by reducing the number of wirings connected to the pixel and increasing the frequency of the control signal supplied to the back gate.

11 Claims, 43 Drawing Sheets

(51) Int. Cl.
*H01L 29/786* (2006.01)
*G09G 3/36* (2006.01)

(52) U.S. Cl.
CPC ........ *H01L 29/786* (2013.01); *G02F 2201/40* (2013.01); *G02F 2202/10* (2013.01); *G09G 2300/0426* (2013.01); *G09G 2300/0465* (2013.01)

(58) Field of Classification Search
CPC ......... G09G 3/3648; G09G 2300/0465; G09G 2300/0426
USPC .......................................................... 349/46
See application file for complete search history.

(56) References Cited

U.S. PATENT DOCUMENTS

| | | | |
|---|---|---|---|
| 8,735,884 B2 | 5/2014 | Sakata et al. | |
| 9,130,046 B2 | 9/2015 | Sakata et al. | |
| 9,275,587 B2 | 3/2016 | Sakai | |
| 9,741,302 B2 | 8/2017 | Shiomi | |
| 9,812,465 B2 | 11/2017 | Sakata et al. | |
| 9,837,441 B2 | 12/2017 | Sakata et al. | |
| 2010/0279474 A1 | 11/2010 | Akimoto et al. | |
| 2011/0003418 A1 | 1/2011 | Sakata et al. | |
| 2011/0273419 A1* | 11/2011 | Park | G09G 3/30 345/211 |
| 2015/0153599 A1 | 6/2015 | Yamazaki et al. | |

FOREIGN PATENT DOCUMENTS

| | | |
|---|---|---|
| JP | 2010-283338 A | 12/2010 |
| JP | 2011-029635 A | 2/2011 |
| JP | 2015-130487 A | 7/2015 |
| KR | 2011-0003265 A | 1/2011 |
| KR | 2012-0007068 A | 1/2012 |
| TW | 201530745 | 8/2015 |
| WO | WO-2010/125986 | 11/2010 |
| WO | WO-2012/157724 | 11/2012 |
| WO | WO-2014/104193 | 7/2014 |
| WO | WO-2015/083034 | 6/2015 |

OTHER PUBLICATIONS

Written Opinion (Application No. PCT/IB2016/053727) dated Sep. 20, 2016.

\* cited by examiner

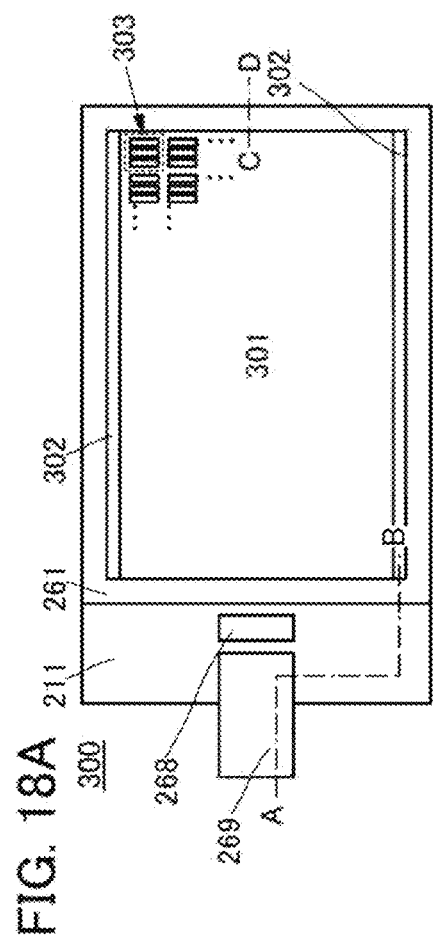
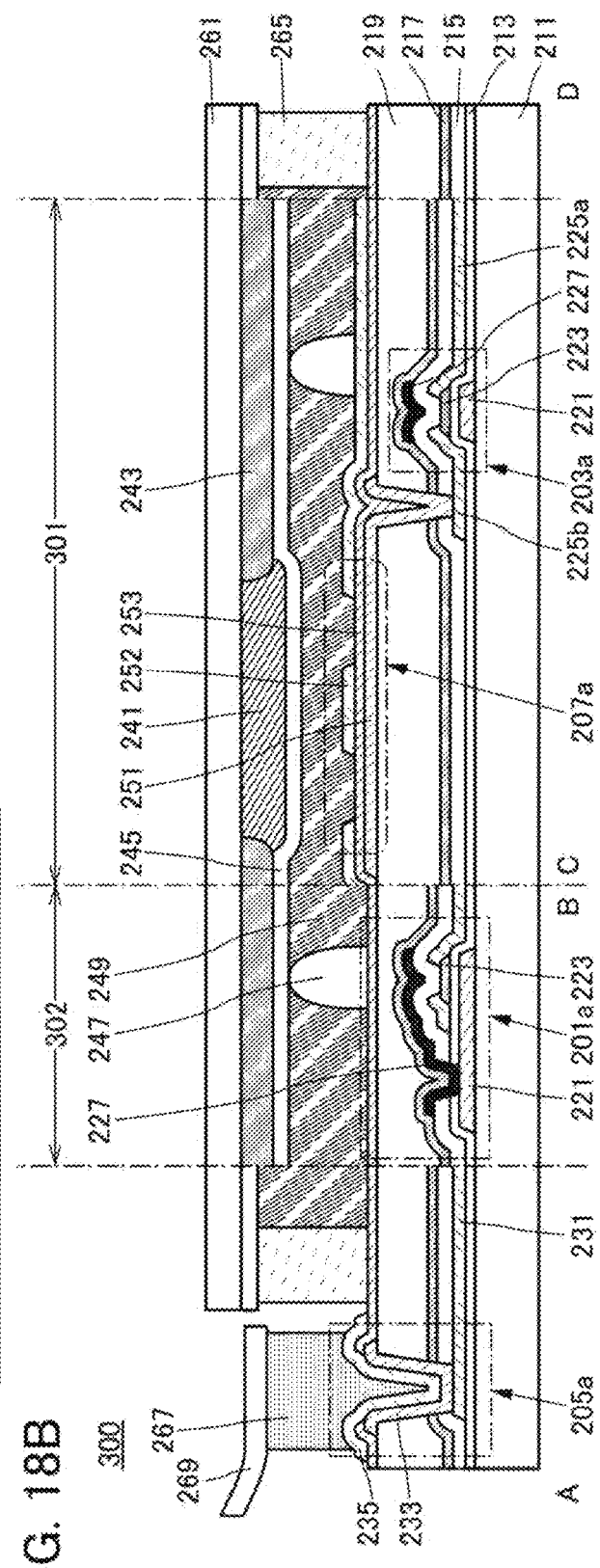
FIG. 18A
FIG. 18B

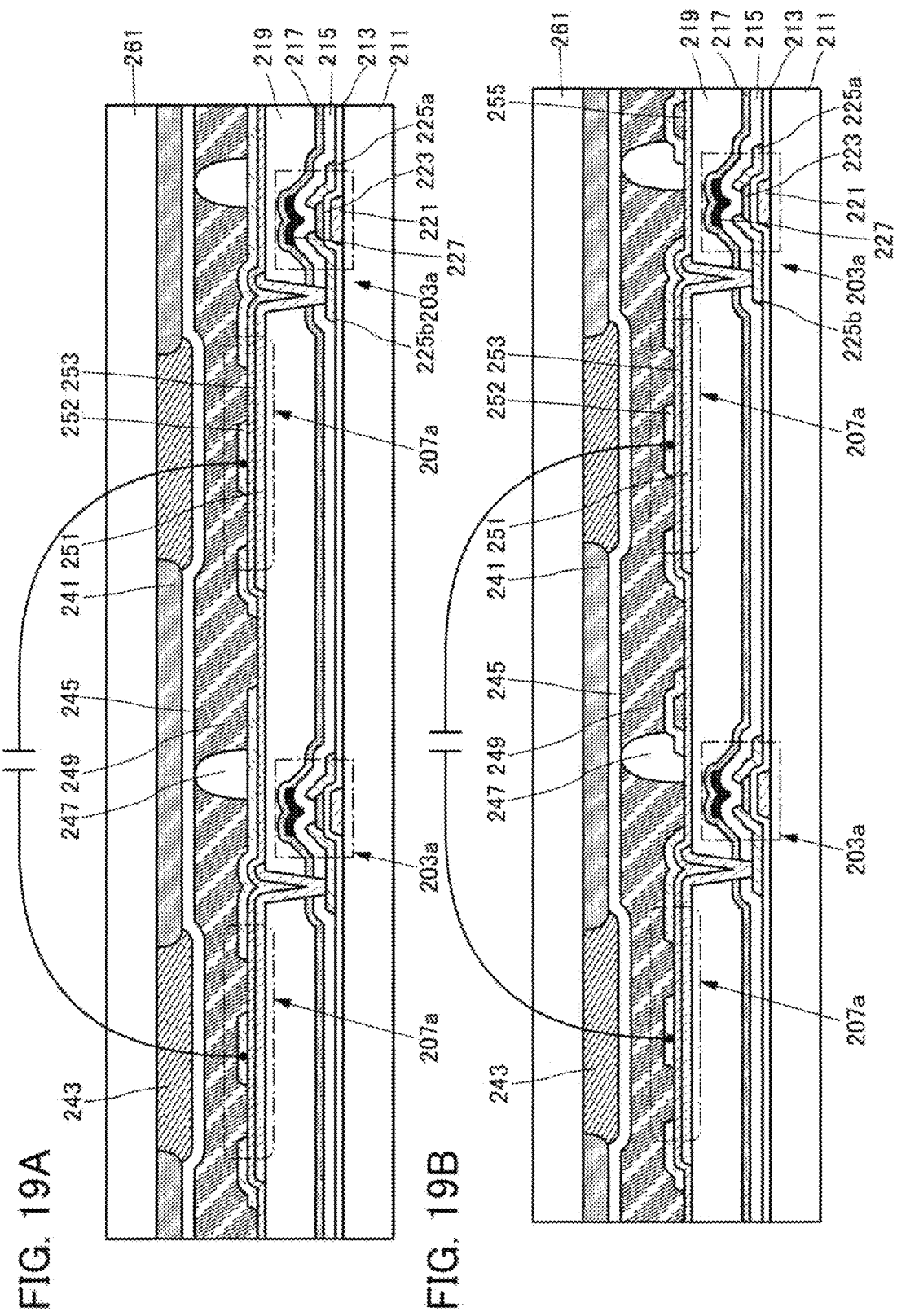

270A

270A

270B

270B

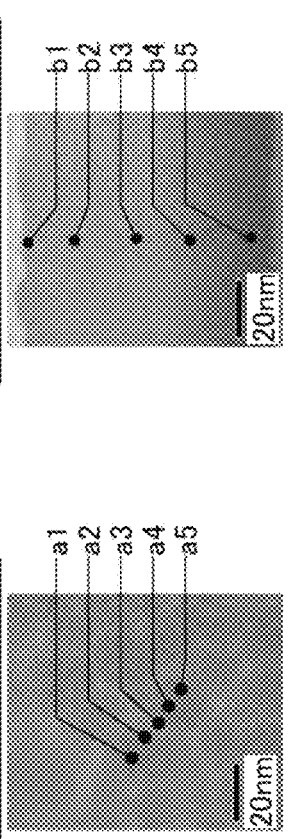
FIG. 42A plan-view TEM image
FIG. 42B cross-sectional TEM image
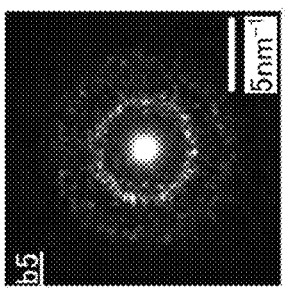
FIG. 42C  FIG. 42D  FIG. 42E  FIG. 42F  FIG. 42G
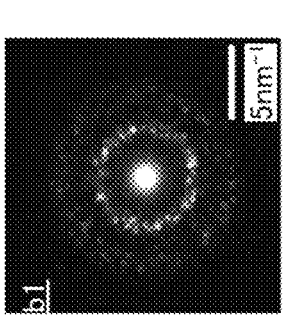
FIG. 42H  FIG. 42I  FIG. 42J  FIG. 42K  FIG. 42L

LIQUID CRYSTAL DISPLAY DEVICE AND ELECTRONIC DEVICE

TECHNICAL FIELD

One embodiment of the present invention relates to a liquid crystal display device and an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter (composition of matter). Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

BACKGROUND ART

Commoditization of liquid crystal display devices has progressed. Liquid crystal display devices displaying ultra-high-definition images with a digital video format of "4K" or "8K" as one of the means for increasing an added value of the display device have been actively developed (for example, see Patent Documents 1 and 2).

PRIOR ART DOCUMENT

Patent Document

[Patent document 1] PCT International Publication No. 2012/157724
[Patent document 2] PCT International Publication No. 2014/104193

SUMMARY OF THE INVENTION

Problems to be Solved by the Invention

A liquid crystal display device has a variety of structures. The structures have merits and demerits, and an appropriate structure is selected in accordance with circumstances. Therefore, a proposal of a liquid crystal display device or the like having a novel structure can expand the freedom of choice.

One embodiment of the present invention is to provide a novel liquid crystal display device or the like.

Furthermore, one embodiment of the present invention is to provide a liquid crystal display device having a novel structure that can reduce the number of data lines and can increase an aperture ratio. Furthermore, one embodiment of the present invention is to provide a liquid crystal display device having a novel structure that can perform favorable display even when forming a material for a wiring that transmits a signal to a pixel using a material having a large parasitic resistance like a transparent conductive film. Furthermore, one embodiment of the present invention is to provide a liquid crystal display device having a novel structure that can perform favorable display even when a video voltage amplitude transmitted to the pixel is small.

Note that the objects of one embodiment of the present invention are not limited to the above objects. The objects described above do not disturb the existence of other objects. Note that the other objects are the ones that are not described above and will be described below. The objects that are not described above will be apparent from and can be derived from the description of the specification, the drawings, and the like by those skilled in the art. Note that one embodiment of the present invention solves at least one of the above objects and/or the other objects.

Means for Solving the Problems

One embodiment of the present invention is a liquid crystal display device including a first pixel, a second pixel, a first wiring, a second wiring, a third wiring, and a fourth wiring. The first pixel includes a first transistor and a first liquid crystal element. The second pixel includes a second transistor and a second liquid crystal element. The first transistor includes a first gate and a second gate. One of a source and a drain of the first transistor is electrically connected to the first wiring. The other of the source and the drain of the first transistor is electrically connected to the first liquid crystal element. The first gate of the first transistor is electrically connected to the second wiring. The second gate of the first transistor is electrically connected to the third wiring. The second transistor includes a first gate and a second gate. One of a source and a drain of the second transistor is electrically connected to the first wiring. The other of the source and the drain of the second transistor is electrically connected to the second liquid crystal element. The first gate of the second transistor is electrically connected to the second wiring. The second gate of the second transistor is electrically connected to the fourth wiring. The first wiring has a function of transmitting a video voltage to the first pixel and the second pixel. The second wiring has a function of transmitting a scan signal to the first pixel and the second pixel. The third wiring has a function of transmitting a first control signal for controlling a threshold voltage of the first transistor. The fourth wiring has a function of transmitting a second control signal for controlling a threshold voltage of the second transistor. The first transistor and the second transistor are transistors each including an oxide semiconductor in a channel formation region.

One embodiment of the present invention is the liquid crystal display device in which the third wiring and the fourth wiring have a function of transmitting light.

One embodiment of the present invention is the liquid crystal display device in which the first gate of the first transistor includes a region overlapping with the second gate of the first transistor through the channel formation region, and the first gate of the second transistor includes a region overlapping with the second gate of the second transistor through the channel formation region.

One embodiment of the present invention is the liquid crystal display device in which a frequency of each of the first control signal and the second control signal is smaller than a frequency of the scan signal.

One embodiment of the present invention is the liquid crystal display device in which a voltage amplitude of the video voltage is smaller than a voltage amplitude of the first control signal or the second control signal.

Note that other embodiments of the present invention will be shown in the following embodiments and the drawings.

Effect of the Invention

According to one embodiment of the present invention, it is possible to provide a novel liquid crystal display device or the like.

Furthermore, one embodiment of the present invention is to provide a liquid crystal display device having a novel structure that can reduce the number of data lines and can increase an aperture ratio. Furthermore, one embodiment of the present invention can provide a liquid crystal display device having a novel structure that can perform favorable display even when a wiring that transmits a signal to a pixel is formed with a material having a large parasitic resistance such as a transparent conductive film. Furthermore, one embodiment of the present invention is to provide a liquid crystal display device having a novel structure that can perform favorable display even when the amplitude of a video voltage transmitted to the pixel is small.

Note that the effects of one embodiment of the present invention are not limited to the above effects. The effects described above do not disturb the existence of other effects. Note that the other effects are the ones that are not described above and will be described below. The other effects that are not described above will be apparent from and can be derived from the description of the specification, the drawings, and the like by those skilled in the art. Note that one embodiment of the present invention has at least one of the above effects and/or the other effects. Accordingly, one embodiment of the present invention does not have the aforementioned effects in some cases.

BRIEF DESCRIPTION OF DRAWINGS

FIG. 18 A top view and a cross-sectional view illustrating an example of a liquid crystal display device.

FIG. 19 Cross-sectional views illustrating examples of a liquid crystal display device.

FIG. 24 Cross-sectional views illustrating example of a method for manufacturing a transistor and the like.

FIG. 25 Cross-sectional views illustrating example of a method for manufacturing a transistor and the like.

FIG. 26 Cross-sectional views illustrating example of a method for manufacturing a transistor and the like.

FIG. 27 A cross-sectional view illustrating an example of a method for manufacturing a transistor and the like.

FIG. 42 TEM images of samples and diagrams illustrating electron diffraction patterns thereof.

MODE FOR CARRYING OUT THE INVENTION

Figure 1A:
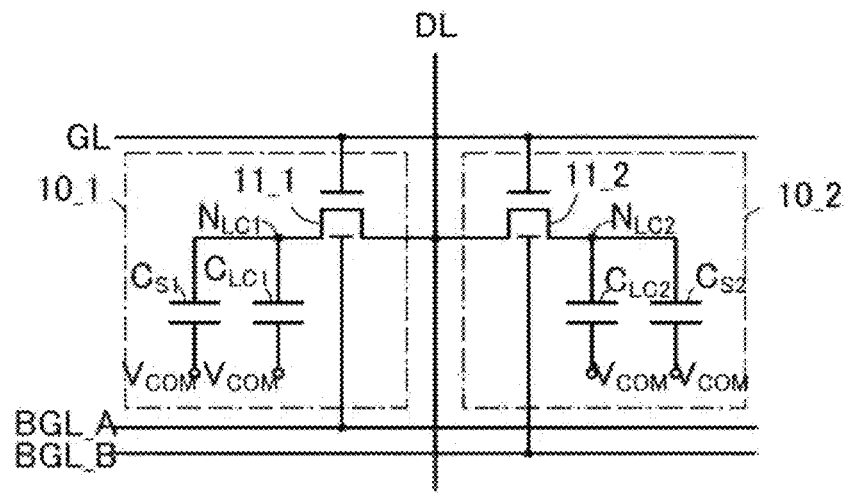
FIG. 1 A circuit diagram and a timing chart illustrating one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

Note that in this specification and the like, ordinal numbers such as "first", "second", and "third" are used in order to avoid confusion among components. Thus, the terms do not limit the number or order of components. Thus, the terms do not limit the number or order of components. Furthermore, in the present specification and the like, a "first" component in one embodiment can be referred to as a "second" component in other embodiments or claims. Furthermore, for example, in the present specification and the like, a "first" component in one embodiment can be referred to without the ordinal number in other embodiments or claims.

Note that the same elements or elements having similar functions, elements formed using the same material, elements formed at the same time, or the like in the drawings are denoted by the same reference numerals, and the description thereof is not repeated in some cases.

Embodiment 1

In this embodiment, a structure of a display device of one embodiment of the present invention is described with reference to FIG. 1 to FIG. 17.

<Pixel Structure and Timing Chart>

First, a pixel included in the liquid crystal display device will be described.

The liquid crystal display device includes a plurality of pixels. FIG. 1(A) typically illustrates two pixels 10_1 and 10_2. For example, one pixel 10_1 is a pixel in an odd-numbered column and the other pixel 10_2 is a pixel in an even-numbered row.

The pixel 10_1 includes a transistor 11_1, a liquid crystal element $C_{LC1}$, and a capacitor $C_{S1}$. The pixel 10_2 includes a transistor 11_2, a liquid crystal element $C_{LC2}$, and a capacitor $C_{S2}$. Note that in the following description, the transistors 11_1 and 11_2 are n-channel transistors. The transistors are not limited to this, and may be p-channel transistors.

The transistors 11_1 and 11_2 include back gates which are supplied with signals for controlling a threshold voltage in addition to gates which are supplied with signals for controlling the on/off state.

One of a source and a drain of the transistor 111 and one of a source and a drain of the transistor 11_2 are connected to a data line DL. The gate of the transistor 11_1 and the gate of the transistor 11_2 are connected to a gate line GL. The back gate of the transistor 11_1 is connected to a control line BGL_A. A back gate of the transistor 11_2 is connected to a control line BGL_B.

Note that in the following description, a node to which the transistor 11_1, the liquid crystal element $C_{LC1}$, and the capacitor $C_{S1}$ are connected is referred to as a node $N_{LC1}$. Furthermore, a node to which the transistor 11_2, the liquid crystal element $C_{LC2}$, and the capacitor $C_{S2}$ are connected is referred to as a node $N_{LC2}$. Voltages corresponding to data are held in the nodes $N_{LC1}$ and $N_{LC2}$ and thus, the data can be written to the pixels.

Note that in this embodiment, a transmissive liquid crystal display device using a liquid crystal element in a horizontal electric field mode is described as an example. One electrode of each of the liquid crystal element $C_{LC1}$ and the capacitor $C_{S1}$ is connected to the transistor 11_1. The other electrodes of the liquid crystal element $C_{LC1}$ and the capacitor $C_{S1}$ are connected to wirings to which common potentials $V_{COM}$ are supplied. Furthermore, one electrode of each of the liquid crystal element $C_{LC2}$ and the capacitor $C_{S2}$ is connected to the transistor 11_2. The other electrodes of the liquid crystal element $C_{LC2}$ and the capacitor $C_{S2}$ are connected to wirings to which common potentials $V_{COM}$ are supplied.

A liquid crystal display device using a liquid crystal element as a display element is described as an example according to one embodiment of the present invention; however, there is no particular limitation on the display element. As the display element, a variety of elements including an optical element that utilizes MEMS (Micro Electro Mechanical System), a light-emitting element such as an organic EL (Electro Luminescence) element or a light-emitting diode (LED: Light Emitting Diode), and an electrophoretic element can be used.

The data line DL has a function of transmitting a video voltage which is a voltage corresponding to data. The gate line GL has a function of transmitting a scan signal for controlling the on state (or off state) of the transistor. The control lines BGL_A and BGL_B have a function of transmitting control signals for controlling the threshold voltage of the transistor. Note that the data line DL, the gate line GL, and the control lines BGL_A and BGL_B may be simply referred to as a wiring.

Figure 1B:
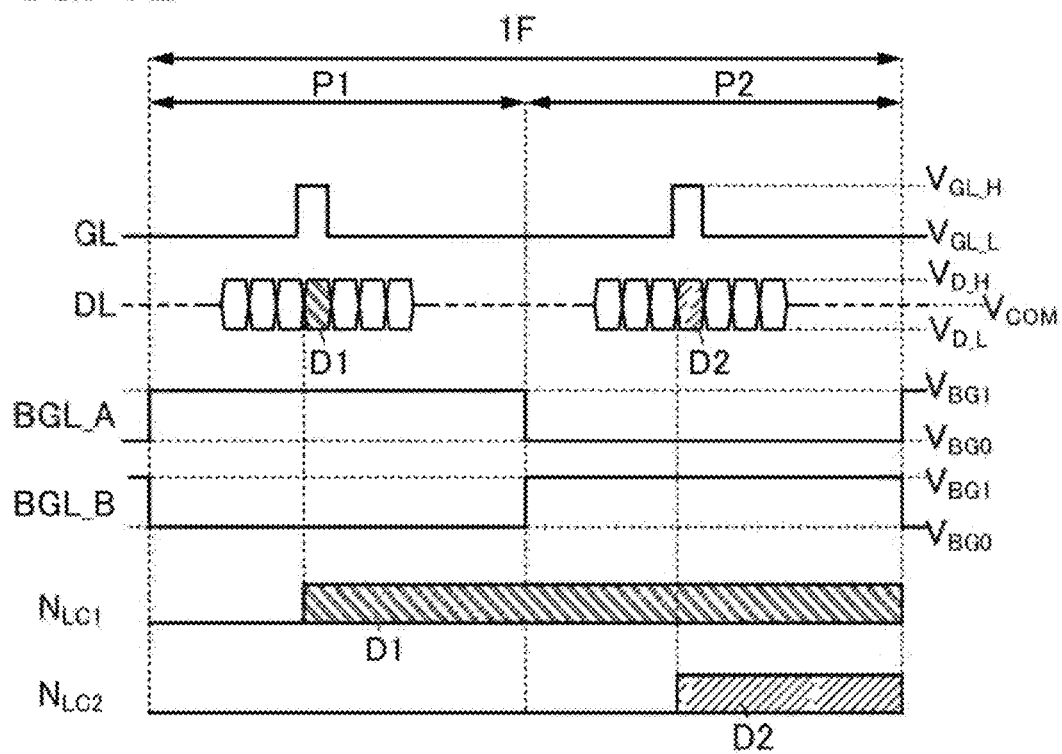

FIG. 1(B) is a timing chart for illustrating the operation of the circuit configuration in FIG. 1(A). The liquid crystal display device of one embodiment of the present invention has a structure in which one frame (1F) is divided into two periods: a first period and a second period. The video voltage is written to the pixel 10_1 in the first period and the video voltage is written to the pixel 10_2 in the second period.

As shown in FIG. 1(A), the pixels 10_1 and 10_2 are connected to the common data line DL and gate line GL. In the liquid crystal display device of one embodiment of the present invention, the threshold voltages of the transistors 11_1 and 11_2 are controlled by switching the signals supplied to the control lines BGL_A and BGL_B so that the transistor 11_1 and the transistor 11_2 do not operate in the same manner. Then, the transistors 11_1 and 11_2 are controlled to be in an on state in a different period.

The timing chart of FIG. 1(B) illustrates a first period P1 in which data is written to the pixel 10_1 and a second period P2 in which data D2 is written to the pixel 10_2. Note that the timing chart of FIG. 1(B) illustrates changes in the scan signal transmitted to the gate line GL, the video voltage transmitted to the data line DL, the control signals of the control lines BGL_A and BGL_B, and the nodes $N_{LC1}$ and $N_{LC2}$.

Scan signals are illustrated as a voltage $V_{GL\_H}$ at H level and a voltage $V_{GL\_L}$ at L level. The video voltage is illustrated as a voltage that depends on the gray scale level between a voltage $V_{D\_H}$ and a common potential $V_{COM}$ and between a voltage $V_{D\_L}$ and a common potential $V_{COM}$. The control signals are illustrated as a voltage $V_{BG1}$ at H level and a voltage $V_{BG0}$ at L level.

Here, a transistor that controls the threshold voltage by changing the voltage applied to the back gate is described with reference to FIGS. 2(A) to (C).

Figure 2A:
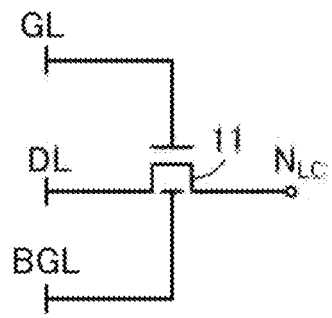
FIG. 2 A circuit diagram and graphs illustrating one embodiment of the present invention.

A circuit symbol of a transistor 11 including a back gate is illustrated in FIG. 2(A). A gate of the transistor 11 is connected to the gate line GL. One of a source and a drain of the transistor 11 is connected to the data line DL. The other of the source and the drain of the transistor 11 is connected to a node $N_{LC}$. The back gate of the transistor 11 is connected to a control line BGL.

Figure 2B:
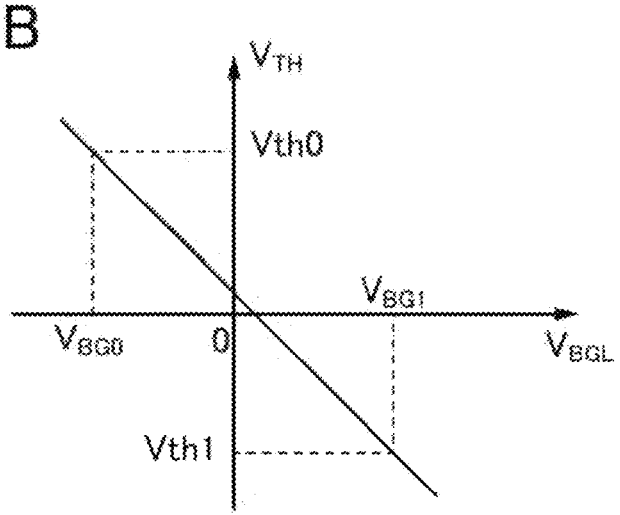

FIG. 2(B) is a graph showing a relation between a voltage $V_{BGL}$ applied to the control line BGL of the transistor 11 and a threshold voltage $V_{TH}$ of the transistor 11 illustrated in FIG. 2(A). When voltages $V_{BG1} > V_{BG0}$, a threshold voltage Vth1 corresponding to the voltage $V_{BG1}$ shifts in the negative direction and a threshold voltage Vth0 corresponding to the voltage $V_{BG0}$ shifts in the positive direction. That is, by applying large voltage to the back gate, the threshold voltage shifts in the negative direction and by applying small voltage to the back gate, the threshold voltage shifts in the positive direction.

Figure 2C:
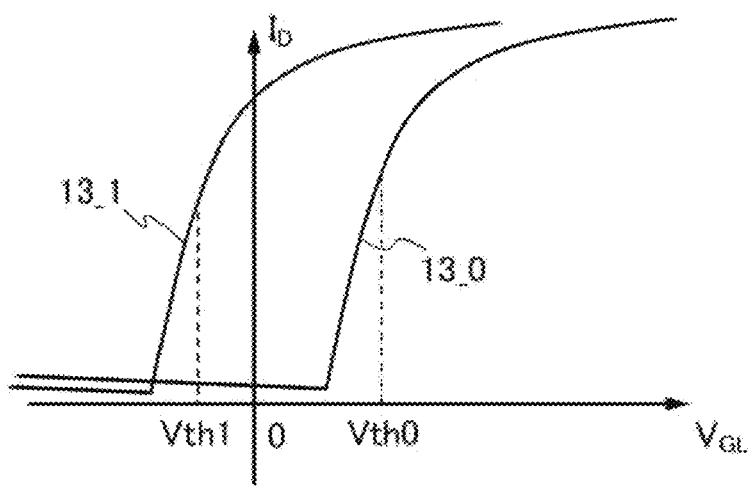

FIG. 2(C) is a diagram that shows the shift of the threshold voltage of FIG. 2(B) with reference to the relationship between the voltage $V_{GL}$ of the gate line GL and a drain current ID of the transistor 11. A curve 13_1 corresponds to a graph in which the threshold voltage is Vth1. A curve 13_0 corresponds to a graph in which the threshold voltage is Vth0. As apparent from FIGS. 2(B) and (C), by shifting the threshold voltage in the positive direction, the current flowing between the source and the drain can be made low even when the voltage applied to the gate is large. Furthermore, by shifting the threshold voltage in the negative direction, the current flowing between the source and the drain can be made high due to a small change in the voltage applied to the gate.

The first period P1 shown in FIG. 1(B) includes a period in which the control signal of the control line BGL_A is set at H level. Furthermore, the first period P1 shown in FIG. 1(B) includes a period in which the control signal of the control line BGL_B is set at L level. Thus, the threshold voltage of the transistor 11_1 shifts in the negative direction and the threshold voltage of the transistor 11_2 shifts in the positive direction. Then, the scan signal is set at H level, so that the transistor 11_1 which has a threshold voltage shifting in the negative direction is turned on and the transistor 11_2 which has a threshold voltage shifting in the positive direction is turned off. The transistor 11_1 is turned on, whereby data D1 is written to the node $N_{LC1}$ of the pixel 10_1. Furthermore, the transistor 11_2 is turned off, whereby the data D1 is not written to the node $N_{LC2}$ of the pixel 10_2, which is connected to the common data line DL and gate line GL.

The second period P2 shown in FIG. 1(B) includes a period in which the control signal of the control line BGL_B is set at H level. Furthermore, the second period P2 shown in FIG. 1(B) includes a period in which the control signal of the control line BGL_A is set at L level. Therefore, the threshold voltage of the transistor 11_2 shifts in the negative direction and the threshold voltage of the transistor 11_1 shifts in the positive direction. Then, the scan signal is set at H level, so that the transistor 11_2 which has a threshold voltage shifting in the negative direction is turned on and the transistor 11_1 which has a threshold voltage shifting in the positive direction is turned off. The transistor 11_2 is turned on, whereby the data D2 is written to the node $N_{LC2}$ of the pixel 10_2. Furthermore, the transistor 11_1 is turned off, whereby the data D2 is not written to the node $N_{LC1}$ of the pixel 10_1, which is connected to the common data line DL and gate line GL. Thus, the pixel 10_1 can keep holding the data D1 written earlier in the pixel 10_1 in advance.

As shown in FIG. 1(B), the frequency of the control signal supplied to the back gate can be smaller than the frequency of the signal supplied to the data line DL and the frequency of the scan signal supplied to the gate line GL. Thus, even when a parasitic capacitance or a parasitic resistance of the control lines BGL_A and BGL_B are large, desired operation can be achieved. In other words, materials of the wirings which form the control lines BGL_A and BGL_B may have a large parasitic capacitance or large parasitic resistance; thus, operation can be performed without wirings including low resistive materials such as Cu and Al. In this case, for example, a wiring including a transparent conductive film like an oxide conductive material can also be used. A transparent wiring can be used in the pixel; thus, even when the control lines BGL_A and BGL_B are added, the control lines BGL_A and BGL_B can be provided without loss of the aperture ratio.

Figure 3:
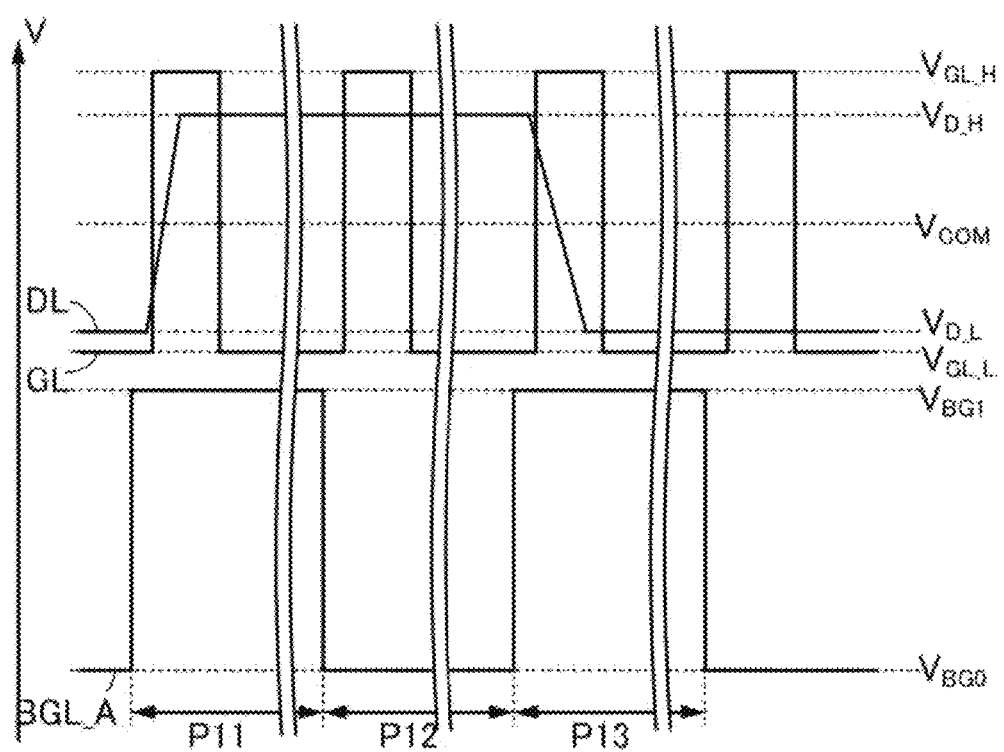
FIG. 3 A timing chart illustrating one embodiment of the present invention.

Furthermore, FIG. 3 shows a timing chart illustrating a magnitude relation between voltages of a scan signal supplied to the gate line GL, a video voltage applied to the data line DL, and a control signal supplied to the control line BGL_A. Note that the control signal supplied to the control line BGL_A is described as an example in FIG. 3, and the same applies to the control line BGL_B. Note that in FIG. 3, a period P11 and a period P13 are each a period in which the control line BGL_A is set at H level and the voltage of the data line DL is not written to the pixel, and a period P12 is a period in which the control line BGL_A is set at L level and the voltage of the data line DL is written to the pixel.

The liquid crystal display device of this embodiment changes the threshold voltage by controlling the voltage applied to the back gate of the transistor to control the on/off state of the transistor. Therefore, in the case where the threshold voltage is shifted in the positive direction to turn off the transistor, the voltage applied to the back gate is a voltage that turns off the transistor regardless of the voltage of the scan signal supplied to the gate. For example, as in the period P11 or P13 shown in FIG. 3, a voltage $V_{BG0}$ at L level of the control line BGL_A which shifts the threshold voltage in the positive direction is smaller than the voltage applied to the data line DL and the gate line.

Furthermore, in the case where the threshold voltage is shifted in the negative direction to turn on the transistor, the voltage applied to the back gate is a voltage that turns on the transistor in accordance with the voltage of the scan signal supplied to the gate. For example, as in the period P12 shown in FIG. 3, a voltage $V_{BG1}$ at H level of the control line BGL_A which shifts the threshold voltage in the negative direction is larger than the voltage $V_{BG0}$ and smaller than the voltage applied to the data line DL and the gate line.

The above-described voltage is set to the voltage that is applied to the back gate voltage, whereby the H-level voltage $V_{GL\_H}$ of the scan signal and the L-level voltage $V_{GL\_L}$ that are applied to the gate line GL are larger than the voltage $V_{BG1}$. Furthermore, the video voltages $V_{D\_H}$ and $V_{D\_L}$ and the common potential $V_{COM}$ which are supplied to the data line DL can be larger than the voltage $V_{BG1}$ and can be set between the voltage $V_{GL\_H}$ and the voltage $V_{GL\_L}$. For example, the video voltages $V_{D\_H}$ and $V_{D\_L}$ written to the pixel can be written at a state where the voltage applied to the back gate is at H level. Therefore, as shown in FIG. 3, the video voltage to which the scan signal of the gate line GL with a voltage amplitude substantially equal to the voltage amplitude of the back gate voltage is supplied can be written to the pixel. That is, the video voltage can be written to the pixel with a small voltage amplitude of the scan signal.

A sufficiently large video voltage of the liquid crystal display device needs to be applied to the pixel while inversion driving is performed in order to control the on or off state of the transistor. According to one embodiment of the present invention, a voltage based on the control signal from the back gate is applied to the pixel together with the voltage based on the scan signal applied to the pixel. Thus, even when voltage amplitudes of the video voltage and the scan signal are made small, the on/off state of the transistor can be controlled. Thus, an IC included in a display device including an organic EL and the like is used to generate the voltage needed for the video voltage and the scan signal; thus, the liquid crystal display device and the IC can be formed integrally.

Note that in the case where the voltage amplitudes of the scan signal and the video voltage are made small, the liquid crystal material that forms a liquid crystal element is preferably a material which has low voltage and can change the transmittance. For example, the dielectric anisotropy (Δε) of the liquid crystal material is preferably made large to make change of the transmittance in accordance to the change of the voltage to be applied.

To make Δε large, a liquid crystal material with a large Δε is appropriately selected and used. However, when the definition is increased by a horizontal electric field mode, a difference in an orientation state is more easily formed and defects are more easily generated in a positive-type liquid crystal than in a negative-type liquid crystal. This is because in the case where intervals of slits provided in an electrode of the liquid crystal element are small, a deviation between alignment vectors of the adjacent liquid crystal molecules is large and an increase in elastic energy due to bending and distortion is large. In the case where the elastic energy in the orientation state formed by spreading and distortion can be smaller than in the case where the elastic energy is increased due to bending and distortion, the bending and distortion transfers to spreading and distortion. The spreading and distortion in the horizontal electric field mode is close to vertical orientation and thus the transmittance changes from the desired state.

The distortion of orientation of the positive liquid crystal can be divided into a term of a spreading and distortion (K1), a term of swinging and distortion (K2), and a term of bending and distortion (K3). In the case where intervals of slits are small and bending and distortion are likely to occur, the term of spreading and distortion (K1) is preferably made larger than the term of bending and distortion (K3) depending on the selection of the liquid crystal materials and the like. Such a structure can inhibit transition from the bending and distortion to the spreading and distortion and can obtain a stable orientation state.

<Operation of Liquid Crystal Display Device>

Figure 4:
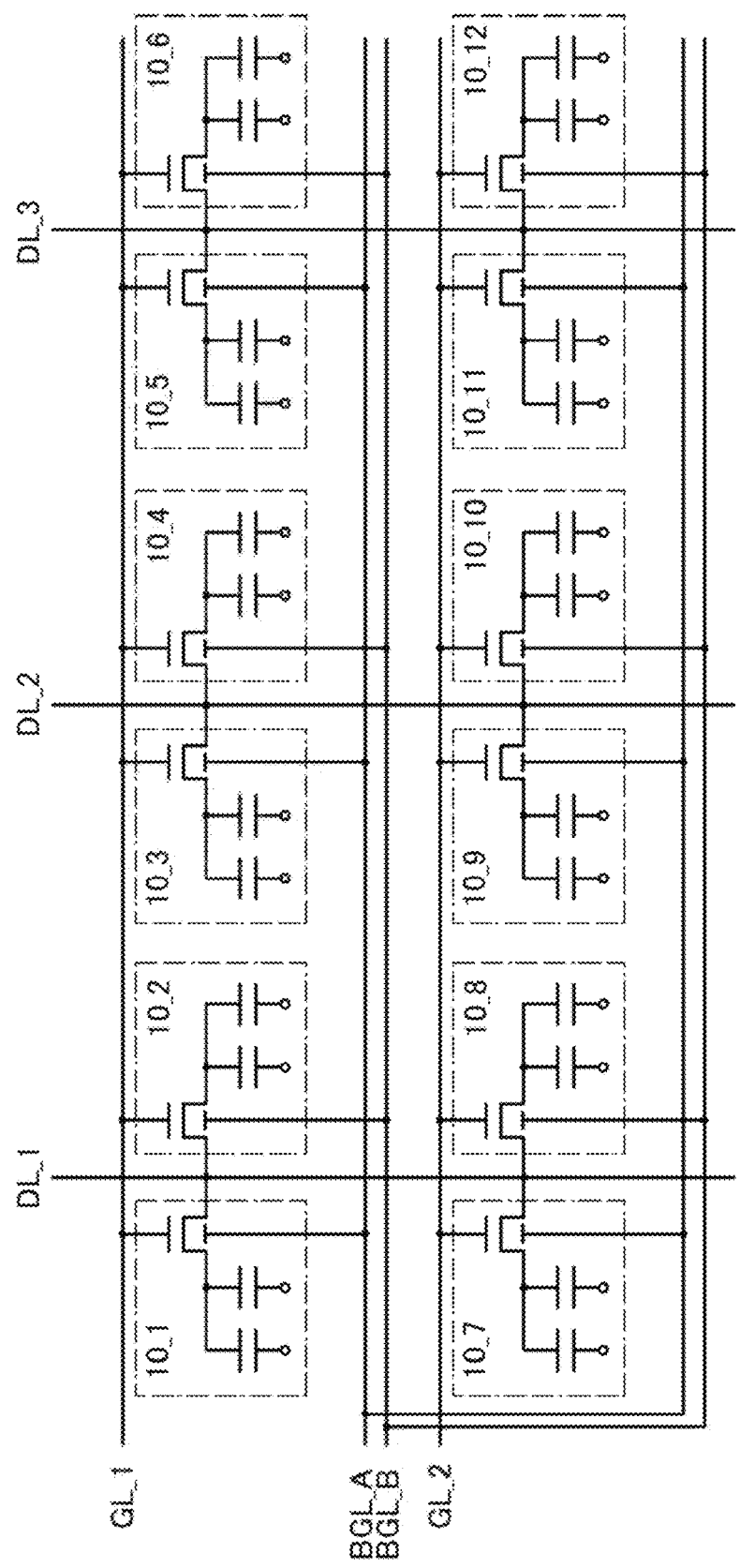
FIG. 4 A circuit diagram illustrating one embodiment of the present invention.

Next, the operation of the liquid crystal display device is described. A circuit diagram of the pixels 10_1 to 10_12 arranged in two rows and six columns is shown in FIG. 4 to illustrate an example of an operation. The pixels 10_1 to 10_12 are connected to the data lines DL_1 to DL_3, the gate lines GL_1 to GL_2, and the control line BGL_A and the control line BGL_B to control writing of data or the like. Furthermore, in the circuit diagram of FIG. 4, transistors in the pixels in the odd-numbered columns are connected to the control line BGL_A. Furthermore, transistors in the pixels in even-numbered columns are connected to the control line BGL_B.

Circuit diagrams of FIGS. 5 to 8 show a state of writing data to the pixel when signals are supplied to the wirings. In FIGS. 5 to 8, wirings supplied with H-level signals are represented by bold lines and wirings supplied with L-level signals are represented by thin lines.

Figure 5:
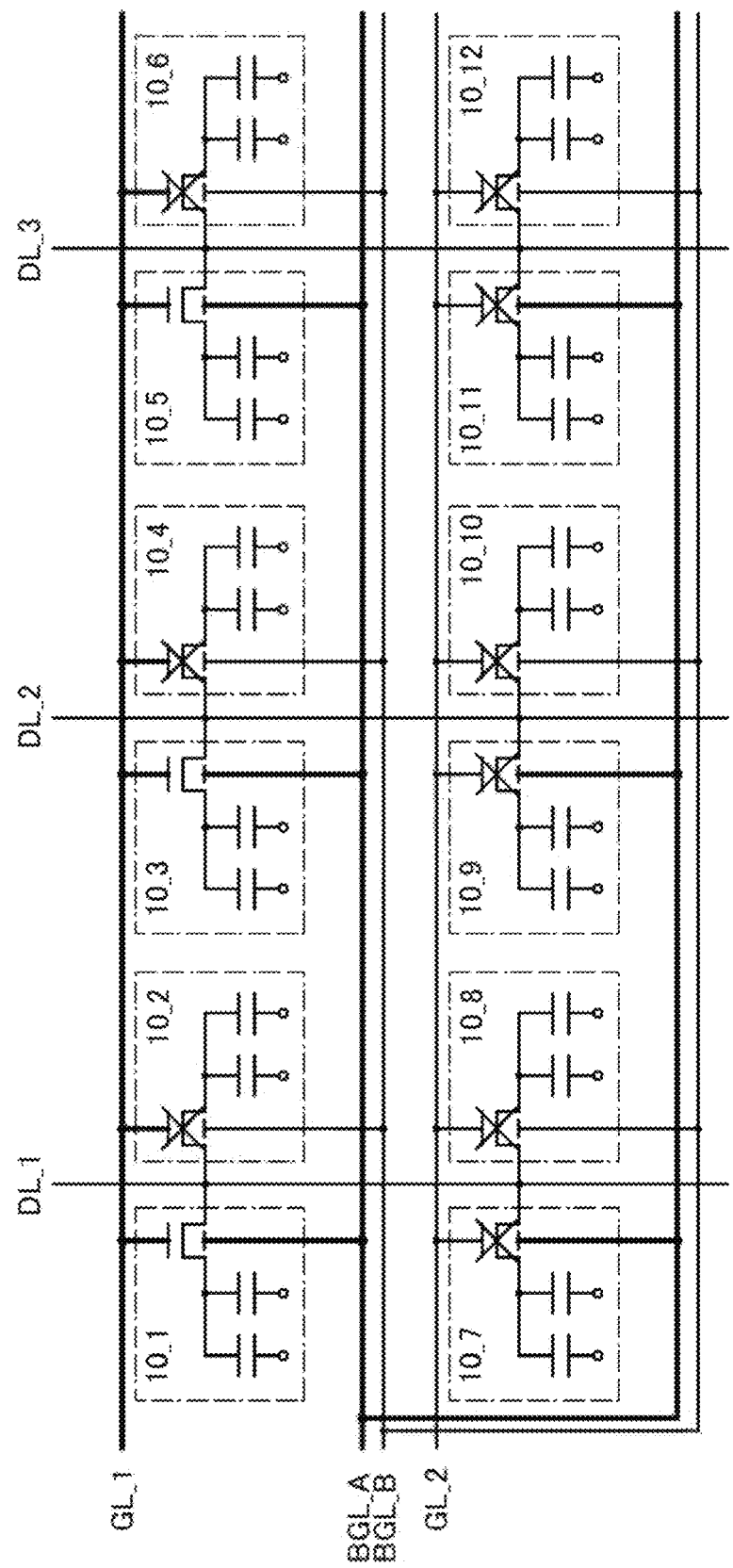
FIG. 5 A circuit diagram illustrating one embodiment of the present invention.

FIG. 5 shows an operation of writing data to the pixels in the odd-numbered columns of the first row. The scan signal of the gate line supplied to the gate line GL_1 is at H level and the control signal supplied to the control line BGL_A is at H level, and the video voltages are applied to the data lines DL_1 to DL_3. The other wirings are at L level. The transistors included in the pixels 10_1, 10_3, and 10_5 are turned on. Although the even-numbered columns of the first row are also supplied with H level based on the scan signals, the control signal of the control line BGL_B is at L level; thus, the threshold voltages of the transistors included in the pixels 10_2, 10_4, and 10_6 are shifted in the positive direction. Therefore, the transistors included in the pixels 10_2, 10_4, and 10_6 are turned off. The transistors included in the pixels in the second row are turned off because the scan signal of the gate line GL_2 is at L level regardless of threshold voltage control due to the control line BGL_A and the control line BGL_B.

Figure 6:
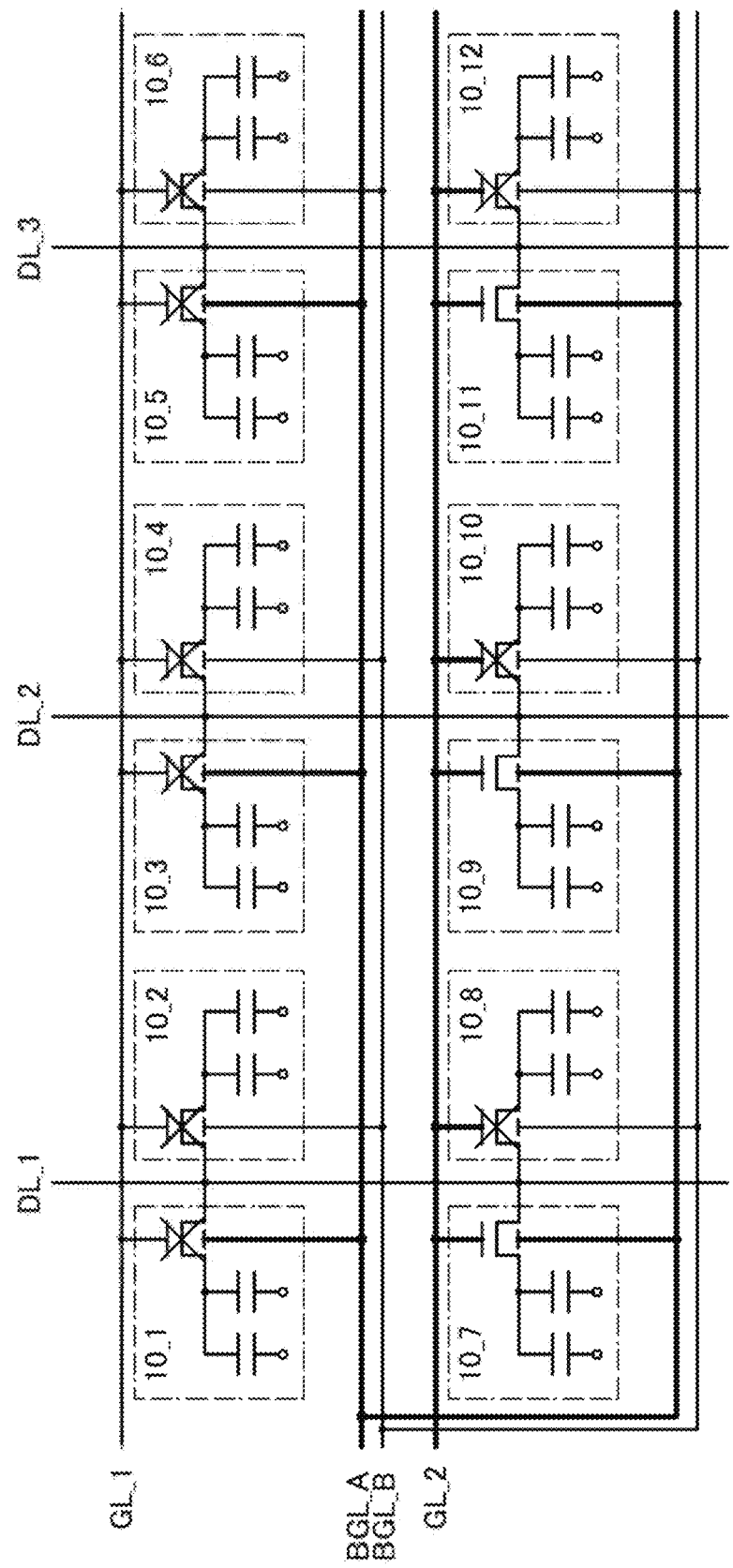
FIG. 6 A circuit diagram illustrating one embodiment of the present invention.

FIG. 6 shows an operation of writing data to the pixels in the odd-numbered columns of the second row. The scan signal of the gate line supplied to the gate line GL_2 is at H level and the control signal supplied to the control line BGL_A is at H level, and the video voltages are applied to the data lines DL_1 to DL_3. The other wirings are at L level. The transistors included in pixels 10_7, 10_9, and 10_11 are turned on. Although the even-numbered columns of the second row are also supplied with H level based on the scan signals, the control signal of the control line BGL_B is at L level; thus, the threshold voltages of the transistors included in the pixels 10_8, 10_10, and 10_12 are shifted in the positive direction. Therefore, the transistors included in the pixels 10_8, 10_10, and 10_12 are turned off. The transistors included in the pixels in the first row are turned off because the scan signal of the gate line GL_1 is at L level regardless of the threshold voltage control due to the control line BGL_A and the control line BGL_B.

Figure 7:
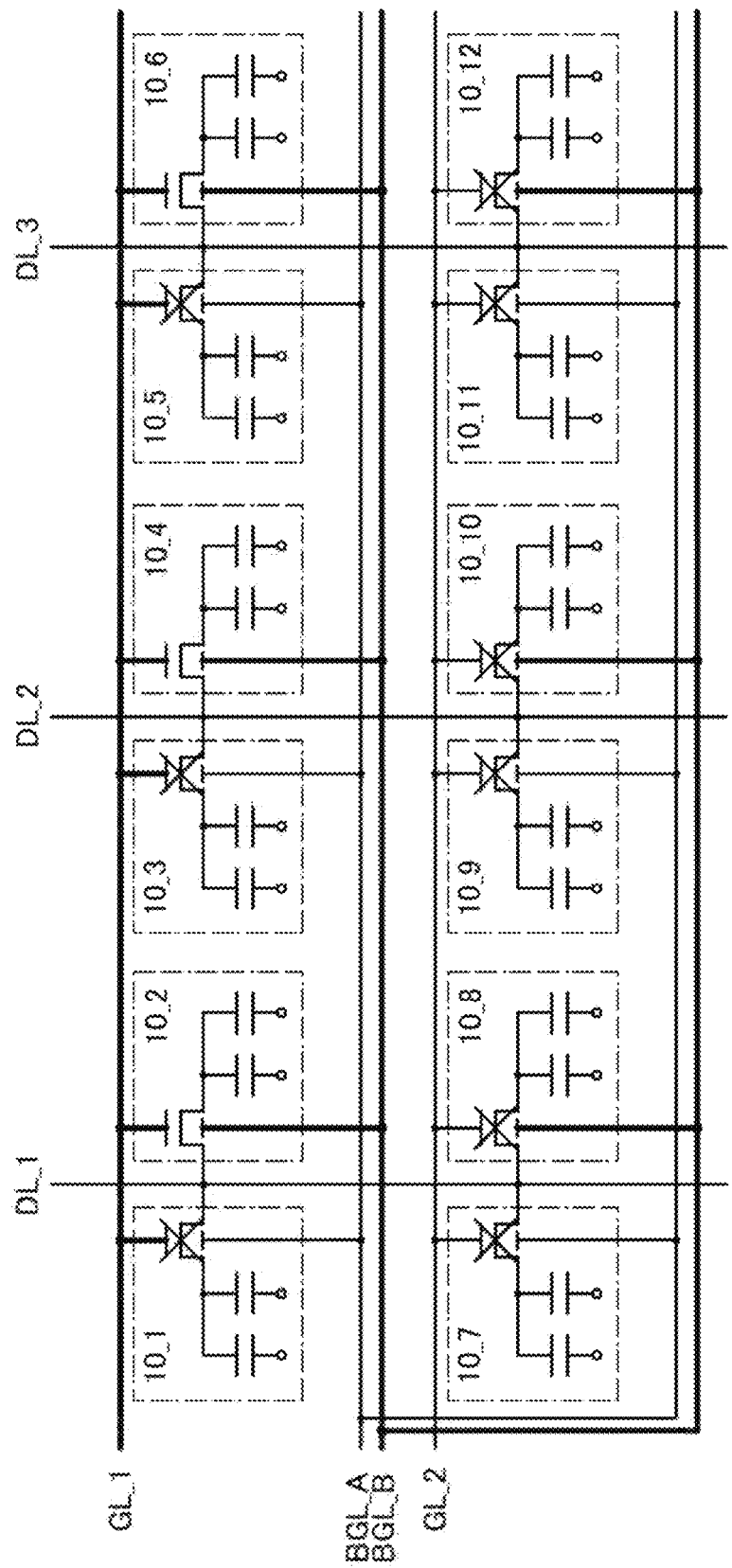
FIG. 7 A circuit diagram illustrating one embodiment of the present invention.

FIG. 7 shows an operation of writing data to the pixels in the even-numbered columns of the first row. The scan signal of the gate line supplied to the gate line GL_1 is at H level and the control signal supplied to the control line BGL_B is at H level, and the video voltages are applied to the data lines DL_1 to DL_3. The other wirings are at L level. The transistors included in pixels 10_2, 10_4, and 10_6 are turned on. Although the odd-numbered columns of the first row are also supplied with H level based on the scan signals, the control signal of the control line BGL_A is at L level; thus, the threshold voltages of the transistors included in the pixels 10_1, 10_3, and 10_5 are shifted in the positive direction. Therefore, the transistors included in the pixels 10_1, 10_3, and 10_5 are turned off. The transistors included in the pixels in the second row are turned off because the scan signal of the gate line GL_2 is at L level regardless of the threshold voltage control due to the control line BGL_A and the control line BGL_B.

Figure 8:
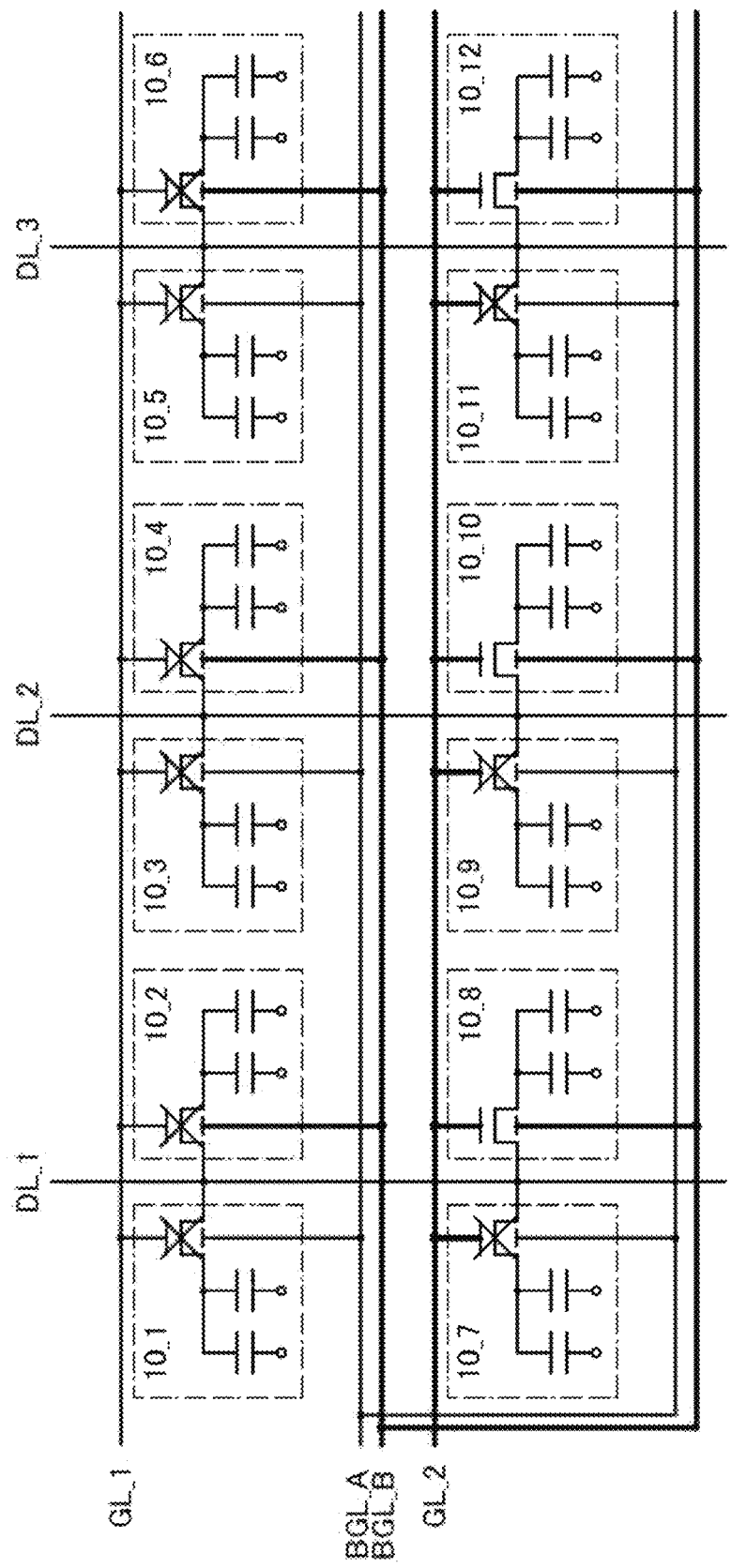
FIG. 8 A circuit diagram illustrating one embodiment of the present invention.

FIG. 8 shows an operation of writing data to the pixels in the even-numbered columns of the second row. The scan signal of the gate line supplied to the gate line GL_2 is at H level and the control signal supplied to the control line BGL_B is at H level, and the video voltages are applied to the data lines DL_1 to DL_3. The other wirings are at L level. The transistors included in pixels 10_8, 10_10, and 10_12 are turned on. Although the odd-numbered columns of the second row are also supplied with H level based on the scan signals, the control signal of the control line BGL_A is at L level; thus, the threshold voltage of the transistors included in the pixels 10_7, 10_9, and 10_11 are shifted in the positive direction. Therefore, the transistors included in the pixels 10_7, 10_9, and 10_11 are turned off. The transistors included in the pixels in the first row are turned off because the scan signal of the gate line GL_1 is at L level regardless of the threshold voltage control due to the control line BGL_A and the control line BGL_B.

The pixels of the liquid crystal display device the operation of which is described in FIG. 5 to FIG. 8 can selectively control writing of data to the pixels which are connected to the common data line and gate line. Therefore, wirings for writing data to the pixels can be reduced. Furthermore, the control signal for controlling the threshold voltage of the transistor can be a signal which can be switched in accordance with the cycle of ½ frames. Therefore, a signal whose frequency is lower than those of the signals supplied to the other wirings is used. When a signal has a low frequency, the influence of delay or distortion of a signal can be reduced even when the signal is transmitted by using a wiring material with a large parasitic resistance or parasitic capacitance. As a result, a wiring material or the like that can transmit light such as a transparent conductive film can be used as a wiring material and the reduction in the aperture ratio due to addition of the control line which transmits the control signal can be inhibited.

Figure 9:
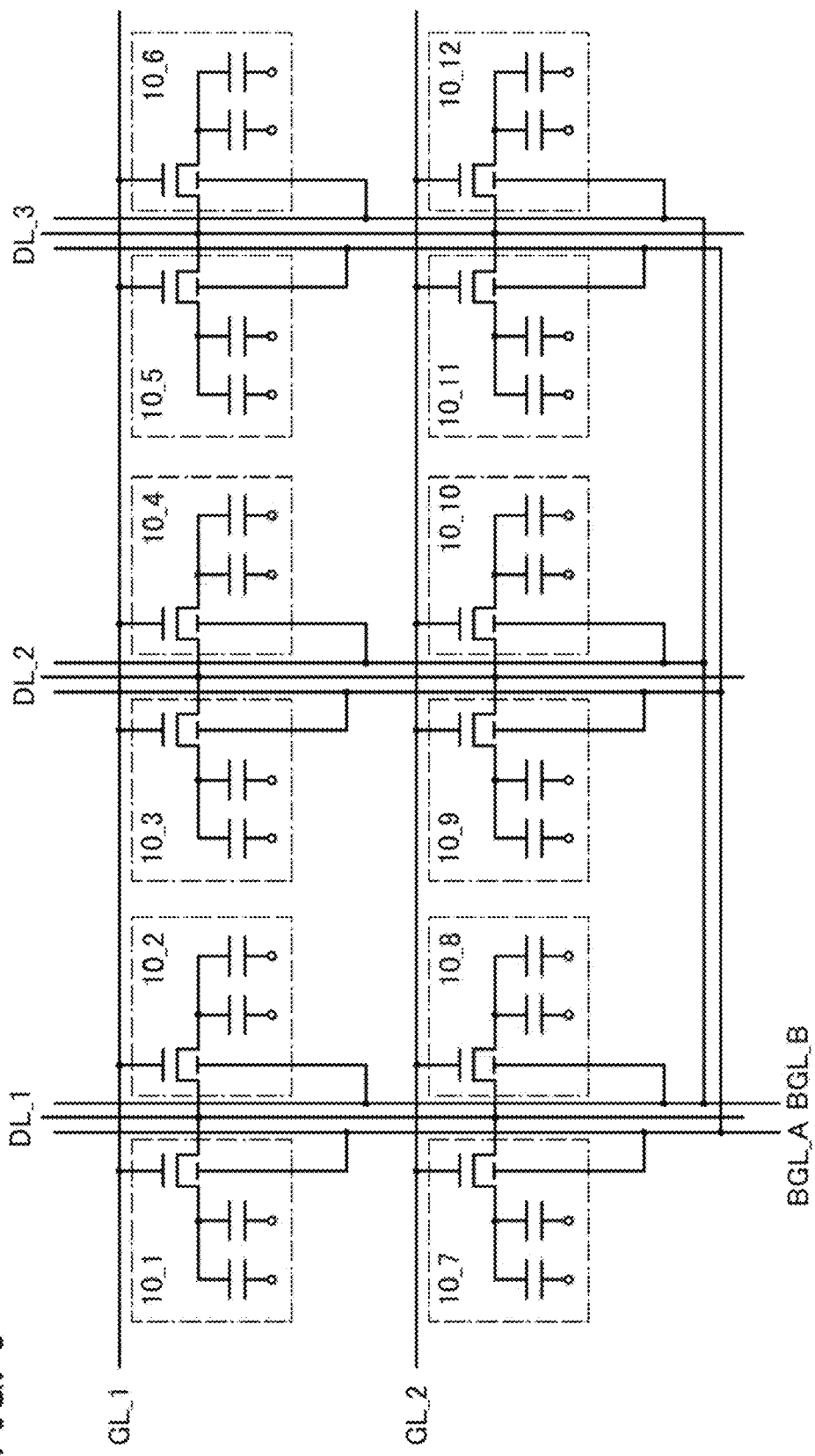
FIG. 9 A circuit diagram illustrating one embodiment of the present invention.

Note that in FIG. 4, the control lines BGL_A and BGL_B are arranged to be parallel to the gate lines GL_1 and GL_2; however, the structure is not limited thereto. For example, as shown in FIG. 9, the control lines may be arranged to be parallel to the data lines DL_1 to DL_3.

Figure 10A:
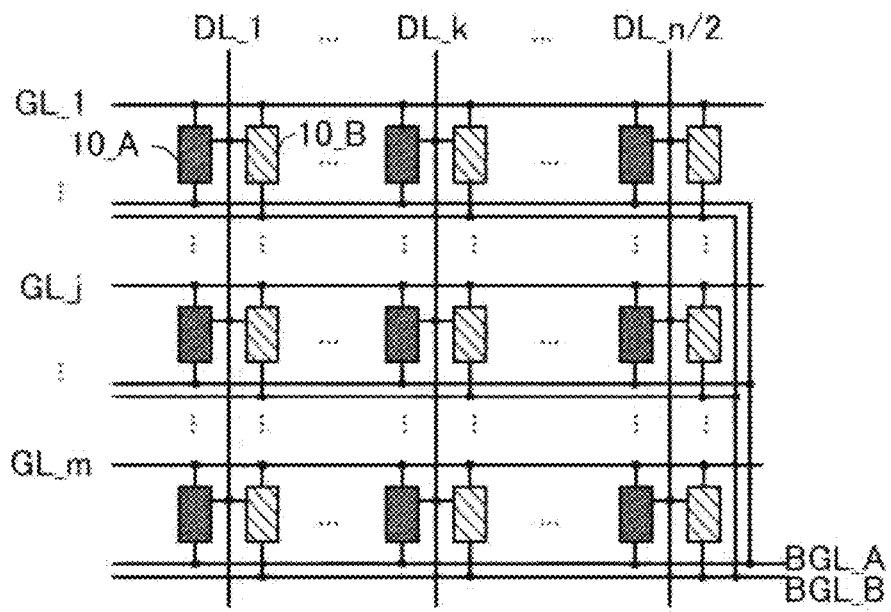
FIG. 10 A circuit diagram and a timing chart illustrating one embodiment of the present invention.

Note that in FIG. 4, an example of the circuit diagram of the pixels arranged in two rows and six columns is described; however, in the case where a liquid crystal display device includes pixels arranged in m rows and n columns (m and n are natural numbers of 2 or more), a structure shown in FIG. 10(A) is used.

In FIG. 10(A), the gate lines GL_1 to GL_m, the data lines DL_1 to DL_n/2, the control line BGL_A, and the control line BGL_B are included. Pixels 10_A in odd-numbered columns may be connected to the control line BGL_A and pixels 10_B in even-numbered columns may be connected to the control line BGL_B. Note that in FIG. 10(A), the gate line in an arbitrary row is referred to as the gate line GL_j (j is a natural number of more than or equal to 1 and lower than or equal to m) and the data line in an arbitrary column is referred to as the data line DL k (k is a natural number of more than or equal to 1 and lower than or equal to n/2).

Figure 10B:
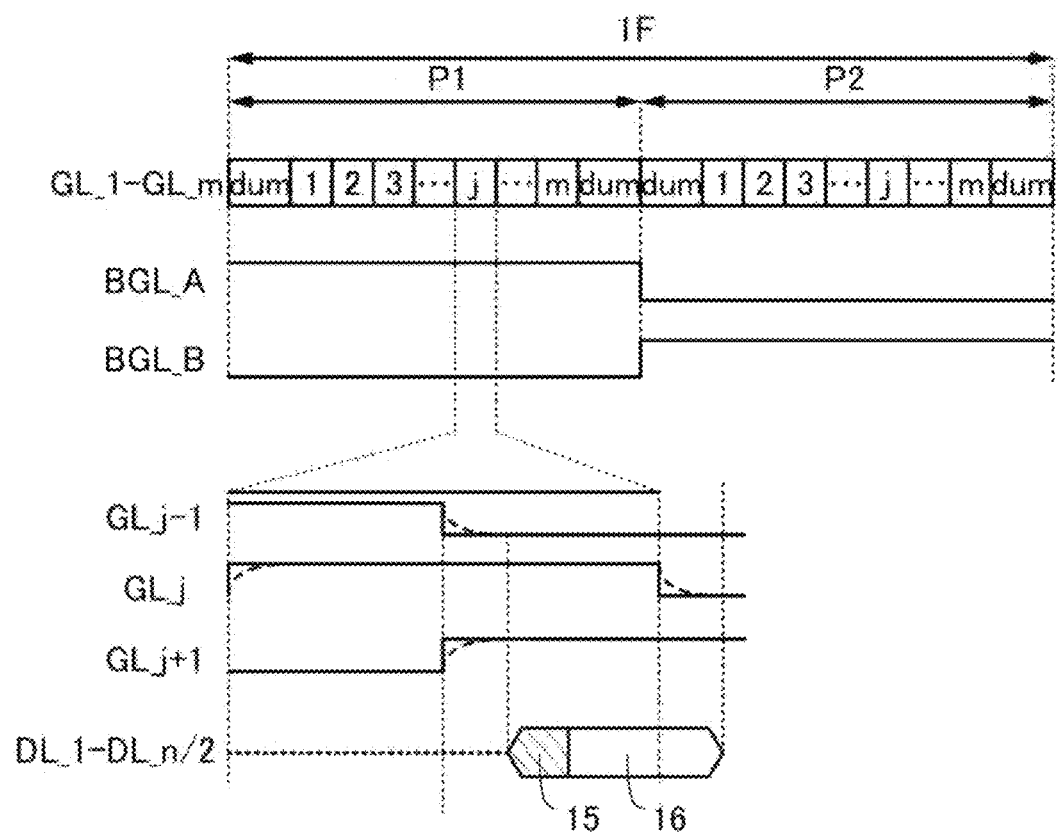

Furthermore, in FIG. 10(B), a timing chart for illustrating the selection from the gate lines GL_1 to GL_m in one frame period, the signal waveform of the control signal supplied to the control line BGL_A and the control line BGL_B, and the video voltage applied to the data lines DL_1 to DL_n/2 in the gate line selection period is shown.

In FIG. 10(B), dummy rows (dum in the diagram) which do not contribute to display are shown in addition to the selection of the rows from the first row to the m-th row through the j-th row. For example, as shown in FIG. 10(A), a period in which a dummy row is selected is provided between the first period P1 in which the pixel in an odd-numbered column is selected and the second period P2 in which the pixel in an even-numbered column is selected.

Furthermore, in FIG. 10(B), the control signal of the control line BGL_A is at H level in the first period P1 and the control signal of the control line BGL_B is at H level in the second period P2 as shown in FIG. 1(B). By selectively switching the control signal, writing of data to the pixel that is connected to the common gate line and data line can be controlled.

Furthermore, in FIG. 10(B), operation of applying the video voltage to the data line when the row is selected as the gate lines in the (j−1)-th row, j-th row, and (j+1)-th row are at H level is enlarged. By switching H level and L level of the scan signals of the gate lines, a waveform is distorted (dotted lines in FIG. 10(B)). Therefore, for example, the j-th row is selected and after the scan signal of the (j−1)-th row is changed to an L signal, the video voltage may be applied to the pixel in a period 16 for writing data after a data transition period 15. In the case of FIG. 10(B), data in the j-th row is written to the pixel in the (j+1)-th row together with the pixel in the j-th row; however, after the selection signal in the j-th row becomes L level, the data is switched to data in the (j+1)-th row and thus, there is no particular problem.

<Block Diagram of Liquid Crystal Display Device>

Next, FIGS. 11(A) to 11(D) are block diagrams each illustrating the arrangement of the display portion including the pixels, the gate line driver circuit for driving gate lines, the data line driver circuit for applying a video voltage to a data line in each column, a control line driver circuit for applying a control signal to the control line.

Figure 11A:
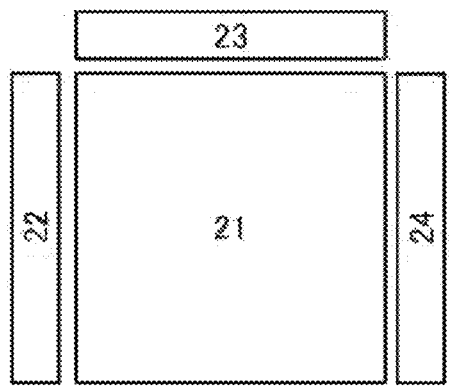
FIG. 11 Block diagrams illustrating one embodiment of the present invention.
Figure 11B:
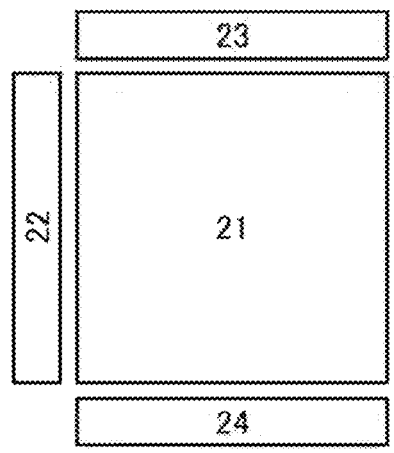

For example, in FIG. 11(A), a display portion 21, a gate line driver circuit 22, a data line driver circuit 23, and a control line driver circuit 24 are shown. With respect to the display portion 21, the control line driver circuit 24 may be positioned on the side opposite to the gate line driver circuit 22 as shown in FIG. 11(A). Alternatively, with respect to the display portion 21, the control line driver circuit 24 may be positioned on the side opposite to the data line driver circuit 23 as shown in FIG. 11(B).

Figure 11C:
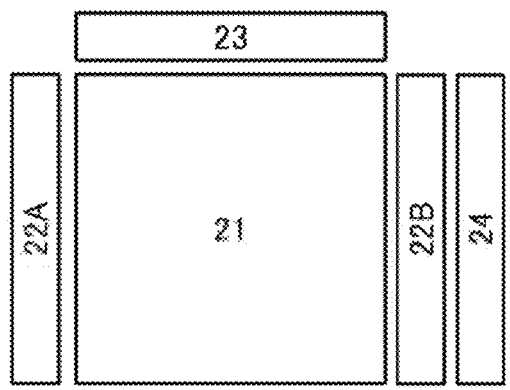
Figure 11D:
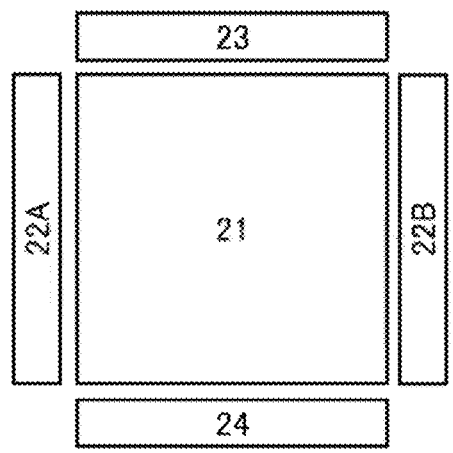

Furthermore, in the case where a plurality of gate line driver circuits (22A and 22B) is provided, the control line driver circuit 24 may be positioned on the same side of the gate line driver circuit 22B as shown in FIG. 11(C), for example. Alternatively, with respect to the display portion 21, the control line driver circuit 24 may be positioned on the side opposite to the data line driver circuit 23 as shown in FIG. 11(D).

<Top Views and Cross-Sectional Views of Pixel>

Next, examples of top views and examples of cross-sectional views of the pixel of the above-described liquid crystal display device will be described.

Figure 12:
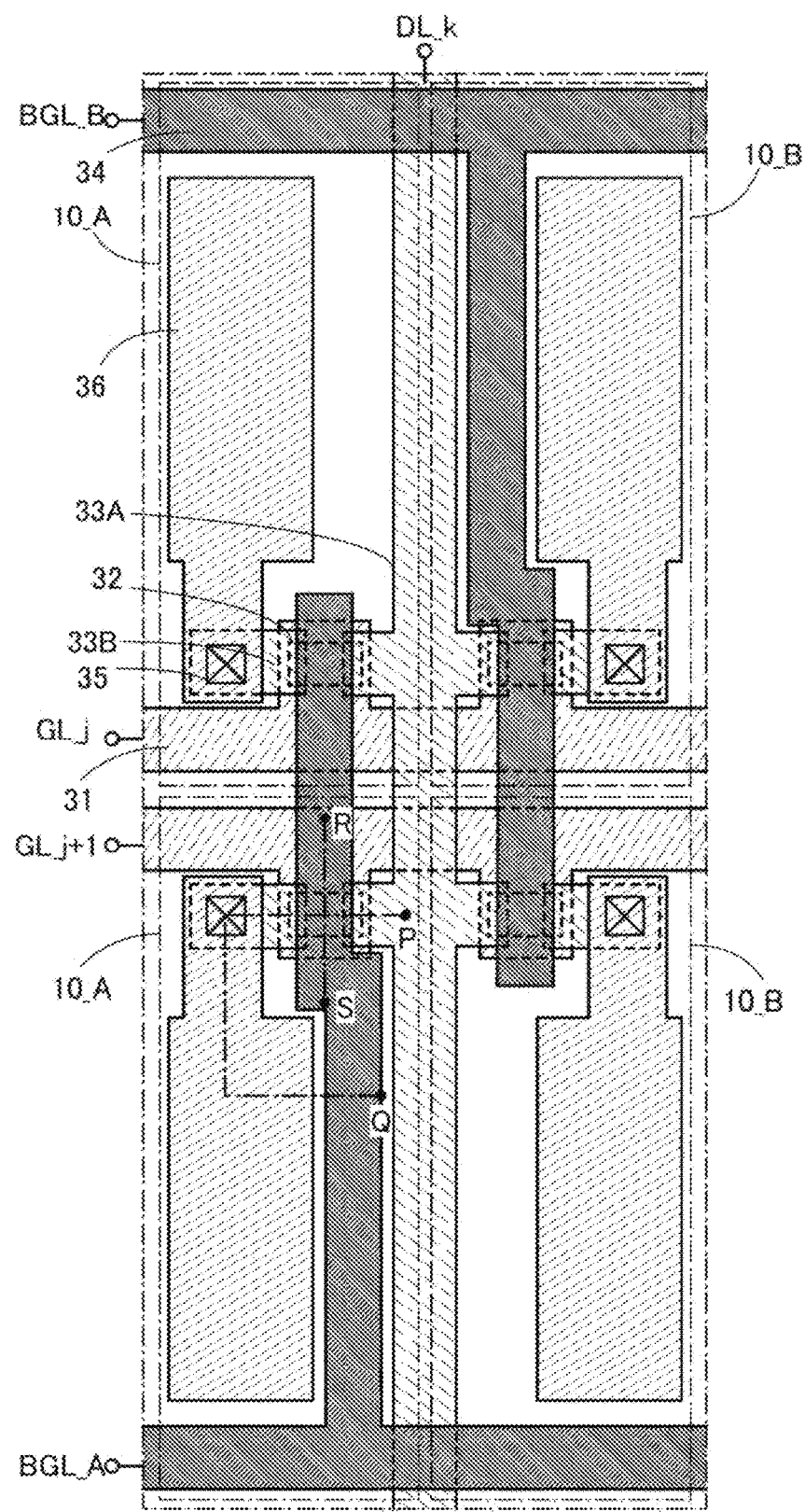
FIG. 12 A top view illustrating one embodiment of the present invention.
Figure 13:
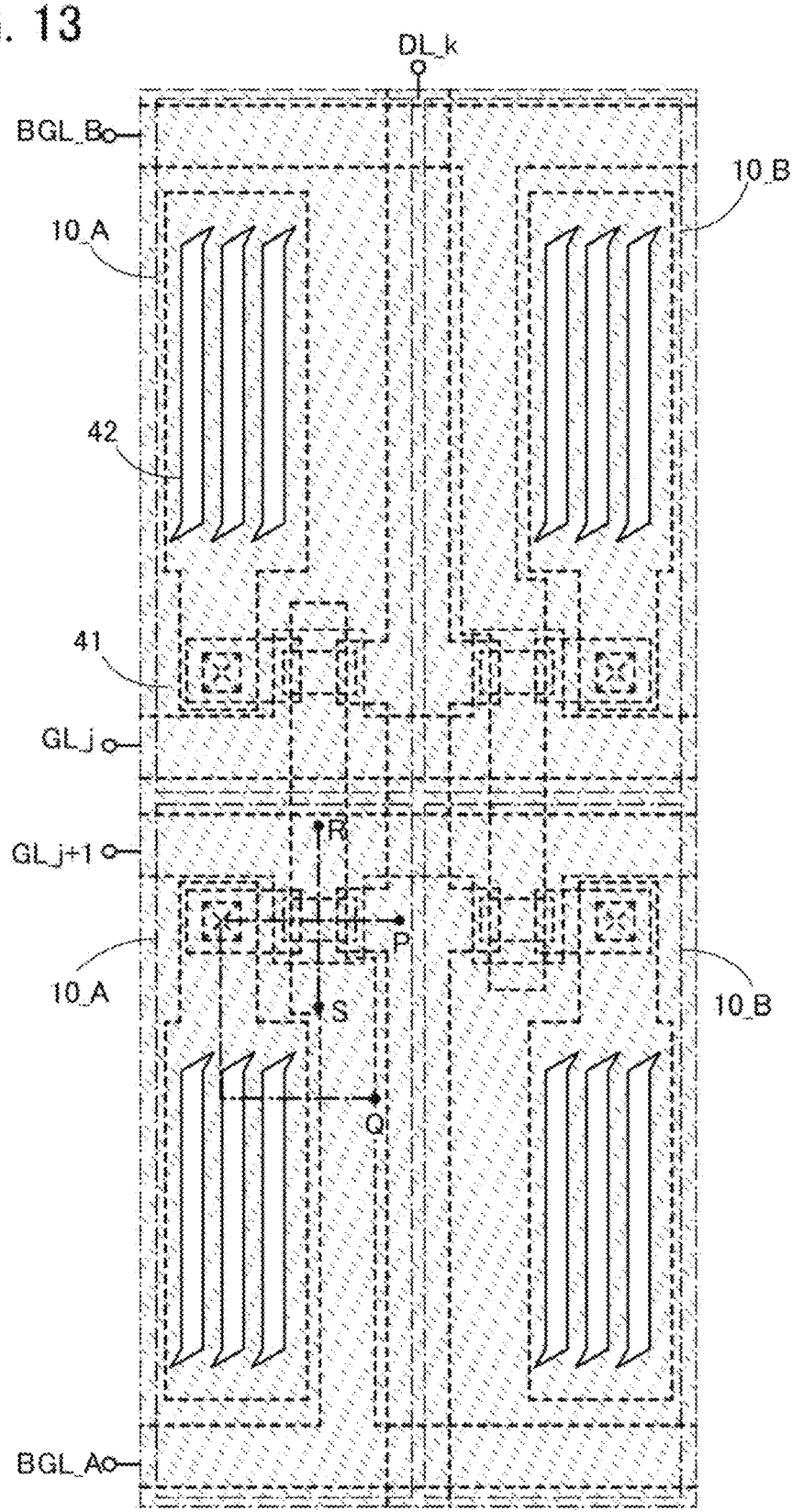
FIG. 13 A top view illustrating one embodiment of the present invention.
Figure 14A:
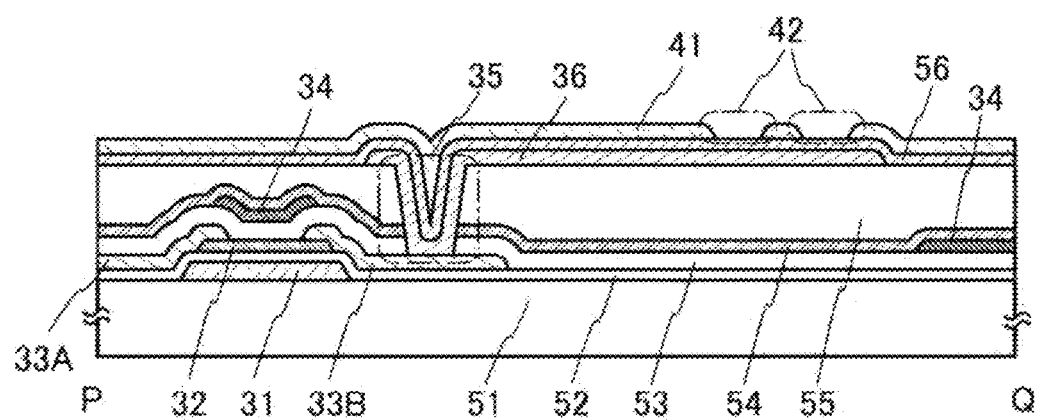
FIG. 14 Cross-sectional views illustrating one embodiment of the present invention.
Figure 14B:
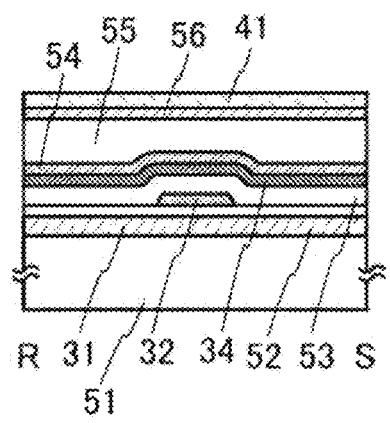

In FIG. 12, the top view of the pixels 10_A and 10_B arranged in two rows and two columns is shown. In FIG. 12, the data line DL k, the gate lines GL_j and GL_j+1, and the control lines BGL_A and BGL_B are shown. FIG. 13 is a top view illustrating the positions of conductive film further provided over the components illustrated in the top view in FIG. 12. FIG. 14(A) is a cross sectional view taken along dashed-dotted line P-Q in FIG. 12 and FIG. 13. FIG. 14(B) is a cross sectional view taken along dashed-dotted line R-S in FIG. 12 and FIG. 13.

FIG. 12 shows a conductive film 31, a semiconductor film 32, conductive films 33A and 33B, a conductive film 34, an opening portion 35, and a conductive film 36. A conductive film 41 and a slit 42 are shown in FIG. 13. Furthermore, although the structures of an insulating film, a substrate, and the like are not illustrated in FIG. 12 and FIG. 13, the pixels 10_A and 10_B each include a substrate 51, an insulating film 52, an insulating film 53, an insulating film 54, an insulating film 55, and an insulating film 56 as shown in FIGS. 14(A) and (B). Furthermore, a substrate provided on the side opposite to the substrate 51, a member provided over the substrate, and the like are not illustrated here, but may be employed as appropriate with reference to the following embodiments and the like.

The conductive film 31 functions as a gate line and a gate electrode of a transistor. The semiconductor film 32 includes a region to be a channel formation region of the transistor. The conductive films 33A and 33B function as a source line and a source electrode or a drain electrode of the transistor. The conductive film 34 functions as a back gate electrode of the transistor. The opening portion 35 is provided to connect the conductive film 33B to the conductive film 36. The conductive film 36 functions as a pixel electrode. The conductive film 41 functions as a common electrode. The slit 42 is provided in the conductive film 41 to generate a horizontal electric field between the conductive film 36 and the conductive film 41. The insulating film 52 functions as a gate insulating film. The insulating films 53 to 55 functions as an interlayer insulating film. The insulating film 56 is provided to prevent a short circuit between the conductive film 36 and the conductive film 41. Note that the components such as the conductive films, the substrate, and the insulating films will be described in more detail in Embodiment 2 and the like.

Figure 15:
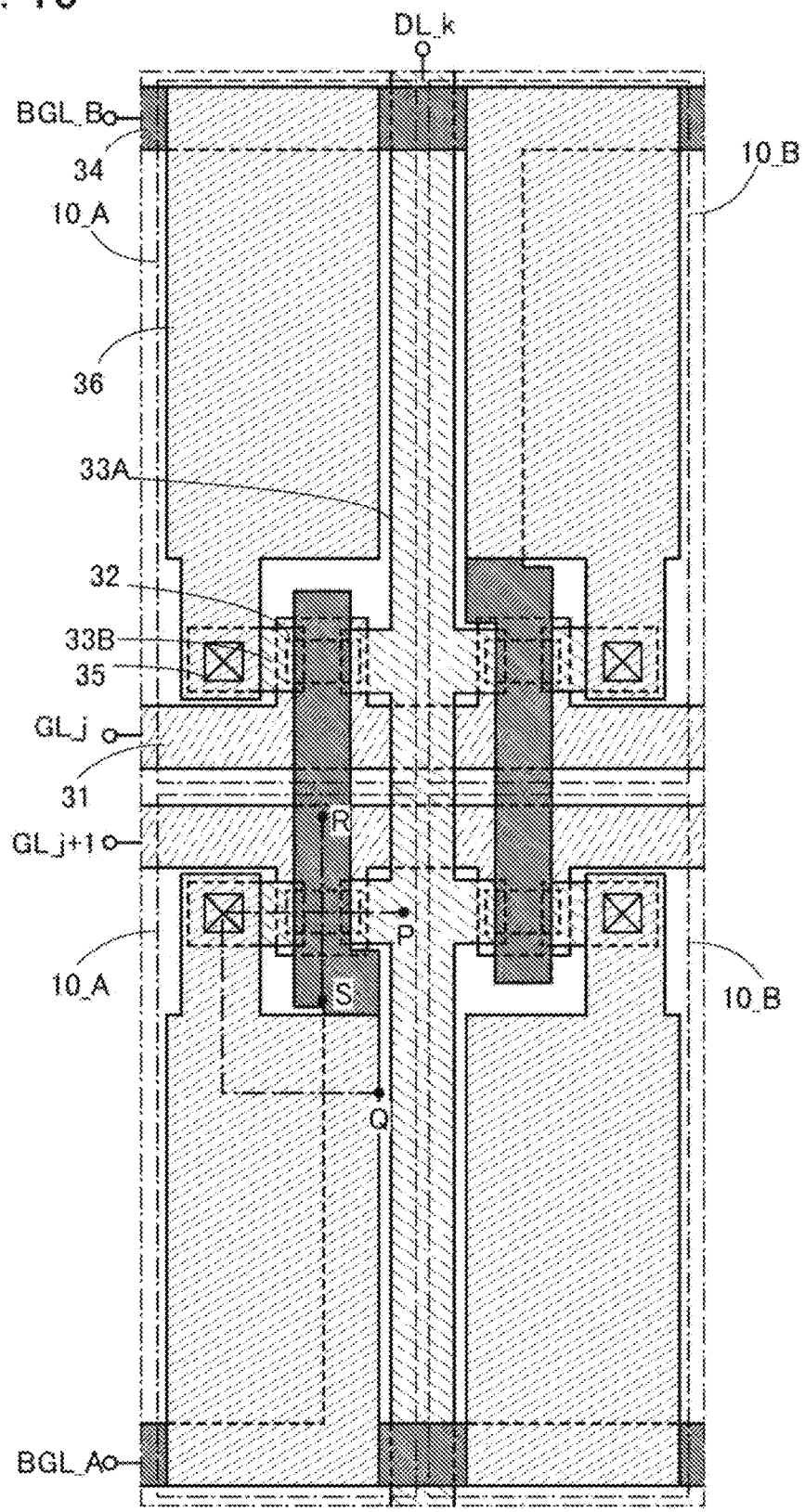
FIG. 15 A top view illustrating one embodiment of the present invention.
Figure 16:
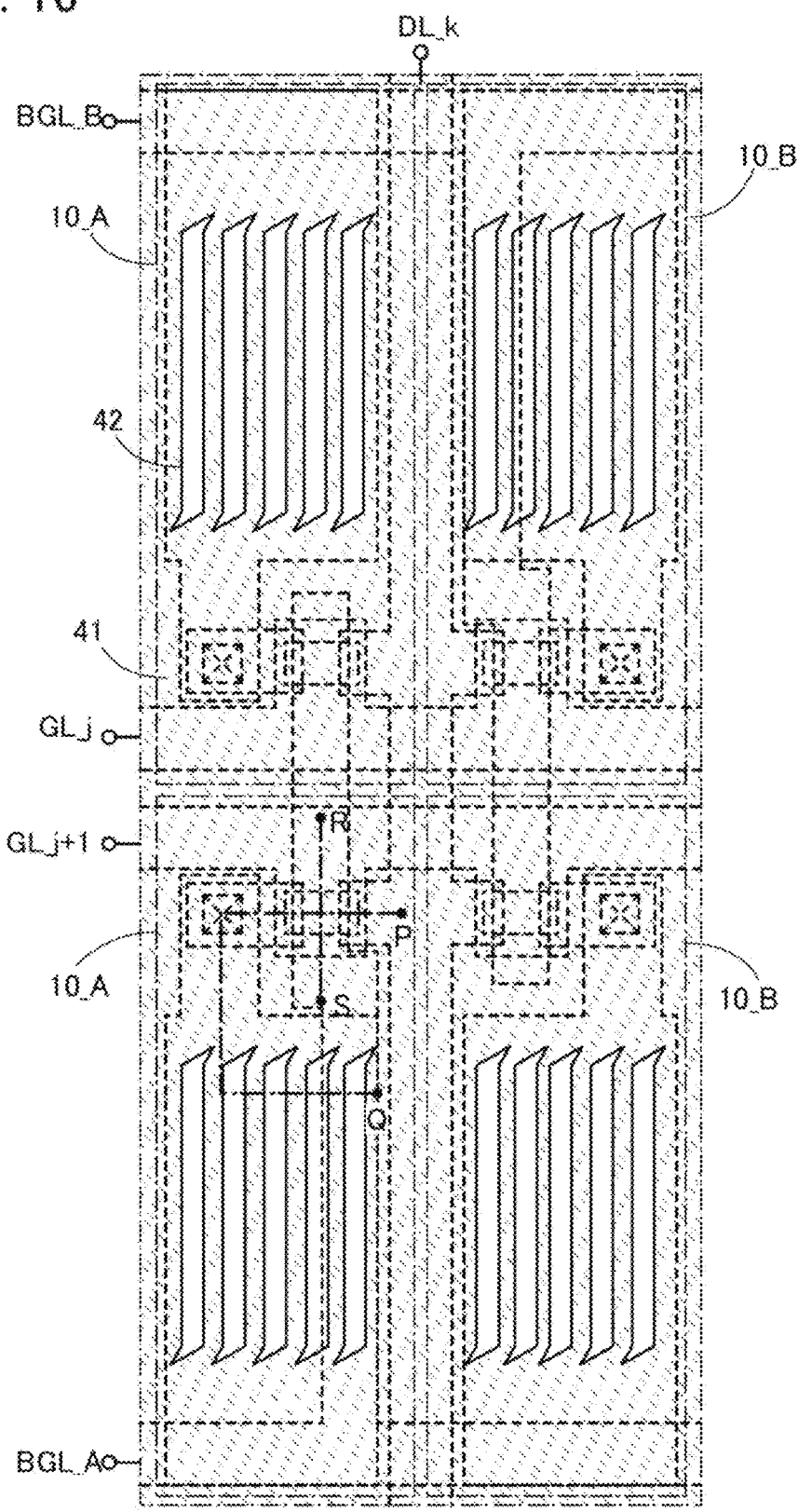
FIG. 16 A top view illustrating one embodiment of the present invention.
Figure 17A:
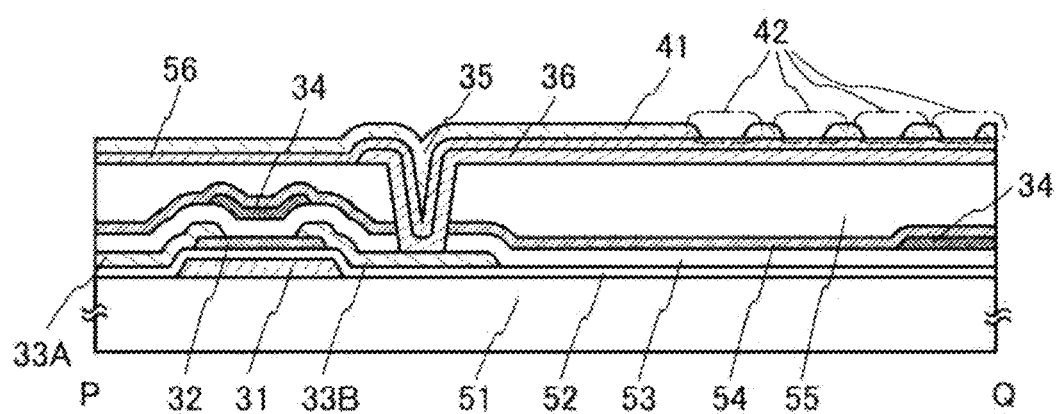
FIG. 17 Cross-sectional views illustrating an embodiment of the present invention.
Figure 17B:
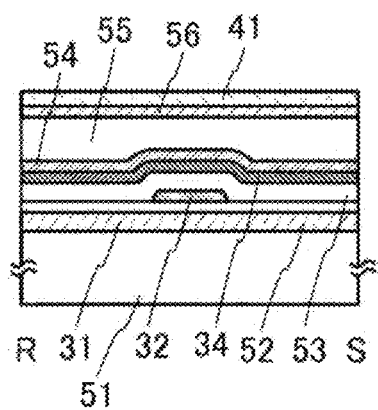

As the conductive film 34, a transparent conductive film can be used as described above. Therefore, light transmittance is not decreased even when the conductive film 34 is provided to overlap with the conductive film 36. A top view in this case is shown in FIG. 15 and FIG. 16, and a cross sectional view is shown in FIG. 17. Descriptions of components are the same as those in FIGS. 12 to 14 and are denoted by the common reference numerals. With the structures of the top views and the cross sectional views of FIGS. 15 to 17, the number of wirings can be reduced and the aperture ratio can be improved.

Embodiment 2

In this embodiment, a structure example of an in-cell touch panel in which a touch sensor function is added to the liquid crystal display device of one embodiment of the present invention is described.

As typical examples of the in-cell touch panel, a hybrid in-cell type and a full-in-cell type can be given. The hybrid in-cell type refers to a structure in which an electrode and the like constituting a part of a sensor element are provided for only a counter substrate or both a substrate that supports a display element and the counter substrate. The full-in-cell type refers to a structure in which an electrode and the like constituting a part of a sensor element are provided for only a substrate that supports a display element. The liquid crystal display device of one embodiment of the present invention is a full-in-cell touch panel. The full-in-cell touch panel is preferable because a structure of a counter substrate can be simplified.

Furthermore, the liquid crystal display device of one embodiment of the present invention is preferable because an electrode constituting a part of the display element also serves as an electrode constituting a part of the sensor element and thus the manufacturing process can be simplified and the manufacturing cost can be reduced.

Furthermore, one embodiment of the present invention can reduce the thickness or weight of the liquid crystal display device or the number of components of the liquid crystal display device as compared with a structure in which a display panel and a sensor element separately formed are attached to each other or a structure in which a sensor element is formed on the counter substrate side.

Furthermore, in the liquid crystal display device of one embodiment of the present invention, both an FPC for supplying a signal for driving a pixel and an FPC for supplying a signal for driving a sensor element are on one substrate side. With this structure, the touch panel can be easily incorporated into an electronic device, and the number of components can be reduced. Note that the signal for driving a pixel and the signal for driving a sensor element may be supplied by one FPC.

A structure of the touch panel is described below.
[Cross-Sectional Structure Example 1 of Liquid Crystal Display Device]

FIG. 18(A) is a top view of a liquid crystal display device 300 that can function as a touch panel. FIG. 18(B) is a cross-sectional view taken along dashed-dotted lines A-B and C-D in FIG. 18(A).

As illustrated in FIG. 18(A), the liquid crystal display device 300 includes a display portion 301 and gate line driver circuits 302. The display portion 301 includes a plurality of pixels 303, a plurality of data lines, and a plurality of gate lines, and has a function of displaying an image. Moreover, the display portion 301 also serves as an input portion. That is, the display portion includes a plurality of sensor elements that can sense touch or proximity of a sensing target to the liquid crystal display device 300 and thus serves as a touch sensor. The gate line driver circuit 302 has a function of outputting a scan signal to the gate lines included in the display portion 301. The pixel 303 includes a plurality of subpixels. Although FIG. 18(A) illustrates an example in which the pixel 303 includes three subpixels, one embodiment of the present invention is not limited to this example.

Although FIG. 18(A) illustrates an example in which the liquid crystal display device 300 includes the gate line driver circuit, one embodiment of the present invention is not limited to this example. The liquid crystal display device 300 that does not include any of a gate line driver circuit, a data line driver circuit, and a sensor driver circuit may be employed, or the liquid crystal display device 300 that includes any one or more of a gate line driver circuit, a data line driver circuit, and the sensor driver circuit may be employed.

In the liquid crystal display device 300, an IC 268 is mounted on a substrate 211 by a COG method or the like. The IC 268 includes, for example, any one or more of data line driver circuit, gate line driver circuit, and the sensor driver circuit.

Furthermore, an FPC 269 is electrically connected to the liquid crystal display device 300. The IC 268 and the gate line driver circuit are supplied with a signal from the outside via the FPC 269. Furthermore, a signal can be output from the IC 268 to the outside via the FPC 269.

An IC may be mounted on the FPC 269. For example, an IC including any one or more of the data line driver circuit, the gate line driver circuit, and the sensor driver circuit may be mounted on the FPC 269. For example, the IC may be mounted on the FPC 269 by a COF method or a TAB (Tape Ammounted Bonding) method.

For example, the IC 268 may include the data line driver circuit and the sensor driver circuit. Alternatively, for example, the IC 268 may include the data line driver circuit and the IC mounted on the FPC 269 may include the sensor driver circuit.

As illustrated in FIG. 18(B), the liquid crystal display device 300 includes a transistor 201*a*, a transistor 203*a*, a connection portion 205*a*, a liquid crystal element 207*a*, and the like over the substrate 211.

FIG. 18(B) illustrates the cross section of one subpixel as an example of the display portion 301. For example, a subpixel exhibiting a red color, a subpixel exhibiting a green color, and a subpixel exhibiting a blue color form one pixel, and thus full-color display can be achieved in the display portion 301. Note that the color exhibited by subpixels is not limited to red, green, and blue. For example, a subpixel exhibiting white, yellow, magenta, cyan, or the like may be used for a pixel.

The transistors 201*a* and 203*a* include a gate electrode 221, an oxide conductor film 227, an insulating film 215, an insulating film 213, an oxide semiconductor film 223, a source electrode 225*a*, and a drain electrode 225*b*.

The gate electrode 221 and the oxide conductor film 227 can each serve as a gate.

The transistor 201_*a* has a structure in which an oxide semiconductor film where a channel is formed is sandwiched between two gates. The gate electrode 221 is electrically connected to the oxide conductor film 227 through the conductive film 226. Transistors having such a structure in which two gates are electrically connected to each other can have a higher field-effect mobility and thus have higher on-state current than other transistors. Consequently, a circuit capable of high-speed operation can be obtained. Furthermore, the area occupied by a circuit portion can be reduced. The use of a transistor having high on-state current can reduce signal delay in wirings and can suppress display unevenness even in a liquid crystal display device in which the number of wirings is increased in accordance with the increase in size or resolution. Moreover, with such a structure, a highly reliable transistor can be formed.

As described above, the two gates of the transistor 203*a* are supplied with different signals. In this manner, in the case where different signals are supplied to the two gates of the transistors 203*a* to operate the transistor at different timings, the number of wirings for controlling the transistor can be decreased. As a result, the aperture ratio of the pixel can be increased.

The transistors 201_a and 203_a may have the same structure or different structures. That is, a transistor included in a driver circuit portion and a transistor included in a display portion may have the same structure or different structures.

The transistors 201*a* and 203*a* are covered with an insulating film 217 and an insulating film 219. Note that the insulating film 217 and further, the insulating film 219 can be regarded as the components of the transistors 201*a* and 203*a*. The insulating film 217 preferably has an effect of suppressing diffusion of impurities into a semiconductor included in a transistor. For example, for the insulating film 217, a material through which impurities such as water and hydrogen are hardly diffused is preferably used. As the insulating film 219, an insulating film having a planarization function is preferably selected in order to reduce surface unevenness due to the transistor.

In the transistors 201*a* and 203*a*, the oxide semiconductor film 223 is used as a semiconductor layer, and the oxide conductor film 227 is used as a gate. In that case, it is preferable that the oxide semiconductor film 223 and the oxide conductor film 227 be formed using an oxide semiconductor.

The resistivity of an oxide semiconductor can be easily controlled in a manufacturing process of the liquid crystal display device; thus, an oxide semiconductor can be favorably used as a material of a semiconductor film and a conductive film. When two or more layers included in the liquid crystal display device are formed using oxide semiconductors containing the same metal element, the same manufacturing apparatus (e.g., deposition apparatus or processing apparatus) can be used in two or more steps and manufacturing cost can thus be reduced.

Furthermore, an oxide semiconductor is a material that transmits visible light and can therefore be favorably used for an element that transmits visible light. Thus, even when used as a wiring, the signal can be transmitted without decreasing the aperture ratio.

Furthermore, forming the oxide semiconductor film 223 and the oxide conductor film 227 using the same metal element can reduce the manufacturing cost. For example, the manufacturing cost can be reduced by using a metal oxide target with the same metal composition. Furthermore, metal oxide targets with the same metal composition are used, whereby etching gas or an etchant can be used in common when the oxide semiconductor films are processed. Even when the oxide semiconductor film 223 and the oxide conductor film 227 contain the same metal element, they have different compositions in some cases. For example, a metal element in a film is released during the manufacturing process of the liquid crystal display device, which might result in different metal compositions.

The transistors 201*a* and 203*a* preferably include the oxide semiconductor film 223 that is highly purified to reduce the formation of oxygen vacancies. Accordingly, the current in an off state (off-state current) of the transistors can be made low. Thus, an electrical signal such as an image signal can be held for a longer period, and a writing interval can be set longer in an on state. Accordingly, frequency of refresh operation can be reduced, which leads to an effect of reducing power consumption.

Furthermore, in the transistors 201*a* and 203*a*, relatively high field-effect mobility can be obtained, whereby high-speed operation is possible. With such a transistor that can operate at high speed used for the liquid crystal display device, a transistor in a display portion and a transistor in a driver circuit portion can be formed over one substrate. That is, a semiconductor device formed using a silicon wafer or the like is not additionally needed as a driver circuit, whereby the number of components of the liquid crystal display device can be reduced. In addition, the transistor that can operate at high speed can be used also in the display portion, whereby a high-quality image can be provided.

The liquid crystal element 207*a* is a liquid crystal element having an FFS (Fringe Field Switching) mode. The liquid crystal element 207*a* includes a conductive film 251, a conductive film 252, and a liquid crystal 249. Orientation of the liquid crystal 249 can be controlled with an electric field generated between the conductive film 251 and the conductive film 252. The conductive film 251 can serve as a pixel electrode. The conductive film 252 can serve as a common electrode.

When a conductive material that transmits visible light is used for the conductive film 251 and the conductive film 252, the liquid crystal display device 300 can serve as a transmissive liquid crystal display device. Furthermore, when a conductive material that reflects visible light is used for the conductive film 251 and a conductive material that transmits visible light is used for the conductive film 252, the liquid crystal display device 300 can serve as a reflective liquid crystal display device.

For example, a material containing one of indium (In), zinc (Zn), and tin (Sn) is preferably used for the conductive material that transmits visible light. Specifically, indium oxide, indium tin oxide (ITO: Indium Tin Oxide), indium zinc oxide, indium oxide containing tungsten oxide, indium zinc oxide containing tungsten oxide, indium oxide containing titanium oxide, indium tin oxide containing titanium oxide, indium tin oxide to which silicon oxide is added, zinc oxide, and zinc oxide to which gallium is added are given, for example. Note that a film including graphene can be used as well. The film including graphene can be formed, for example, by reducing a film containing graphene oxide.

An oxide conductor film is preferably used as the conductive film 251. Furthermore, an oxide conductor film is preferably used as the conductive film 252. The oxide conductor film preferably contains one or more kinds of metal elements included in the oxide semiconductor film 223. For example, the conductive film 251 preferably contains indium, and is further preferably an In-M-Zn oxide (M is Al, Ti, Ga, Y, Zr, La, Ce, Nd, Sn, or Hf) film. Similarly, the conductive film 252 preferably contains indium and is further preferably the In-M-Zn oxide film.

Note that at least one of the conductive film 251 and the conductive film 252 may be formed using an oxide semiconductor. As described above, when two or more layers constituting a part of the liquid crystal display device are formed using oxide semiconductors containing the same metal element, the same manufacturing apparatus (for example, deposition apparatus or processing apparatus) can be used in two or more steps and manufacturing cost can thus be reduced.

For example, when a silicon nitride film containing hydrogen is used as an insulating film 253 and an oxide semiconductor is used for the conductive film 251, the conductivity of the oxide semiconductor can be increased owing to hydrogen supplied from the insulating film 253.

Examples of a conductive material that reflects visible light include aluminum, silver, and an alloy including any of these metal elements.

The conductive film 251 serving as a pixel electrode is electrically connected to a source or a drain of the transistor 203a. Here, the conductive film 251 is electrically connected to the drain electrode 225b.

The conductive film 252 has a comb-like top surface shape (also referred to as a planar surface shape) or a top surface shape provided with a slit. The insulating film 253 is provided between the conductive film 251 and the conductive film 252. The conductive film 251 partly overlaps with the conductive film 252 with the insulating film 253 interposed therebetween. In a region where a coloring film 241 overlaps with the conductive film 251, there is a portion where the conductive film 252 is not provided over the conductive film 251.

The connection portion 205a is electrically connected to an external input terminal through which a signal (a video signal, a clock signal, a start signal, a reset signal, or the like) or a potential from the outside is transmitted to the gate line driver circuit 302. An example in which the FPC 269 is provided as an external input terminal is shown here.

The connection portion 205a includes a conductive film 231 over the insulating film 213, a conductive film 233 over the conductive film 231, and a conductive film 235 over the conductive film 233. The conductive film 231 is electrically connected to the conductive film 235 via the conductive film 233. Then, the conductive film 235 is electrically connected to the FPC 269 via a connector 267.

The conductive film 231 can be formed using the same material and the same step as those of the source electrode 225a and the drain electrode 225b included in the transistors 201a and 203a. The conductive film 233 can be formed using the same material and the same step as those of the conductive film 251 included in the liquid crystal element 207a. The conductive film 235 can be formed using the same material and the same step as those of the conductive film 252 included in the liquid crystal element 207a. It is preferable to form the conductive films included in the connection portion 205a using the same materials and the same steps as an electrode or a wiring used for a display portion or a driver circuit portion in such a manner because an increase in number of steps can be prevented.

A substrate 261 is provided with the coloring film 241, a light-blocking film 243, and an insulating film 245. FIG. 18(B) illustrates an example in which the substrate 261 has a smaller thickness than the substrate 211; however, one embodiment of the present invention is not limited to this example. One of the substrate 261 and the substrate 211 may be thinner than the other, or the substrate 261 and the substrate 211 may have the same thickness. It is preferable to make the substrate on the display surface side (the side near a sensing target) thin because the detection sensitivity of a sensor element can be increased.

The coloring film 241 partly overlaps with the liquid crystal element 207a. The light-blocking film 243 partly overlaps with at least one of the transistors 201a and 203a.

The insulating film 245 preferably has a function of an overcoat preventing impurities contained in the coloring film 241, the light-blocking film 243, and the like from diffusing into the liquid crystal 249. The insulating film 245 is not necessarily provided.

Note that alignment films may be provided on surfaces of the substrate 211 and the substrate 261 which are in contact with the liquid crystal 249. The alignment film can control the alignment of the liquid crystal 249. For example, an alignment film covering the conductive film 252 may be formed in FIG. 18(B). Furthermore, the alignment film may be provided between the insulating film 245 and the liquid crystal 249 in FIG. 18(B). Furthermore, the insulating film 245 may function as both an alignment film and an overcoat.

Furthermore, the liquid crystal display device 300 includes a spacer 247. The spacer 247 has a function of preventing the distance between the substrate 211 and the substrate 261 from being shorter than or equal to a certain distance.

FIG. 18(B) illustrates an example in which the spacer 247 is provided over the insulating film 253 and the conductive film 252; however, one embodiment of the present invention is not limited thereto. The spacer 247 may be provided on the substrate 211 side or on the substrate 261 side. For example, the spacer 247 may be formed on the insulating film 245. Moreover, although FIG. 18(B) illustrates an example in which the spacer 247 is in contact with the insulating films 253 and 245, the spacer 247 is not necessarily in contact with a component provided on the substrate 211 side or on the substrate 261 side.

A particulate spacer may be used as the spacer 247. Although a material such as silica can be used for the particulate spacer, an elastic material such as a resin or rubber is preferably used. In some cases, the particulate spacer may be vertically crushed.

The substrate 211 and the substrate 261 are attached to each other with a bonding layer 265. A region surrounded by the substrate 211, the substrate 261, and the bonding layer 265 is filled with the liquid crystal 249.

Note that when the liquid crystal display device 300 functions as a transmissive liquid crystal display device, two polarizers are positioned in a way that the display area is sandwiched by the two polarizers. Light from a backlight provided outside the polarizing plate enters through the polarizing plate. At this time, the alignment of the liquid crystal 249 is controlled with a voltage applied between the conductive film 251 and the conductive film 252, whereby optical modulation of light can be controlled. In other words, the intensity of light emitted through the polarizing plate can be controlled. Light excluding light in a particular wavelength range is absorbed by the coloring film 241, so that red, blue, or green light is emitted.

In addition to the polarizing plate, a circularly polarizing plate can be used, for example. As the circularly polarizing plate, for example, a stack including a linear polarizing plate and a quarter-wave retardation plate can be used. With the circularly polarizing plate, the viewing angle dependence of display of the liquid crystal display device can be reduced.

Note that the liquid crystal element 207a is an element using an FFS mode here; however, one embodiment of the present invention is not limited thereto, and a liquid crystal element using any of a variety of modes can be used. For example, a liquid crystal element using a VA (Vertical Alignment) mode, a TN (Twisted Nematic) mode, an IPS (In-Plane Switching) mode, an ASM (Axially Symmetric aligned Micro-cell) mode, an OCB (Optically Compensated Birefringence) mode, an FLC (Ferroelectric Liquid Crystal) mode, an AFLC (Antiferroelectric Liquid Crystal) mode, or the like can be used.

Furthermore, a normally black liquid crystal display device, for example, a transmissive liquid crystal display device using a vertical alignment (VA) mode, may be used as the liquid crystal display device 300. As a vertical alignment mode, an MVA (Multi-Domain Vertical Alignment) mode, a PVA (Patterned Vertical Alignment) mode, or an ASV mode can be employed, for example.

Note that the liquid crystal element is an element that controls transmission or non-transmission of light by utilizing an optical modulation action of liquid crystal. The optical modulation action of liquid crystal is controlled by an electric field applied to the liquid crystal (including a lateral electric field, a vertical electric field, and a diagonal electric field). Note that as the liquid crystal used for the liquid crystal element, thermotropic liquid crystal, low-molecular liquid crystal, high-molecular liquid crystal, polymer dispersed liquid crystal (PDLC: Polymer Dispersed Liquid Crystal), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Furthermore, as the liquid crystal material, a positive liquid crystal or a negative liquid crystal may be used, and an appropriate liquid crystal material can be used depending on the mode and design to be used.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 weight % or more of a chiral material is mixed is used for the liquid crystal 249 in order to increase the temperature range. The liquid crystal composition that includes liquid crystal exhibiting a blue phase and a chiral material has a short response time and has optical isotropy. In addition, the liquid crystal composition that includes liquid crystal exhibiting a blue phase and a chiral material does not need alignment treatment and has a small viewing angle dependence. In addition, since an alignment film does not need to be provided and rubbing treatment is unnecessary, electrostatic discharge damage caused by the rubbing treatment can be prevented and defects or damage of the liquid crystal display device in the manufacturing process can be reduced.

A substrate with which a sensing target, such as a finger or a stylus, is to be in contact may be provided above the substrate 261. In that case, a polarizing plate or a circularly polarizing plate is preferably provided between the substrate 261 and the above substrate. In that case, a protective layer (such as a ceramic coat) is preferably provided over the above substrate. The protective layer can be formed using an inorganic insulating material such as silicon oxide, aluminum oxide, yttrium oxide, or yttria-stabilized zirconia (YSZ). Alternatively, tempered glass may be used for the substrate. The tempered glass that can be used here is one that has been subjected to physical or chemical treatment by an ion exchange method, a thermal tempering method, or the like and has a surface to which compressive stress has been applied.

FIG. 19(A) is a cross-sectional view of two adjacent pixels. Two subpixels illustrated in FIG. 19(A) are included in respective pixels.

In FIG. 19(A), capacitance formed between the conductive film 252 in the left subpixel and the conductive film 252 in the right subpixel is utilized to sense proximity, touch, or the like of a sensing target. That is, in the liquid crystal display device of one embodiment of the present invention, the conductive film 252 serves as a common electrode of the liquid crystal element and an electrode of the sensor element.

As described above, an electrode included in the liquid crystal element also serves as an electrode included in the sensor element in the liquid crystal display device of one embodiment of the present invention; thus, the manufacturing process can be simplified and the manufacturing cost can be reduced. In addition, the thickness and weight of the liquid crystal display device can be reduced.

Furthermore, when the capacitance between the electrode of the sensor element and a signal line is too large, the time constant of the electrode of the sensor element becomes too large in some cases. Thus, an insulating film having a planarizing function is preferably provided between the electrode of the sensor element and the transistors to reduce the capacitance between the electrode of the sensor element and the signal line. For example, in FIG. 19(A), as the insulating film having a planarizing function, the insulating film 219 is provided. With the insulating film 219, the capacitance between the conductive film 252 and the signal line can be small. Accordingly, the time constant of the electrode of the sensor element can be small. As described above, the smaller the time constant of the electrode of the sensor element is, the higher the detection sensitivity and the detection accuracy are.

For example, the time constant of the electrode of the sensor element is greater than 0 seconds and smaller than or equal to $1 \times 10^{-4}$ seconds, preferably greater than 0 seconds and smaller than or equal to $5 \times 10^{-5}$ seconds, more preferably greater than 0 seconds and smaller than or equal to $5 \times 10^{-6}$ seconds, more preferably greater than 0 seconds and smaller than or equal to $5 \times 10^{-7}$ seconds, more preferably greater than 0 seconds and smaller than or equal to $2 \times 10^{-7}$ seconds. In particular, when the time constant is smaller than or equal to $1 \times 10^{-6}$ seconds, high detection sensitivity can be achieved while the influence of noise is reduced.

[Cross-Sectional Structure Example 2 of Liquid Crystal Display Device]

FIG. 19(B) is a cross-sectional view of two adjacent pixels that are different from those in FIG. 19(A). Two subpixels illustrated in FIG. 19(B) are included in respective pixels.

Structure example 2 shown in FIG. 19(B) is different from Structure example 1 in FIG. 18(B) and FIG. 19(A) in that a conductive film 255 is provided over the insulating film 253.

The conductive film 252 is electrically connected to the conductive film 255 serving as an auxiliary wiring. With the conductive film 255, the resistance of the electrode of the sensor element can be lowered. With the lowered resistance of the resistance of the electrode of the sensor element, the time constant of the electrode of the sensor element can be small. The smaller the time constant of the electrode of the sensor element is, the higher the detection sensitivity and the detection accuracy are.

The conductive film 255 can have a lower resistivity than the conductive film 252. For example, the conductive film 255 can be formed to have a single-layer structure or a stacked-layer structure using any of metal materials such as molybdenum, titanium, chromium, tantalum, tungsten, aluminum, copper, silver, neodymium, and scandium, and an alloy material containing any of these elements.

[Cross-Sectional Structure Example 3 of Liquid Crystal Display Device]

Figure 20:
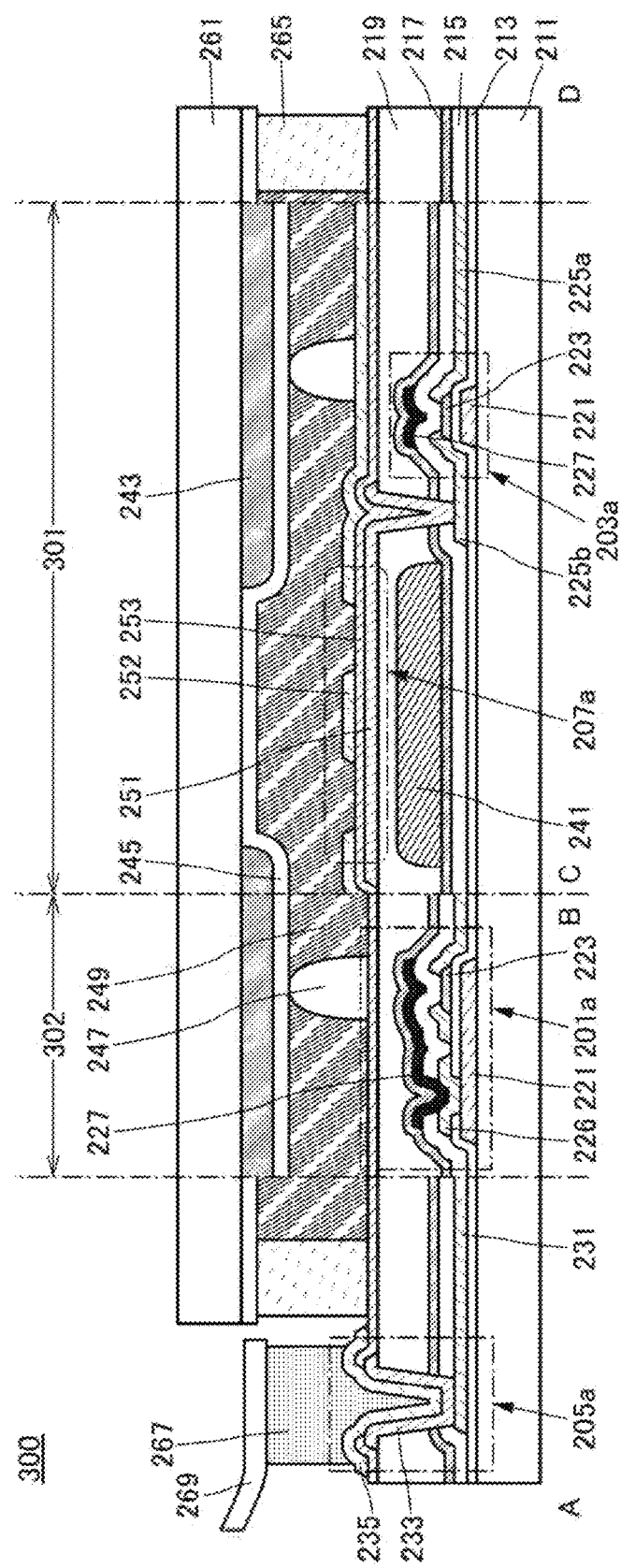
FIG. 20 A cross-sectional view illustrating an example of a liquid crystal display device.

FIG. 20 is a cross-sectional view taken along dashed-dotted line A-B and dashed-dotted line C-D in FIG. 18(A) that is different from the cross-sectional view of FIG. 18(B).

Structure example 3 in FIG. 20 differs from Structure example 1 in FIG. 18(B) in the position of the coloring film 241. Note that in Structure example 3, the above description can be referred to for portions similar to Structure example 1.

The coloring film 241 is not necessarily formed on the counter substrate (the substrate 261) side. As illustrated in FIG. 20, the coloring film 241 may be formed over the substrate 211 provided with the transistors and the like. Accordingly, a decrease in yield and display quality caused by a decrease in alignment accuracy of the substrates 211 and 261 due to an increase in resolution of the display of the liquid crystal display device can be suppressed.

[Cross-Sectional Structure Example 4 of Liquid Crystal Display Device]

Figure 21:
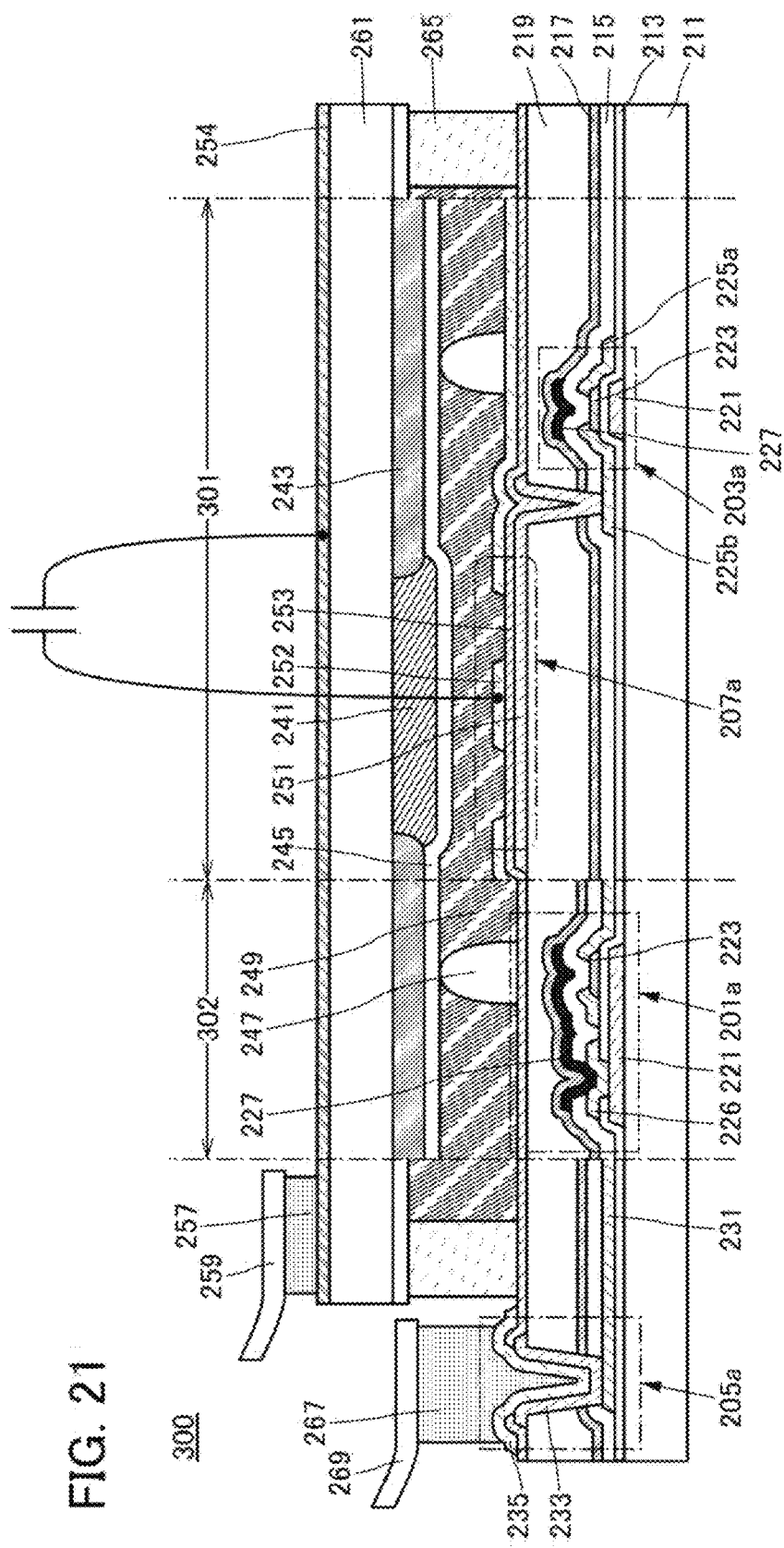
FIG. 21 A cross-sectional view illustrating an example of a liquid crystal display device.

FIG. 21 is a cross-sectional view of a liquid crystal display device that is different from the liquid crystal display devices in the above-described structure examples. The liquid crystal display device of one embodiment of the present invention is not limited to a touch panel in which an electrode and the like included in a sensor element (full-in-cell type) are provided only over a substrate supporting a display element. As illustrated in the liquid crystal display device of FIG. 21, an electrode included in a sensor element may be provided on a counter substrate side.

FIG. 21 illustrates an example in which a conductive film 254 is formed over a surface of the substrate 261 that is opposite to a surface on which the coloring film 241 and the like are formed. The conductive film 254 is electrically connected to an FPC 259 via a connector 257. In the liquid crystal display device 300 of FIG. 21, capacitance formed between the conductive film 252 and the conductive film 254 is utilized to sense proximity, touch, or the like of a sensing target. That is, in the liquid crystal display device of one embodiment of the present invention, the conductive film 252 serves as the common electrode of the liquid crystal element and one electrode of the sensor element. In this manner, the common electrode of the liquid crystal element may serve as the one electrode of the sensor element or a pair of electrodes of the sensor element.

Furthermore, FIG. 21 illustrates an example in which the conductive film 255 is formed over the conductive film 252. The electrode of the liquid crystal element may be over or under a conductive film that can function as an auxiliary wiring of the electrode.

Next, the details of the materials and the like that can be used for components of the liquid crystal display device of this embodiment are described. Note that description on the components already described is omitted in some cases. Furthermore, the materials described below can be used as appropriate for the liquid crystal display device described in a later embodiment and its components.

<<Substrate>>

There is no particular limitation on a material and the like of the substrate included in the liquid crystal display device 300 as long as the material has heat resistance high enough to withstand at least heat treatment to be performed later. For example, a glass substrate, a ceramic substrate, a quartz substrate, a sapphire substrate, or the like may be used. Alternatively, a single crystal semiconductor substrate or a polycrystalline semiconductor substrate made of silicon, or silicon carbide, a compound semiconductor substrate made of silicon germanium or the like, an SOI substrate, or the like can be used as a substrate 102. Furthermore, any of these substrates provided with a semiconductor element may be used as the substrate 102. Note that in the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated. Alternatively, a flexible substrate may be used as the substrate 211, and the transistor, the capacitor, and the like may be formed directly on the flexible substrate.

The weight and thickness of the liquid crystal display device can be decreased by using a thin substrate. Furthermore, a flexible liquid crystal display device can be obtained by using a substrate that is thin enough to have flexibility.

Other than the above, a transistor can be formed using any of various substrates as the substrates 211 and 261. The type of the substrate is not limited to a certain type. Examples of the substrate include a plastic substrate, a metal substrate, a stainless steel substrate, a substrate including stainless steel foil, a tungsten substrate, a substrate including tungsten foil, a flexible substrate, an attachment film, paper including a fibrous material, a base material film, and the like. As an example of a glass substrate, a barium borosilicate glass substrate, an aluminoborosilicate glass substrate, a soda lime glass substrate, and the like can be given. Examples of a flexible substrate include a flexible synthetic resin such as plastics typified by polyethylene terephthalate (PET), polyethylene naphthalate (PEN), and polyether sulfone (PES), and acrylic. Examples of the attachment film include polypropylene, polyester, polyvinyl fluoride, and polyvinyl chloride. Examples of the base material film include polyester, polyamide, polyimide, an inorganic vapor deposition film, and paper. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), or the like), a leather substrate, a rubber substrate, or the like can be used as a substrate to which the transistor is transferred. By using such a substrate, a transistor with excellent characteristics or a transistor with low power consumption can be formed, a device with high durability can be formed, heat resistance can be provided, or reduction in weight or thickness can be achieved.

<<Transistor>>

There is no particular limitation on the structure of the transistor included in the liquid crystal display device of one embodiment of the present invention. For example, a planar transistor, a staggered transistor, or an inverted staggered transistor may be used. Furthermore, a top-gate transistor or a bottom-gate transistor may be used. Furthermore, gate electrodes may be provided above and below a channel. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

Furthermore, as a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

As a semiconductor layer, it is particularly preferable to use an oxide semiconductor film including a plurality of crystal parts whose c-axes are aligned substantially perpendicular to a surface on which the semiconductor layer is formed or the top surface of the semiconductor layer and in which the adjacent crystal parts have no grain boundary.

There is no grain boundary in such an oxide semiconductor; therefore, generation of a crack in an oxide semiconductor film which is caused by stress when a display panel is bent is prevented. Therefore, such an oxide semiconductor can be preferably used for a flexible liquid crystal display device which is used in a bent state, or the like.

Moreover, the use of such an oxide semiconductor for the semiconductor layer makes it possible to provide a highly reliable transistor in which a variation in electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

Furthermore, transistors including polysilicon films can form various functional circuits, such as a shift register circuit, a level shifter circuit, a buffer circuit, and a sampling circuit, because of their high field-effect mobility.

<<Oxide Semiconductor Film>>

The oxide semiconductor film 223 preferably includes a film represented by an In-M-Zn oxide that contains at least indium (In), zinc (Zn), and M (M is a metal such as Al, Ti, Ga, Y, Zr, La, Ce, Sn, or Hf). Furthermore, in order to reduce variation in electrical characteristics of the transistors including the oxide semiconductor, the oxide semiconductor preferably contains a stabilizer in addition to indium, zinc, and M.

Examples of the stabilizer, including metals that can be used as M, are gallium (Ga), tin (Sn), hafnium (Hf), aluminum (Al), and zirconium (Zr). Furthermore, other examples of the stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor included in the oxide semiconductor film 223, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

Note that in the case where the oxide semiconductor film 223 contains an In-M-Zn oxide, the proportions of In and M when the summation of In and M is assumed to be 100 atomic % are preferably as follows: the proportion of In is greater than 25 atomic % and the proportion of M is less than 75 atomic %, and more preferably, the proportion of In is greater than 34 atomic % and the proportion of M is less than 66 atomic %.

The energy gap of the oxide semiconductor film 223 is 2 eV or more, preferably 2.5 eV or more, further preferably 3 eV or more. With the use of an oxide semiconductor having such a wide energy gap, the off-state current of the transistor can be reduced.

The thickness of the oxide semiconductor film 223 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 223 contains an In-M-Zn oxide (M represents Al, Ga, Y, Zr, La, Ce, or Nd), it is preferable that the atomic ratio of metal elements of a sputtering target used for forming a film of the In-M-Zn oxide satisfy In M and Zn M Examples of the atomic ratio of metal elements of such a sputtering target include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2. Note that the atomic ratio of metal elements in the formed oxide semiconductor film 223 varies from the above atomic ratio of metal elements of the sputtering target within a range of plus or minus 40% as an error.

An oxide semiconductor film with a low carrier density is used as the oxide semiconductor film 223. For example, an oxide semiconductor film whose carrier density is $1\times10^{17}/\text{cm}^3$ or lower, preferably $1\times10^{15}/\text{cm}^3$ or lower, more preferably $1\times10^{13}/\text{cm}^3$ or lower, still more preferably $1\times10^{11}/\text{cm}^3$ or lower is used as the oxide semiconductor film 223.

Note that, without limitation to those described above, an oxide semiconductor with an appropriate composition may be used depending on required semiconductor characteristics and electrical characteristics (field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 223 be set to be appropriate.

When silicon or carbon that is one of elements belonging to Group 14 is contained in the oxide semiconductor film 223, oxygen vacancies are increased in the oxide semiconductor film 223, and the oxide semiconductor film 223 becomes n-type. Thus, the concentration of silicon or carbon (the concentration measured by secondary ion mass spectrometry) in the oxide semiconductor film 223 is set to be lower than or equal to $2\times10^{18}$ atoms/cm$^3$, preferably lower than or equal to $2\times10^{17}$ atoms/cm$^3$.

Furthermore, the concentration of alkali metal or alkaline earth metal in the oxide semiconductor film 223, which is measured by secondary ion mass spectrometry, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 223.

Furthermore, when containing nitrogen, the oxide semiconductor film 223 easily becomes an n-type film by generation of electrons serving as carriers and an increase of carrier density. Thus, a transistor including an oxide semiconductor which contains nitrogen is likely to be normally-on. For this reason, nitrogen in the oxide semiconductor film is preferably reduced as much as possible; the nitrogen concentration which is measured by SIMS is preferably set to be, for example, lower than or equal to $5\times10^{18}$ atoms/cm$^3$.

Furthermore, the oxide semiconductor film 223 may have a non-single-crystal structure, for example. Non-single-crystal structures include a CAAC-OS (C Axis Aligned-Crystalline Oxide Semiconductor) described later, a polycrystalline structure, a microcrystalline structure described later, and an amorphous structure. Among the non-single-crystal structures, the amorphous structure has the highest density of defect states, whereas the CAAC-OS has the lowest density of defect states.

The oxide semiconductor film 223 may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and no crystal part.

Note that the oxide semiconductor film 223 may be a mixed film including two or more of the following: a region having an amorphous structure, a region having a microcrystalline structure, a region having a polycrystalline structure, a CAAC-OS region, and a region having a single crystal structure. The mixed film may include, for example, two or more of a region having an amorphous structure, a region having a microcrystalline structure, a region having a polycrystalline structure, a CAAC-OS region, and a region having a single crystal structure in some cases. Furthermore, the mixed film may have layered structure including, for example, layers of two or more of a region having an amorphous structure, a region having a microcrystalline structure, a region having a polycrystalline structure, a CAAC-OS region, and a region having a single crystal structure in some cases.

Alternatively, silicon is preferably used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has a higher field-effect mobility and a higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which pixels are formed, and the number of components of an electronic device can be reduced.

<<Method for Controlling Resitivity of Oxide Semiconductor>>

An oxide semiconductor is a semiconductor material whose resistance can be controlled by oxygen vacancies in the film and/or the concentration of impurities such as hydrogen or water in the film. Thus, the resistivity of the oxide conductor film can be controlled by selecting treatment for increasing oxygen vacancies and/or impurity concentration on the oxide semiconductor film or treatment for reducing oxygen vacancies and/or impurity concentration on the oxide semiconductor film.

Note that such an oxide conductor film formed using an oxide semiconductor film can be referred to as an oxide semiconductor film having a high carrier density and a low resistance, an oxide semiconductor film having conductivity, or an oxide semiconductor film having high conductivity.

Specifically, plasma treatment is performed on an oxide semiconductor film to be the oxide conductor film 227 serving as a gate to increase oxygen vacancies and/or impurities such as hydrogen or water in the oxide semiconductor film; accordingly, the oxide semiconductor film can have a high carrier density and a low resistance. Alternatively, the insulating film 217 containing hydrogen is formed in contact with the oxide semiconductor film to diffuse hydrogen from the insulating film 217 containing hydrogen to the oxide semiconductor film, so that the oxide semiconductor film can have a high carrier density and a low resistance.

The insulating film 215 is formed over the oxide semiconductor film 223 so that the oxide semiconductor film 223 is not subjected to the above plasma treatment. Since the insulating film 215 is provided, the oxide semiconductor film 223 is not in contact with the insulating film 217 containing hydrogen. The insulating film 215 can be formed using an insulating film capable of releasing oxygen, in which case oxygen can be supplied to the oxide semiconductor film 223. The oxide semiconductor film 223 to which oxygen is supplied is an oxide semiconductor in which oxygen vacancies in the film or at the interface are reduced and which has a high resistance. Note that as the insulating film capable of releasing oxygen, a silicon oxide film or a silicon oxynitride film can be used, for example.

Furthermore, to obtain an oxide semiconductor film having a low resistivity, hydrogen, boron, phosphorus, or nitrogen may be introduced into the oxide semiconductor film by an ion implantation method, an ion doping method, a plasma immersion ion implantation method, or the like.

Furthermore, as the plasma treatment to be performed on the oxide conductor film 227, plasma treatment using a gas containing one of a rare gas (He, Ne, Ar, Kr, or Xe), phosphorus, boron, hydrogen, and nitrogen is typical. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide conductor film 227. This oxygen vacancy can cause carrier generation. Furthermore, when hydrogen is supplied from an insulating film that is in the vicinity of the oxide conductor film 227, specifically, that is in contact with the lower surface or the upper surface of the oxide conductor film 227, and hydrogen enters the oxygen vacancy, an electron serving as a carrier might be generated. Accordingly, the oxide conductor film 227 whose oxygen vacancies are increased by the plasma treatment has a higher carrier density than the oxide semiconductor film 223.

The oxide semiconductor film 223 in which oxygen vacancies are reduced and the hydrogen concentration is reduced can be referred to as a highly purified intrinsic or substantially highly purified intrinsic oxide semiconductor film. The term substantially intrinsic refers to the state where an oxide semiconductor has a carrier density lower than $1\times10^{17}/cm^3$, preferably lower than $1\times10^{15}/cm^3$, further preferably lower than $1\times10^{13}/cm^3$. Furthermore, the state in which an impurity concentration is low and the density of defect states is low (the amount of oxygen vacancies is small) is referred to as highly purified intrinsic or substantially highly purified intrinsic. A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (also referred to as normally-off characteristics.). The highly purified intrinsic or substantially highly purified intrinsic oxide semiconductor film 223 has a low density of defect states and accordingly can have a low density of trap states.

Furthermore, the highly purified intrinsic or substantially highly purified intrinsic oxide semiconductor film 223 has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film 223 has a small variation in electrical characteristics and high reliability.

For example, an insulating film containing hydrogen, that is, an insulating film capable of releasing hydrogen, typically a silicon nitride film, is used as the insulating film 217, whereby hydrogen can be supplied to the oxide conductor film 227. The insulating film capable of releasing hydrogen preferably has a hydrogen concentration of $1\times10^{22}$ atoms/$cm^3$ or higher. Such an insulating film is formed in contact with the oxide conductor film 227, whereby hydrogen can be effectively contained in the oxide conductor film 227. In this manner, the above-described plasma treatment is performed and the structure of the insulating film in contact with the oxide semiconductor film (or the oxide conductor film) is changed, whereby the resistance of the oxide semiconductor film (or the oxide conductor film) can be appropriately adjusted.

Hydrogen included in the oxide conductor film 227 reacts with oxygen bonded to a metal atom to be water, and also causes oxygen vacancies in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the oxide conductor film 227 containing hydrogen has a higher carrier density than the oxide semiconductor film 223.

Hydrogen in the oxide semiconductor film 223 of the transistor in which a channel region is formed is preferably reduced as much as possible. Specifically, in the oxide semiconductor film 223, the hydrogen concentration measured by secondary ion mass spectrometry (SIMS: Secondary Ion Mass Spectrometry) is set to lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than $5\times10^{18}$ atoms/$cm^3$, yet further preferably lower than or equal to $1\times10^{18}$ atoms/$cm^3$, yet still further preferably lower than or equal to $5\times10^{17}$ atoms/$cm^3$, even yet still further preferably lower than or equal to $1\times10^{16}$ atoms/$cm^3$.

On the other hand, the oxide conductor film 227 serving as a gate is a low-resistance oxide conductor film having a high hydrogen concentration and/or a large amount of oxygen vacancies as compared to the oxide semiconductor film 223.

The oxide semiconductor film 223 and the oxide conductor film 227 are typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor film 223 and the oxide conductor film 227 have a light-transmitting property.

Note that in the case where the oxide semiconductor film 223 contains an In-M-Zn oxide, the proportions of In and M when the summation of In and M is assumed to be 100 atomic % are preferably as follows: the proportion of In is greater than 25 atomic % and the proportion of M is less than 75 atomic %, or the proportion of In is greater than or equal to 34 atomic % and the proportion of M is less than 66 atomic %.

The energy gap of the oxide semiconductor film 223 is 2 eV or more, 2.5 eV or more, or 3 eV or more.

The thickness of the oxide semiconductor film 223 can be greater than or equal to 3 nm and less than or equal to 200 nm, greater than or equal to 3 nm and less than or equal to 100 nm, or greater than or equal to 3 nm and less than or equal to 60 nm.

In the case where the oxide semiconductor film 223 contains an In-M-Zn oxide, it is preferable that the atomic ratio of metal elements of a sputtering target used for forming a film of the In-M-Zn oxide satisfy In M and Zn Examples of the atomic ratio of metal elements of such a sputtering target include In:M:Zn=1:1:1, In:M:Zn=1:1:1.2, In:M:Zn=2:1:1.5, In:M:Zn=2:1:2.3, In:M:Zn=2:1:3, InM:

Zn=3:1:2. Note that the atomic ratio of metal elements in the formed oxide semiconductor film 223 varies from the above atomic ratio of metal elements of the sputtering target within a range of plus or minus 40% as an error.

Note that a material that can be used for the oxide conductor film 227 and a method for forming the oxide conductor film 227 can be applied to those for the conductive film 251 and the conductive film 252.

<<Insulating Film>>

An organic insulating material or an inorganic insulating material can be used as an insulating material that can be used for the insulating film, the overcoat, the spacer, or the like included in the liquid crystal display device. Examples of resins include an acrylic resin, an epoxy resin, a polyimide resin, a polyamide resin, a polyimide-amide resin, a siloxane resin, a benzocyclobutene-based resin, and a phenol resin. Examples of an inorganic insulating film include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<<Conductive Film>>

For the conductive film such as the gate, the source, and the drain of a transistor and the wiring, the electrode, and the like of the liquid crystal display device, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film, a two-layer structure in which a titanium film is stacked over a tungsten film, a two-layer structure in which a copper film is stacked over a molybdenum film, a two-layer structure in which a copper film is stacked over an alloy film containing molybdenum and tungsten, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. For example, in the case where the source electrode 225a and the drain electrode 225b have a three-layer structure, it is preferable that a film formed of titanium, titanium nitride, molybdenum, tungsten, an alloy containing molybdenum and tungsten, an alloy containing molybdenum and zirconium, or molybdenum nitride, and that a film formed of a low-resistance material such as copper, aluminum, gold, silver, or an alloy containing copper and manganese be formed as the second layer. Note that a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used.

Note that the conductive film may be formed using the above-described method for controlling the resistivity of an oxide semiconductor.

<<Bonding Layer>>

For the bonding layer 265, a curable resin such as a heat curable resin, a photocurable resin, or a two-component type curable resin can be used. For example, an acrylic resin, polyurethane, an epoxy resin, or a resin having a siloxane bond can be used.

<<Connector>>

As the connector, an anisotropic conductive film (ACF: Anisotropic Conductive Film), an anisotropic conductive paste (ACP: Anisotropic Conductive Paste), or the like can be used, for example.

<<Coloring Film>>

The coloring film is a colored layer that transmits light in a specific wavelength range. Examples of a material that can be used for the coloring film include a metal material, a resin material, and a resin material containing a pigment or dye.

<<Light-Blocking Film>>

The light-blocking film is provided between adjacent coloring films. As the light-blocking film, for example, a black matrix may be formed using a metal material or a resin material containing pigment or dye. Note that it is preferable to provide the light-blocking film also in a region other than the display portion, such as a driver circuit portion, in which case undesired leakage of guided light or the like can be inhibited.

[Touch Panel Module]

Next, a touch panel module including the liquid crystal display device of one embodiment of the present invention and an IC are described with reference to FIG. 22 and FIG. 23.

Figure 22:
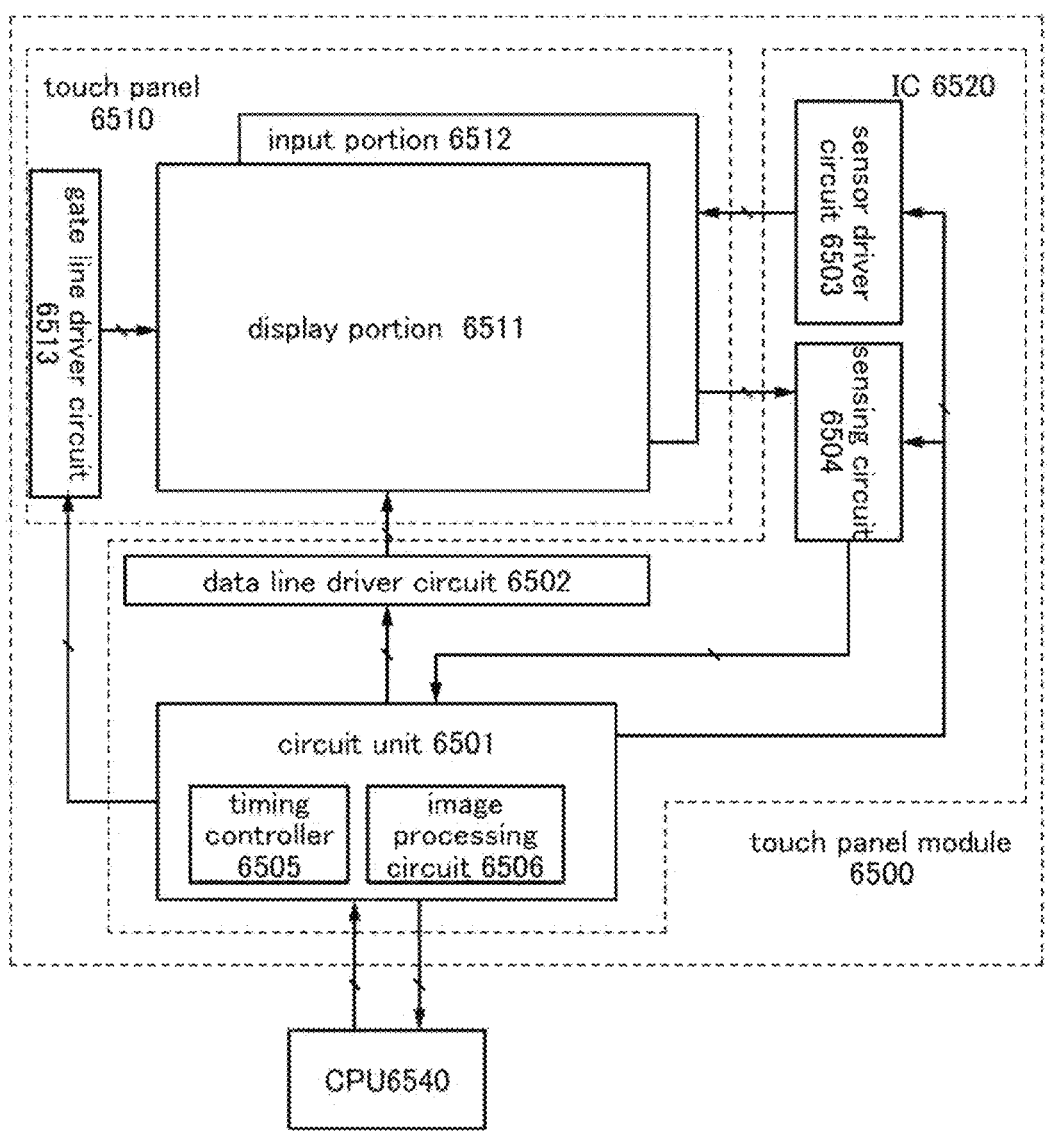
FIG. 22 A block diagram illustrating an example of a touch panel module.

FIG. 22 shows a block diagram of a touch panel module 6500. The touch panel module 6500 includes a touch panel 6510 and an IC 6520. The liquid crystal display device of one embodiment of the present invention can be applied to the touch panel 6510.

The touch panel 6510 includes a display portion 6511, an input portion 6512, and a gate line driver circuit 6513. The display portion 6511 includes a plurality of pixels, a plurality of data lines, and a plurality of gate lines, and has a function of displaying an image. The input portion 6512 serves as a touch sensor by including a plurality of sensor elements that can sense touch or proximity of a sensing target to the touch panel 6510. The gate line driver circuit 6513 has a function of outputting scan signals to the gate lines included in the display portion 6511.

Here, the display portion 6511 and the input portion 6512 are separately illustrated as the components of the touch panel 6510 for simplicity; however, what is called an in-cell touch panel having a function of displaying an image and serving as a touch sensor is preferable. The input/output device of one embodiment of the present invention is an in-cell touch panel and is thus favorable. The liquid crystal display device of one embodiment of the present invention is an in-cell touch panel and is thus favorable.

The resolution of the display portion 6511 is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, resolution of 4K, 8K, or higher is preferable. Furthermore, the pixel density (definition) of the pixels in the display portion 6511 is higher than or equal to 300 ppi, preferably higher than or equal to 500 ppi, more preferably higher than or equal to 800 ppi, more preferably higher than or equal to 1000 ppi, more preferably higher than or equal to 1200 ppi. The display portion 6511 with such high resolution and high definition enables an increase in a realistic sensation, sense of depth, and the like in personal use such as portable use and home use.

The IC 6520 includes a circuit unit 6501, a data line driver circuit 6502, a sensor driver circuit 6503, and a sensing circuit 6504. The circuit unit 6501 includes a timing controller 6505, an image processing circuit 6506, or the like.

The data line driver circuit 6502 has a function of outputting a video signal that is an analog signal to a data line included in the display portion 6511. For example, the data line driver circuit 6502 can include a shift register circuit and a buffer circuit in combination. The touch panel 6510 may include a demultiplexer circuit connected to a signal line.

The sensor driver circuit 6503 has a function of outputting a signal for driving a sensor element included in the input portion 6512. As the sensor driver circuit 6503, a shift register circuit and a buffer circuit can be used in combination, for example.

The sensing circuit 6504 has a function of outputting, to the circuit unit 6501, an output signal from the sensor element included in the input portion 6512. The sensing circuit 6504 can include an amplifier circuit and an analog-digital converter (ADC: Analog-Digital Convertor), for example. In that case, the sensing circuit 6504 converts an analog signal output from the input portion 6512 into a digital signal to be output to the circuit unit 6501.

The image processing circuit 6506 included in the circuit unit 6501 has a function of generating and outputting a signal for driving the display portion 6511 of the touch panel 6510, a function of generating and outputting a signal for driving the input portion 6512, and a function of analyzing a signal output from the input portion 6512 and outputting the signal to a CPU 6540.

As more specific examples, the image processing circuit 6506 has a function of generating a video signal in accordance with an instruction from the CPU 6540. Furthermore, the image processing circuit 6506 has a function of performing signal processing on a video signal in accordance with the specifications of the display portion 6511, converting the signal into an analog video signal, and supplying the analog video signal to the data line driver circuit 6502. Furthermore, the image processing circuit 6506 has a function of generating a driving signal output to the sensor driver circuit 6503 in accordance with an instruction from the CPU 6540. Furthermore, the image processing circuit 6506 has a function of analyzing a signal input from the sensing circuit 6504 and outputting the analyzed signal to the CPU 6540 as positional information.

Furthermore, the timing controller 6505 may have a function of generating a signal (a clock signal or a start pulse signal) on the basis of a synchronization signal included in a video signal or the like on which the image processing circuit 6506 performs processing and outputting the signal to the gate line driver circuit 6513 and the sensor driver circuit 6503. Furthermore, the timing controller 6505 may have a function of generating and outputting a signal for determining the timing when the sensing circuit 6504 outputs a signal. Here, the timing controller 6505 preferably outputs synchronized signals as the signal output to the gate line driver circuit 6513 and the signal output to the sensor driver circuit 6503. In particular, it is preferable that a period in which data in a pixel in the display portion 6511 is rewritten and a period in which sensing is performed with the input portion 6512 be separately provided. For example, the touch panel 6510 can be driven by dividing one frame period into a period in which data in a pixel is rewritten and a period in which sensing is performed. Furthermore, detection sensitivity and detection accuracy can be increased, for example, by providing two or more sensing periods in one frame period.

The image processing circuit 6506 can include a processor, for example. A microprocessor such as a DSP (Digital Signal Processor) or a GPU (Graphics Processing Unit) can be used, for example. Furthermore, such a microprocessor may be obtained with a PLD (Programmable Logic Device) such as an FPGA (Field Programmable Gate Array) or an FPAA (Field Programmable Analog Array). The image processing circuit 6506 interprets and executes instructions from various programs with the processor to process various kinds of data and control programs. The programs executed by the processor may be stored in a memory region included in the processor or a memory device that is additionally provided.

Note that a transistor which includes an oxide semiconductor in a channel formation region and has an extremely low off-state current can be used in the display portion 6511 or the gate line driver circuit 6513 included in the touch panel 6510, the circuit unit 6501, the data line driver circuit 6502, the sensor driver circuit 6503, or the sensing circuit 6504 included in the IC 6520, the CPU 6540 provided outside, or the like. With the use of the transistor having an extremely low off-state current as a switch for holding electric charge (data) which flows into a capacitor serving as a memory element, a long data retention period can be ensured. For example, by utilizing the characteristic for a register or a cache memory of the image processing circuit 6506, normally off computing is achieved where the image processing circuit 6506 operates only when needed and data on the previous processing is stored in the memory element in the rest of time; thus, power consumption of the touch panel module 6500 and an electronic device on which the touch panel module 6500 is mounted can be reduced.

Note that although the structure where the circuit unit 6501 includes the timing controller 6505 and the image processing circuit 6506 is used here, the image processing circuit 6506 itself or a circuit having a function of part of the image processing circuit 6506 may be provided outside. Alternatively, the CPU 6540 may have a function of the image processing circuit 6506 or part thereof. For example, the circuit unit 6501 can include the data line driver circuit 6502, the sensor driver circuit 6503, the sensing circuit 6504, and the timing controller 6505.

Note that although the example where the IC 6520 includes the circuit unit 6501 is shown here, the structure where the circuit unit 6501 is not included in the IC 6520 may be employed. In that case, the IC 6520 can include the data line driver circuit 6502, the sensor driver circuit 6503, and the sensing circuit 6504. For example, in the case where the touch panel module 6500 includes a plurality of ICs, the circuit unit 6501 may be separately provided and a plurality of ICs 6520 without the circuit unit 6501 may be provided, and alternatively, the IC 6520 and an IC including only the data line driver circuit 6502 can be provided in combination.

When an IC has a function of driving the display portion 6511 of the touch panel 6510 and a function of driving the input portion 6512 as described above, the number of ICs mounted on the touch panel module 6500 can be reduced; accordingly, cost can be reduced.

Figure 23A:
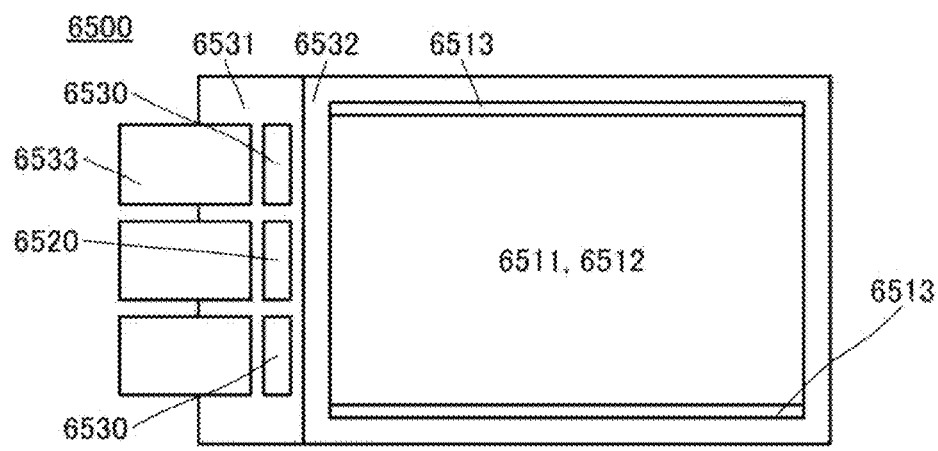
FIG. 23 Diagrams illustrating examples of a touch panel module.

FIGS. 23(A), (B), and (C) each are a schematic diagram of the touch panel module 6500 on which the IC 6520 is mounted.

In FIG. 23(A), the touch panel module 6500 includes a substrate 6531, a counter substrate 6532, a plurality of FPCs 6533, the IC 6520, ICs 6530, and the like. Furthermore, the display portion 6511, the input portion 6512, and the gate line driver circuits 6513 are provided between the substrate 6531 and the counter substrate 6532. The IC 6520 and the ICs 6530 are mounted on the substrate 6531 by a COG method.

The IC 6530 is an IC in which only the data line driver circuit 6502 is provided in the above-described IC 6520 or an IC in which the data line driver circuit 6502 and the circuit unit 6501 are provided in the above-described IC 6520. The IC 6520 and the IC 6530 are supplied with a signal from the outside through the FPCs 6533. Furthermore, a signal can be output to the outside from the IC 6520 or the IC 6530 through the FPC 6533.

FIG. 23(A) illustrates an example where the display portion 6511 is positioned between two gate line driver circuits 6513. The ICs 6530 are provided in addition to the IC 6520. Such a structure is preferable in the case where the display portion 6511 has extremely high resolution.

Figure 23B:
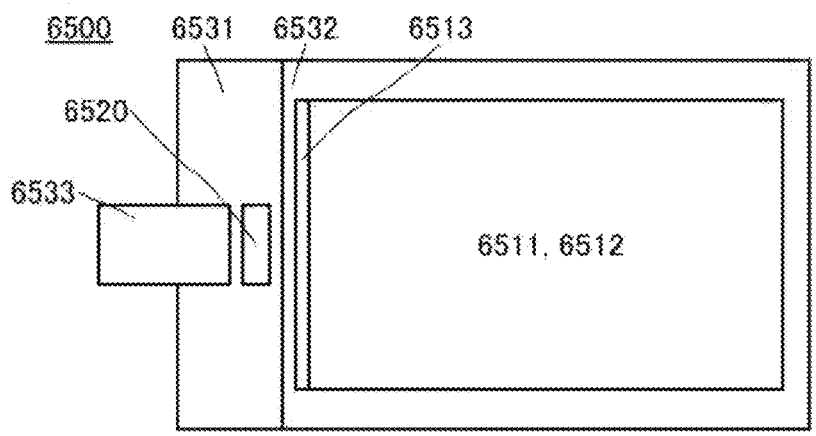

FIG. 23(B) illustrates an example where one IC 6520 and one FPC 6533 are provided. It is preferable to bring functions into one IC 6520 in this manner because the number of components can be reduced. Furthermore, in the example in FIG. 23(B), the gate line driver circuit 6513 is provided along a side close to the FPC 6533 among two short sides of the display portion 6511.

Figure 23C:
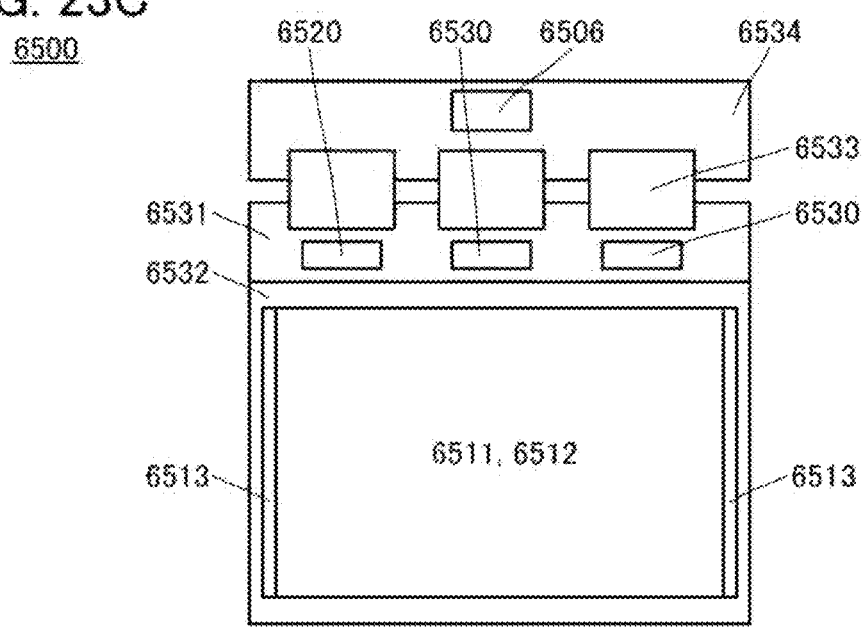

FIG. 23(C) illustrates an example where a PCB (Printed Circuit Board) 6534 on which the image processing circuit 6506 and the like are mounted is provided. The IC 6520 and the IC 6530 that are provided over the substrate 6531 are electrically connected to the PCB 6534 through the FPCs 6533. The above-described structure without the image processing circuit 6506 can be applied to the IC 6520.

Note that in each diagram of FIG. 23, the IC 6520 or the IC 6530 may be mounted on the FPC 6533, not on the substrate 6531. For example, the IC 6520 and the IC 6530 are mounted on the FPC 6533 by a COF method, a TAB method, or the like.

A structure where the FPC 6533, the IC 6520 (and the IC 6530), or the like is provided on a short side of the display portion 6511 as illustrated in FIGS. 23(A) and 23(B) enables the frame of the display device to be narrowed; thus, the structure is preferably used for electronic devices such as smartphones, mobile phones, and tablet terminals, for example. Furthermore, the structure with the PCB 6534 illustrated in FIG. 23(C) can be preferably used for television devices, monitors, tablet terminals, or laptop personal computers, for example.

Embodiment 3

In this embodiment, a manufacturing method of a liquid crystal display device of one embodiment of the present invention will be described with reference to FIG. 24 to FIG. 28. In this embodiment, a manufacturing method of a transistor is mainly described. Note that the description in Embodiment 2 can be referred to for the material of each layer.

First, the gate electrode 221 is formed over the substrate 221. After that, the insulating film 213 including insulating films 106 and 107 is formed over the substrate 211 and the gate electrode 221 (see FIG. 24(A)).

In this embodiment, a glass substrate is used as the substrate 211; a tungsten film is used as the gate electrode 221; a silicon nitride film capable of releasing hydrogen is used as an insulating film 106; and a silicon oxide film capable of releasing oxygen is used as an insulating film 107.

The insulating film 106 functions as a blocking film which keeps out oxygen. For example, in the case where excess oxygen is supplied to at least one of the insulating film 107, the insulating film 215, the insulating film 217, and the oxide semiconductor film 223, the insulating film 106 can inhibit penetration of oxygen.

Note that the insulating film 107 that is in contact with the oxide semiconductor film 223 serving as a channel region of the transistor is preferably an oxide insulating film and preferably includes a region including oxygen in excess of the stoichiometric composition (oxygen-excess region). In other words, the insulating film 107 is an insulating film which is capable of releasing oxygen. Note that in order to provide the oxygen excess region in the insulating film 107, the insulating film 107 is formed in an oxygen atmosphere, for example. Alternatively, the oxygen excess region may be formed by introduction of oxygen into the insulating film 107 after the deposition. Oxygen can be introduced by an ion implantation method, an ion doping method, a plasma immersion ion implantation method, plasma treatment, or the like.

Furthermore, in the case where hafnium oxide is used for one or both of the insulating film 106 and the insulating film 107, the following effect is attained. Hafnium oxide has higher dielectric constant than silicon oxide and silicon oxynitride. Therefore, by using hafnium oxide, the thickness of one or both of the insulating film 106 and the insulating film 107 can be made large as compared with the case where silicon oxide is used; thus, leakage current due to tunnel current can be low. That is, it is possible to provide a transistor with a low off-state current. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

Note that in this embodiment, a silicon nitride film is formed as the insulating film 106, and a silicon oxide film is formed as the insulating film 107. A silicon nitride film has a higher dielectric constant than a silicon oxide film and needs a larger thickness for a capacitance equivalent to that of the silicon oxide film. When a silicon nitride film is included as the insulating film 213 serving as a gate insulating film of the transistor, the physical thickness of the insulating film can be increased. This makes it possible to reduce a decrease in withstand voltage of the transistor and furthermore increase the withstand voltage, thereby reducing electrostatic discharge damage to the transistor.

To form the gate electrode 221, a conductive film is formed over the substrate 211, the conductive film is patterned so that a desired region thereof remains, and unnecessary regions are etched.

Figure 24A:
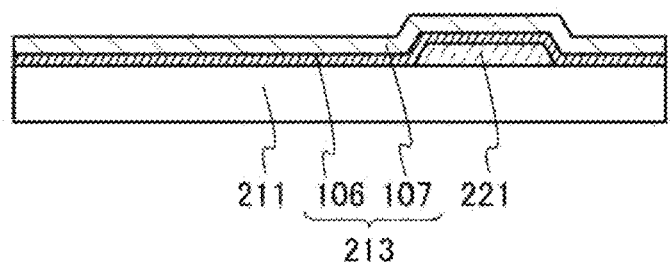
Figure 24B:
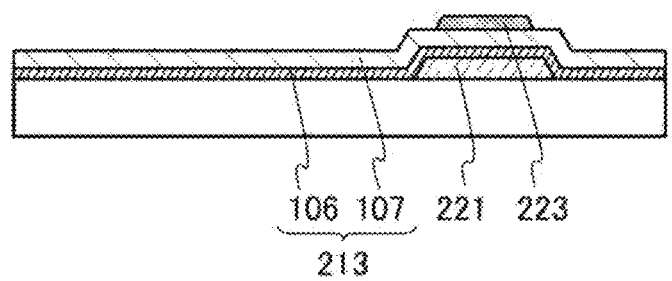

Next, the oxide semiconductor film 223 is formed in a region overlapping with the gate electrode 221 over the insulating film 213 (FIG. 24(B)).

In this embodiment, as the oxide semiconductor film 223, an In—Ga—Zn oxide film (using a metal oxide target with In:Ga:Zn=1:1:1.2.) is used.

Furthermore, the oxide semiconductor film 223 can be formed in such a manner that an oxide semiconductor film is formed over the insulating film 213, the oxide semiconductor film is patterned so that a desired region thereof remains, and then unnecessary regions are etched.

After formation of the oxide semiconductor film 223, heat treatment is preferably performed. The heat treatment is preferably performed at a temperature of higher than or equal to 250° C. and lower than or equal to 650° C., preferably higher than or equal to 300° C. and lower than or equal to 500° C., more preferably higher than or equal to 350° C. and lower than or equal to 450° C., in an inert gas atmosphere, an atmosphere containing an oxidizing gas at 10 ppm or more, or a reduced pressure atmosphere. Alternatively, the heat treatment may be performed first in an inert gas atmosphere, and then another heat treatment is performed in an atmosphere containing an oxidizing gas at 10 ppm or more in order to compensate for oxygen released from the oxide semiconductor film 223. By this heat treatment, impurities such as hydrogen and water can be removed from at least one of the insulating film 106, the insulating film 107, and the oxide semiconductor film 223. Note that the above-described heat treatment may be performed before the oxide semiconductor film 223 is processed into an island shape.

Note that stable electrical characteristics can be effectively imparted to the transistor in which the oxide semiconductor film 223 serves as a channel region by reducing the concentration of impurities in the oxide semiconductor film 223 to make the oxide semiconductor film 223 intrinsic or substantially intrinsic.

Figure 24C:
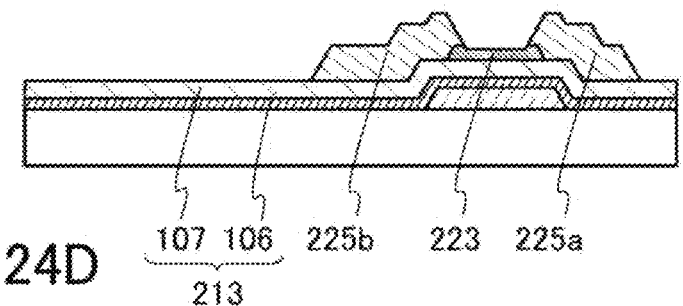
Figure 24D:
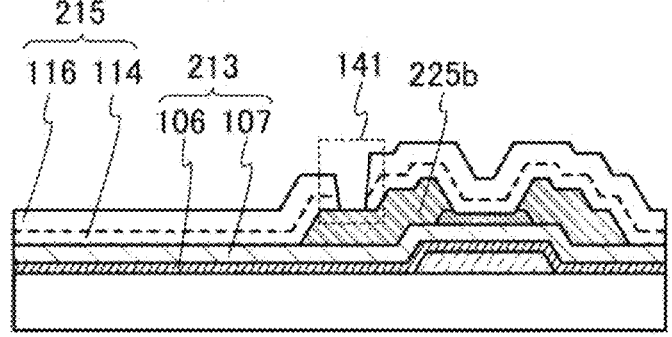

Next, a conductive film is formed over the insulating film 213 and the oxide semiconductor film 223 and is patterned so that a desired region thereof remains and unnecessary regions are etched, whereby the source electrode 225a and the drain electrode 225b are formed over the insulating film 213 and the oxide semiconductor film 223 (see FIG. 24(C)).

In this embodiment, a three-layered structure including a tungsten film, an aluminum film, and a titanium film can be used for the source electrode 225a and the drain electrode 225b.

Furthermore, after the source electrode 225a and the drain electrode 225b are formed, a surface of the oxide semiconductor film 223 may be cleaned. The cleaning may be performed, for example, using a chemical solution such as phosphoric acid. The cleaning using a chemical solution such as a phosphoric acid can remove impurities (for example, elements contained in the source electrode 225a and the drain electrode 225b) attached to the surface of the oxide semiconductor film 223. Note that the cleaning is not necessarily performed, and thus the cleaning may be unnecessary.

In addition, in the step of forming the source electrode 225a and the drain electrode 225b and/or the cleaning step, the thickness of a region of the oxide semiconductor film 223 that is not covered by the source electrode 225a and the drain electrode 225b might be reduced.

Next, the insulating film 215 including insulating films 114 and 116 is formed over the insulating film 213, the oxide semiconductor film 223, the source electrode 225a, and the drain electrode 225b. Then, the insulating film 215 is patterned so that a desired region thereof remains and unnecessary regions are etched, whereby an opening 141 is formed (see FIG. 24(D)).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the oxide semiconductor film 223; accordingly, the number of oxygen vacancies in the oxide semiconductor film 223 can be reduced.

Note that the insulating film 114 serves as a protective film for the oxide semiconductor film 223 in the step of forming the insulating film 116. Consequently, the insulating film 116 can be formed using the high-frequency power having a high power density while damage to the oxide semiconductor film 223 is reduced.

In this embodiment, a silicon oxynitride film capable of releasing oxygen is used as the insulating films 114 and 116.

Note that the insulating film 114 that is in contact with the oxide semiconductor film 223 serving as a channel region of the transistor is preferably an oxide insulating film capable of releasing oxygen. In other words, the insulating film capable of releasing oxygen is an insulating film that includes a region containing oxygen in excess of that in the stoichiometric composition (oxygen-excess region). Note that in order to provide the oxygen-excess region in the insulating film 114, the insulating film 114 can be formed in an oxygen atmosphere, for example. Alternatively, the oxygen-excess region may be formed by supplying oxygen to the formed insulating film 114. Furthermore, as a method for supplying oxygen, an ion implantation method, an ion doping method, a plasma immersion ion implantation method, plasma treatment, or the like can be employed.

The use of the insulating film capable of releasing oxygen as the insulating film 114 can reduce the number of oxygen vacancies in the oxide semiconductor film 223 by transferring oxygen to the oxide semiconductor film 223 serving as the channel region of the transistor. For example, the number of oxygen vacancies in the oxide semiconductor film 223 can be reduced by using an insulating film having the following feature: the number of oxygen molecules released from the insulating film by heat treatment at a temperature higher than or equal to 100° C. and lower than or equal to 700° C., or higher than or equal to 100° C. and lower than or equal to 500° C. is greater than or equal to $1.0 \times 10^{18}$ molecules/cm$^3$ when measured by thermal desorption spectroscopy analysis (hereinafter referred to as TDS analysis).

Furthermore, it is preferable that the number of defects in the insulating film 114 be small, typically the spin density corresponding to a signal that appears at g=2.001 due to a dangling bond of silicon be lower than or equal to $3 \times 10^{17}$ spins/cm$^3$ by ESR measurement. This is because if the density of defects in the insulating film 114 is high, oxygen is bonded to the defects and the amount of oxygen that permeates the insulating film 114 is decreased. Furthermore, it is preferable that the amount of defects at the interface between the insulating film 114 and the oxide semiconductor film 223 be small and typically, the spin density of a signal that appears at g=1.89 or more and 1.96 or less due to the defect in the oxide semiconductor film 223 be lower than or equal to $1 \times 10^{17}$ spins/cm$^3$, more preferably lower than or equal to the lower limit of detection by ESR measurement.

Note that all oxygen entering the insulating film 114 from the outside moves to the outside of the insulating film 114 in some cases. Alternatively, some oxygen entering the insulating film 114 from the outside remains in the insulating film 114 in some cases. Furthermore, movement of oxygen occurs in the insulating film 114 in some cases in such a manner that oxygen enters the insulating film 114 from the outside and oxygen contained in the insulating film 114 moves to the outside of the insulating film 114. When an oxide insulating film that is permeable to oxygen is formed as the insulating film 114, oxygen released from the insulating film 116 provided over the insulating film 114 can be moved to the oxide semiconductor film 223 through the insulating film 114.

Furthermore, the insulating film 114 can be formed using an oxide insulating film having a low density of states due to nitrogen oxide. Note that the density of states due to nitrogen oxide can be formed between the energy of the valence band maximum ($E_{v\_os}$) of the oxide semiconductor film and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1\times10^{18}$ molecules/cm$^3$ and less than or equal to $5\times10^{19}$ molecules/cm$^3$. Note that the amount of released ammonia corresponds to the released amount caused by heat treatment at a film surface temperature higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The levels are positioned in the energy gap of the oxide semiconductor film 223. Therefore, when nitrogen oxide is diffused to the interface between the insulating film 114 and the oxide semiconductor film 223, an electron is trapped by the level on the insulating film 114 side. As a result, the trapped electron remains in the vicinity of the interface between the insulating film 114 and the oxide semiconductor film 223; thus, the threshold voltage of the transistor is shifted in the positive direction.

Furthermore, nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the interface between the insulating film 114 and the oxide semiconductor film 223.

In a transistor using the oxide insulating film as the insulating film 114, the shift in threshold voltage can be reduced, which leads to a smaller change in electrical characteristics of the transistor.

Note that in an ESR spectrum obtained at 100 K or lower of the insulating film 114, by heat treatment in a manufacturing process of the transistor, typically heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor greater than or equal to 1.964 and less than or equal to 1.966 are observed. Note that the split width of the first and second signals and the split width of the second and third signals, which are obtained by ESR measurement using an X-band, are each approximately 5 mT. Furthermore, the sum of the spin densities of the first signal that appears at a g-factor of greater than or equal to 2.037 and less than or equal to 2.039, the second signal that appears at a g-factor greater than or equal to 2.001 and less than or equal to 2.003, and the third signal that appears at a g-factor of greater than or equal to 1.964 and less than or equal to 1.966 is less than $1\times10^{18}$ spins/cm$^3$, typically greater than or equal to $1\times10^{17}$ spins/cm$^3$ and less than $1\times10^{18}$ spins/cm$^3$.

Note that in the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

Furthermore, the nitrogen concentration of the oxide insulating film measured by SIMS is lower than or equal to $6\times10^{20}$ atoms/cm$^3$.

The oxide insulating film is formed by a PECVD method at a substrate temperature higher than or equal to 220° C. and lower than or equal to 350° C. using silane and dinitrogen monoxide, whereby a dense and hard film can be formed.

The insulating film 116 in contact with the insulating film 114 is formed using an oxide insulating film whose oxygen content is in excess of that in the stoichiometric composition. Part of oxygen is released from the oxide insulating film whose oxygen content is in excess of that in the stoichiometric composition by heating. The oxide insulating film whose oxygen content is in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS (TDS: Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 500° C.

Furthermore, it is preferable that the amount of defects in the insulating film 116 be small, typically the spin density of a signal that appears at g=2.001 due to a dangling bond of silicon be less than $1.5\times10^{18}$ spins/cm$^3$, preferably less than or equal to $1\times10^{18}$ spins/cm$^3$ by ESR measurement. Note that the insulating film 116 is provided more apart from the oxide semiconductor film 223 than the insulating film 114 is; thus, the insulating film 116 may have higher defect density than the insulating film 114.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Note that although a two-layer structure of the insulating films 114 and 116 is described in this embodiment, the present invention is not limited to this. For example, a single-layer structure of the insulating film 114, a single-layer structure of the insulating film 116, or a stacked-layer structure of three or more layers may be used.

Furthermore, heat treatment (hereinafter referred to as first heat treatment) is preferably performed after the insulating films 114 and 116 are formed. The first heat treatment can reduce nitrogen oxide included in the insulating films 114 and 116. Furthermore, by the first heat treatment, part of oxygen included in the insulating films 114 and 116 can be moved to the oxide semiconductor film 223, so that the number of oxygen vacancies included in the oxide semiconductor film 223 can be reduced.

The temperature of the first heat treatment is typically lower than 400° C., preferably lower than 375° C., further preferably higher than or equal to 150° C. and lower than or equal to 350° C. The first heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). Note that the atmosphere of nitrogen, oxygen, ultra-dry air, or a rare gas preferably does not contain hydrogen, water, and the like. Note that an electric furnace, an RTA (Rapid Thermal Anneal) apparatus, or the like can be used for the heat treatment.

The opening 141 is formed to expose part of the drain electrode 225b. The opening 141 can be formed by a dry etching method, for example. Alternatively, a wet etching method or a combination of dry etching and wet etching can be employed for formation of the opening 141. Note that the etching step of forming the opening 141 can reduce the thickness of the drain electrode 225b in some cases.

Figure 25A:
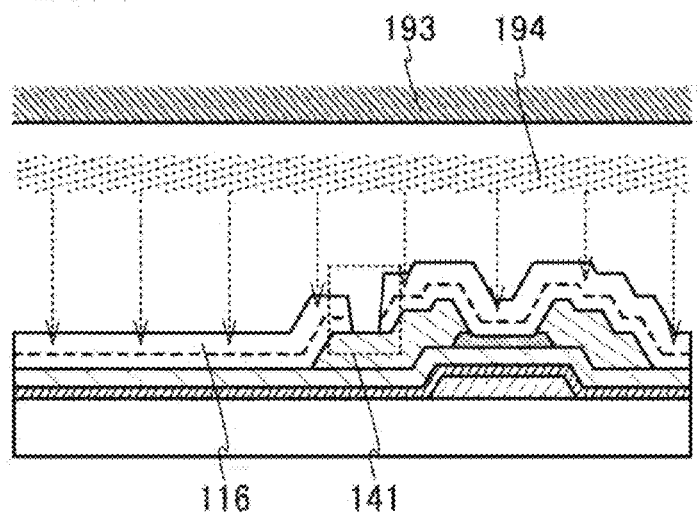
Figure 25B:
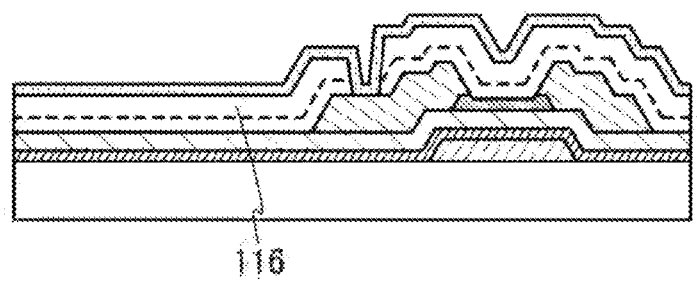

Next, an oxide semiconductor film to be the oxide conductor film 227 is formed over the insulating film 116 to cover the opening 141 (FIGS. 25(A) and (B)).

Note that FIG. 25(A) is a schematic cross-sectional view of the inside of a deposition apparatus when the oxide semiconductor film is formed over the insulating film 116. In FIG. 25(A), a sputtering apparatus is used as the deposition apparatus, and a target 193 placed inside the sputtering apparatus and plasma 194 formed under the target 193 are schematically shown.

First, when the oxide semiconductor film is formed, plasma discharge is performed in an atmosphere containing an oxygen gas. At this time, oxygen is added to the insulating film 116 over which the oxide semiconductor film is to be formed. When the oxide semiconductor film is formed, an inert gas (for example, a helium gas, an argon gas, or a xenon gas) and the oxygen gas may be mixed. For example, it is preferable to use the argon gas and the oxygen gas with the flow rate higher than the flow rate of the argon gas. When the flow rate of the oxygen gas is set higher, oxygen can be favorably added to the insulating film 116. As an example of the formation conditions of the oxide semiconductor film, the proportion of the oxygen gas in a whole deposition gas is higher than or equal to 50% and lower than or equal to 100%, preferably higher than or equal to 80% and lower than or equal to 100%.

Note that in FIG. 25(A), oxygen or excess oxygen added to the insulating film 116 is schematically shown by arrows of broken lines.

Furthermore, the oxide semiconductor film is formed at a substrate temperature higher than or equal to room temperature and lower than 340° C., preferably higher than or equal to room temperature and lower than or equal to 300° C., further preferably higher than or equal to 100° C. and lower than or equal to 250° C., still further preferably higher than or equal to 100° C. and lower than or equal to 200° C. The oxide semiconductor film is formed while being heated, so that the crystallinity of the oxide semiconductor film can be increased. On the other hand, in the case where a large-sized glass substrate (for example, the 6th generation to the 10th generation) is used as the substrate 211 and the oxide semiconductor film is formed at a substrate temperature higher than or equal to 150° C. and lower than 340° C., the substrate 211 might be changed in shape (distorted or warped). In the case where a large-sized glass substrate is used, the change in the shape of the glass substrate can be suppressed by forming the oxide semiconductor film at a substrate temperature higher than or equal to 100° C. and lower than 150° C.

In this embodiment, the oxide semiconductor film is formed by a sputtering method using an In—Ga—Zn metal oxide target (satisfying In:Ga:Zn=1:3:6 [atomic ratio]).

Figure 25C:
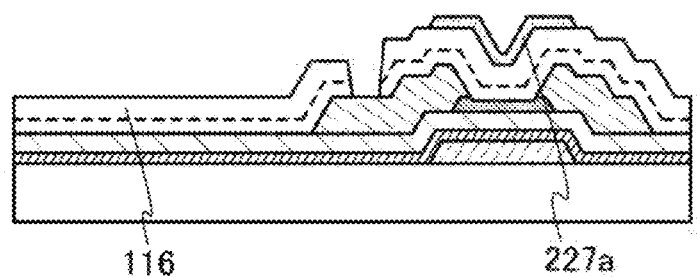

Next, the oxide semiconductor film is processed into a desired shape to form an island-shaped oxide semiconductor film 227a (see FIG. 25(C)).

The oxide semiconductor film 227a can be formed in such a manner that an oxide semiconductor film is formed over the insulating film 116, the oxide semiconductor film is patterned so that a desired region thereof remains, and then unnecessary regions are etched.

Figure 26A:
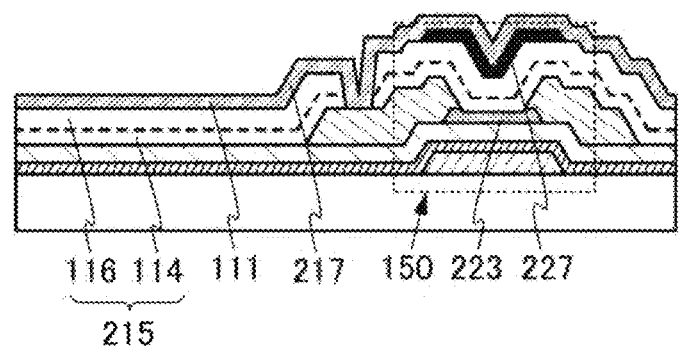

Next, the insulating film 217 is formed over the insulating film 116 and the oxide semiconductor film 227a (see FIG. 26(A)).

The insulating film 217 has a function of blocking oxygen, hydrogen, water, alkali metal, alkaline earth metal, or the like. With the insulating film 217, diffusion of oxygen from the oxide semiconductor film 223 to the outside, diffusion of oxygen contained in the insulating film 215 to the outside, and entry of hydrogen, water, alkali metal, alkaline earth metal, or the like from the outside into the oxide semiconductor film 223 can be prevented.

The insulating film 217 preferably contains one or both of hydrogen and nitrogen. As the insulating film 217, a silicon nitride film is preferably used, for example. The insulating film 217 can be formed by a sputtering method or a PECVD method, for example. In the case where the insulating film 217 is formed by a PECVD method, for example, the substrate temperature is lower than 400° C., preferably lower than 375° C., further preferably higher than or equal to 180° C. and lower than or equal to 350° C. The substrate temperature at which the insulating film 217 is formed is preferably within the above range because a dense film can be formed. Furthermore, when the substrate temperature at which the insulating film 217 is formed is within the above range, oxygen or excess oxygen in the insulating films 114 and 116 can be moved to the oxide semiconductor film 223.

Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. The oxide insulating film having a blocking effect against oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

Furthermore, after the insulating film 217 is formed, heat treatment similar to the first heat treatment (hereinafter referred to as second heat treatment) may be performed.

Through such heat treatment at lower than 400° C., preferably lower than 375° C., further preferably higher than or equal to 180° C. and lower than or equal to 350° C. after the addition of oxygen to the insulating film 116 when the oxide semiconductor film to be the oxide conductor film 227 is formed, oxygen or excess oxygen in the insulating film 116 can be moved into the oxide semiconductor film 223 and compensate for oxygen vacancies in the oxide semiconductor film 223.

Figure 27:
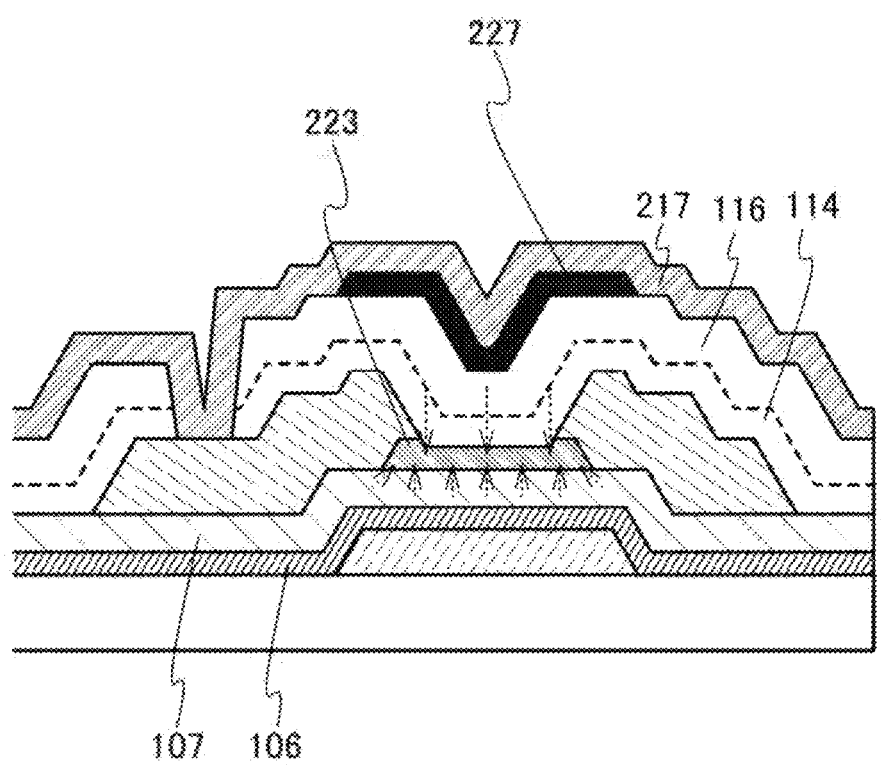

Oxygen moved to the oxide semiconductor film 223 is described with reference to FIG. 27. FIG. 27 are model diagrams illustrating oxygen moved to the oxide semiconductor film 223 due to the substrate temperature at the time of forming the insulating film 217 (typically, lower than 375° C.) or the second heat treatment after the formation of the insulating film 217 (typically, lower than 375° C.). In FIG. 27, oxygen (oxygen radicals, oxygen atoms, or oxygen molecules) moved to the oxide semiconductor film 223 is shown by arrows of broken lines. Note that FIG. 27 is a cross-sectional view of the transistor after the insulating film 217 is formed and its periphery.

In the oxide semiconductor film 223 in FIG. 27, oxygen vacancies are compensated with oxygen moved from films in contact with the oxide semiconductor film 223 (here, the insulating film 107 and the insulating film 114). Specifically, in the liquid crystal display device of one embodiment of the present invention, the insulating film 107 includes an excess oxygen region because an oxygen gas is used at the time of forming the oxide semiconductor film to be the oxide semiconductor film 223 by sputtering and oxygen is added to the insulating film 107. Furthermore, the insulating film 116 includes an excess oxygen region because an oxygen gas is used at the time of forming the oxide semiconductor film to be the oxide conductor film 227 by sputtering and oxygen is added to the insulating film 116. In the oxide semiconductor film 223 between the insulating films including the excess oxygen regions, oxygen vacancies can be favorably compensated.

Furthermore, the insulating film 106 is provided under the insulating film 107, and the insulating film 217 is provided over the insulating films 114 and 116. When the insulating films 106 and 217 are formed using a material having low oxygen permeability, for example, silicon nitride, oxygen contained in the insulating films 107, 114, and 116 can be confined to the oxide semiconductor film 223 side; thus, oxygen can be favorably moved to the oxide semiconductor film 223.

The insulating film 217 preferably has a function of lowering the resistivity of the oxide conductor film 227.

With the insulating film 217 containing one or both of hydrogen and nitrogen, one or both of hydrogen and nitrogen is added to the oxide semiconductor film 227a in contact with the insulating film 217. Accordingly, the carrier density of the oxide semiconductor film 227a is increased, and the oxide semiconductor film 227a can serve as an oxide conductor film.

Note that the oxide semiconductor film 227a with decreased resistivity is illustrated as the oxide conductor film 227 after FIG. 26(A).

The resistivity of the oxide conductor film 227 is lower than at least the resistivity of the oxide semiconductor film 223 and is preferably higher than or equal to $1 \times 10^{-3}$ Ωcm and lower than $1 \times 10^4$ Ωcm, further preferably higher than or equal to $1 \times 10^{-3}$ Ωcm and lower than $1 \times 10^{-1}$ Ωcm.

Figure 26B:
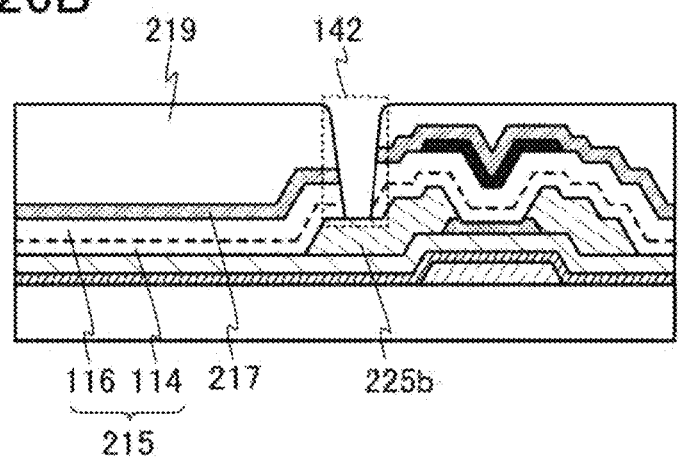

Then, an opening 142 is formed as follows: the insulating film 219 is formed over the insulating film 217, the insulating films 217 and 219 are patterned so that a desired region thereof remains, and unnecessary regions are etched (see FIG. 26(B)).

In this embodiment, an acrylic resin is used for the insulating film 219.

The opening 142 is formed to expose the drain electrode 225b. The opening 142 can be formed by a dry etching method, for example. Alternatively, a wet etching method or a combination of dry etching and wet etching can be employed for formation of the opening 142. Note that the etching step of forming the opening 142 can reduce the thickness of the drain electrode 225b in some cases.

Note that the opening may be formed in the insulating films 114, 116, 217, and 219 at one time in the step of forming the opening 142 without performing the step of forming the opening 141. In that case, the number of steps of manufacturing the liquid crystal display device of one embodiment of the present invention can be reduced, resulting in a reduction in the manufacturing cost.

Then, a conductive film is formed over the insulating film 219 to cover the opening 142 and is patterned so that a desired region thereof remains, and unnecessary regions are etched; thus, the conductive film 251 is formed. Furthermore, the insulating film 253 is formed over the conductive film 251. Then, a conductive film is formed over the insulating film 253 and is patterned so that a desired region of the conductive film remains, and an unnecessary region is etched; thus, the conductive film 255 is formed. After that, a conductive film is formed over the insulating film 253 and the conductive film 255 and is patterned so that a desired region of the conductive film remains, and then, an unnecessary region is etched to form the conductive film 252 (see FIG. 26(C)).

In this embodiment, ITO films are used as the conductive films 251 and 252, a silicon nitride film is used as the insulating film 253, an alloy film of silver, palladium, and copper (also referred to as Ag—Pd—Cu or APC) is used as the conductive film 255.

The formation order of the conductive films 252 and 255 is not limited; however, the conductive film 255 is preferably formed before the conductive film 252. In such a case, damage to the conductive film 252 caused by etching of the conductive film 255 can be reduced, for example.

Note that the conductive film 251 may be formed using an oxide semiconductor film by a method similar to that of the oxide conductor film 227. In this case, the insulating film 253 over the conductive film 251 can be formed using a material that can be used for the insulating film 217. Furthermore, the conductive film 252 may be formed by forming an oxide semiconductor film and performing treatment for lowering the resistivity of the oxide semiconductor film.

Through the above steps, the transistor 203a and the pair of electrodes of the liquid crystal element illustrated in FIG. 18(B) can be formed.

Figure 26C:
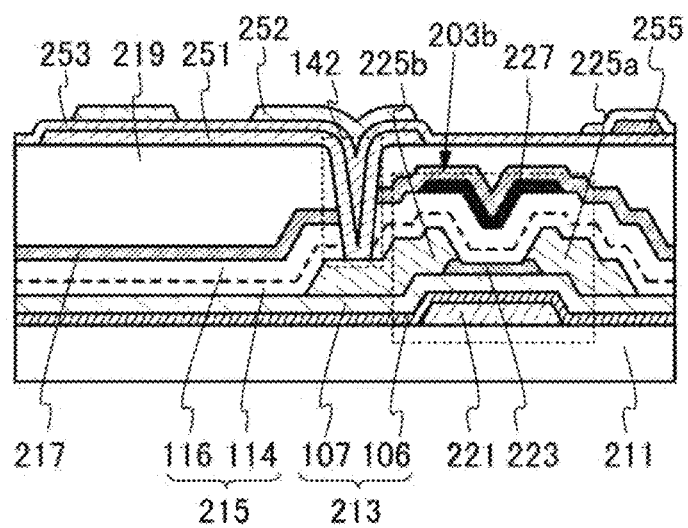
Figure 28:
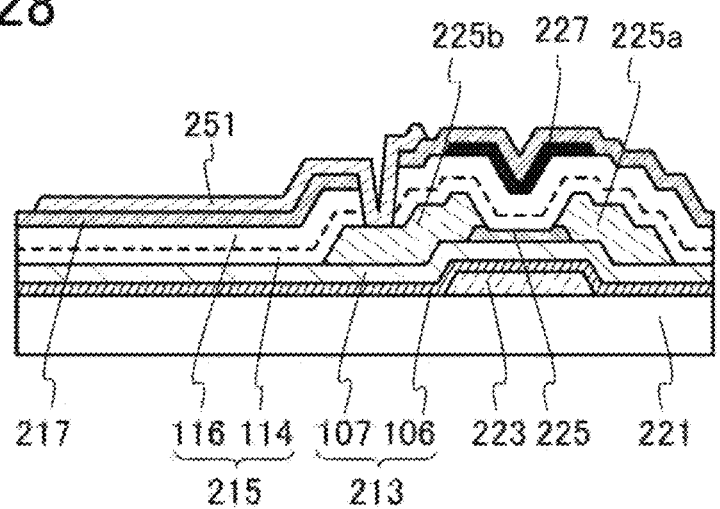
FIG. 28 A cross-sectional view illustrating an example of a transistor.

Note that although the structure with the insulating film 219 is shown in FIG. 26(C), a structure without the insulating film 219 may be employed (see FIG. 28).

Embodiment 4

In this embodiment, a transistor that can be used for the liquid crystal display device of one embodiment of the present invention is described with reference to FIG. 29 to FIG. 32. Note that the description in Embodiment 2 can be referred to for the material of each layer.

Structure Example 1 of Transistor

Figure 29A:
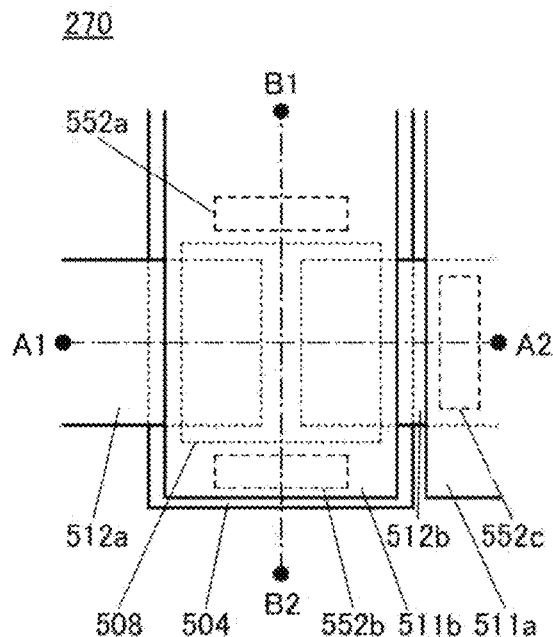
FIG. 29 A top view and cross-sectional views illustrating an example of a transistor.
Figure 29B:
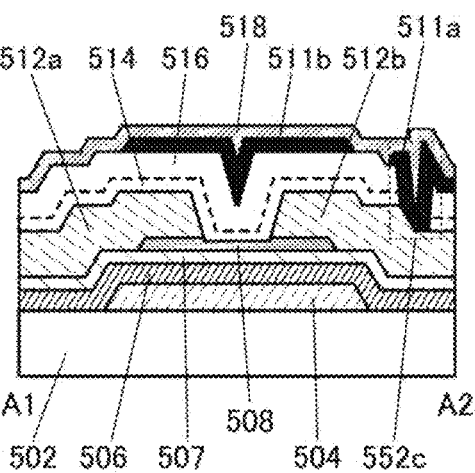
Figure 29C:
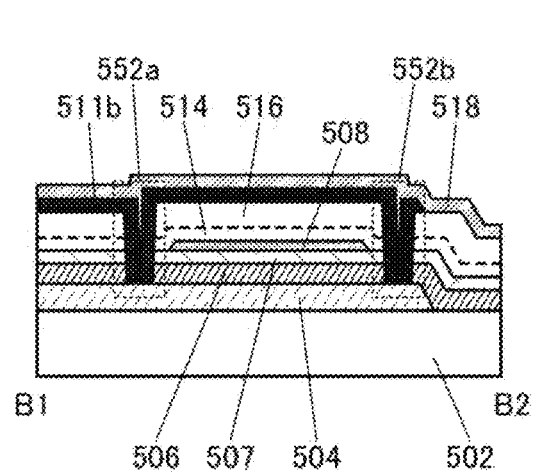

FIG. 29(A) is a top view of a transistor 270. FIG. 29(B) is a cross-sectional view taken along the dashed-dotted line A1-A2 in FIG. 29(A), and FIG. 29(C) is a cross-sectional view taken along the dashed-dotted line B1-B2 in FIG. 29(A). Note that the direction of the dashed dotted line A1-A2 may be called the channel length direction, and the direction of the dashed dotted line B1-B2 may be called the channel width direction.

The transistor 270 includes a conductive film 504 serving as a first gate electrode over a substrate 502, an insulating film 506 over the substrate 502 and the conductive film 504, an insulating film 507 over the insulating film 506, an oxide semiconductor film 508 over the insulating film 507, a conductive film 512a serving as a source electrode electrically connected to the oxide semiconductor film 508, a conductive film 512b serving as a drain electrode electrically connected to the oxide semiconductor film 508, insulating films 514 and 516 over the oxide semiconductor film 508 and the conductive films 512a and 512b, and an oxide conductor film 511b over the insulating film 516. In addition, an insulating film 518 is provided over the oxide conductor film 511b.

In the transistor 270, the insulating film 514 and the insulating film 516 serve as a second gate insulating film of the transistor 270. Furthermore, an oxide semiconductor film 511a is connected to the conductive film 512b through an opening 552c provided in the insulating films 514 and 516. The oxide semiconductor film 511a serves as, for example, a pixel electrode of a display element. Furthermore, the oxide conductor film 511b in the transistor 270 serves as a second gate electrode (also referred to as a back gate electrode).

Furthermore, as illustrated in FIG. 29(C), the oxide conductor film 511b is connected to the conductive film 504 serving as a first gate electrode through opening portions 552a and 552b provided in the insulating films 506, 507, 514, and 516. Accordingly, the oxide conductor film 504 and the oxide conductor film 511b are supplied with the same potential.

Note that although the structure in which the opening portions 552a and 552b are provided so that the oxide conductor film 511b and the conductive film 504 are connected to each other is described in this embodiment, one embodiment of the present invention is not limited thereto. For example, a structure in which only one of the opening portion 552a and the opening portion 552b is provided so that the oxide conductor film 511b and the conductive film 504 are connected to each other, or a structure in which the opening portion 552a and the opening portion 552b are not provided and the oxide conductor film 511b and the conductive film 504 are not connected to each other may be employed. Note that in the case where the oxide conductor film 511b and the conductive film 504 are not connected to each other, it is possible to apply different potentials to the oxide conductor film 511b and the conductive film 504.

As illustrated in FIG. 29(B), the oxide semiconductor film 508 is positioned to face each of the conductive film 504 serving as a first gate electrode and the oxide conductor film 511b serving as a second gate electrode, and is sandwiched between the two conductive films serving as gate electrodes. The length in the channel length direction and the length in the channel width direction of the oxide conductor film 511b serving as a second gate electrode are longer than that in the channel length direction and that in the channel width direction of the oxide semiconductor film 508, respectively. The whole oxide semiconductor film 508 is covered with the oxide conductor film 511b with the insulating film 514 and the insulating film 516 that are positioned therebetween. Furthermore, since the oxide conductor film 511b serving as a second gate electrode is connected to the conductive film 504 serving as a first gate electrode through the opening portions 552a and 552b provided in the insulating films 506, 507, 514, and 516, a side surface of the oxide semiconductor film 508 in the channel width direction faces the oxide conductor film 511b serving as a second gate electrode with the insulating film 514 and the insulating film 516 that are positioned therebetween.

In other words, in the channel width direction of the transistor 270, the conductive film 504 serving as a first gate electrode and the oxide conductor film 511b serving as a second gate electrode are connected to each other through the opening portions provided in the insulating films 506 and 507 serving as gate insulating films and the insulating films 514 and 516 serving as second gate insulating films; and the conductive film 504 and the oxide conductor film 511b surround the oxide semiconductor film 508 with the insulating films 506 and 507 serving as the gate insulating films and the insulating films 514 and 516 serving as the second gate insulating films positioned therebetween.

Such a structure enables the oxide semiconductor film 508 included in the transistor 270 to be electrically surrounded by electric fields of the conductive film 504 serving as a first gate electrode and the oxide conductor film 511b serving as a second gate electrode. A device structure of a transistor, like that of the transistor 270, in which electric fields of a first gate electrode and a second gate electrode electrically surround an oxide semiconductor film where a channel region is formed, can be referred to as a surrounded channel (s-channel) structure.

Since the transistor 270 has the s-channel structure, an electric field for inducing a channel can be effectively applied to the oxide semiconductor film 508 by the conductive film 504 serving as a first gate electrode; therefore, the current drive capability of the transistor 270 can be improved and high on-state current characteristics can be obtained. Furthermore, since the on-state current can be increased, it is possible to reduce the size of the transistor 270. In addition, since the transistor 270 is surrounded by the conductive film 504 serving as a first gate electrode and the oxide conductor film 511b serving as a second gate electrode, the mechanical strength of the transistor 270 can be increased.

Structure Example 2 of Transistor

Figure 30A:
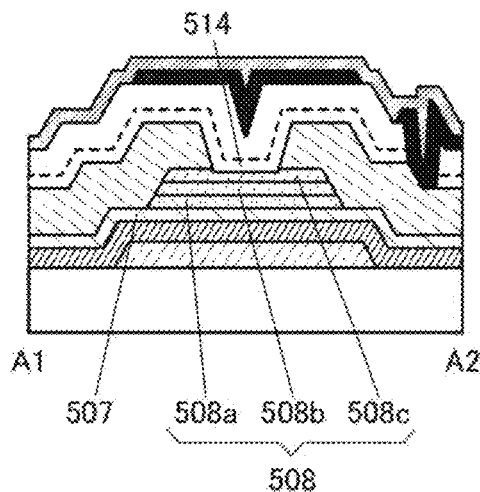
FIG. 30 Cross-sectional views illustrating examples of transistors.
Figure 30B:
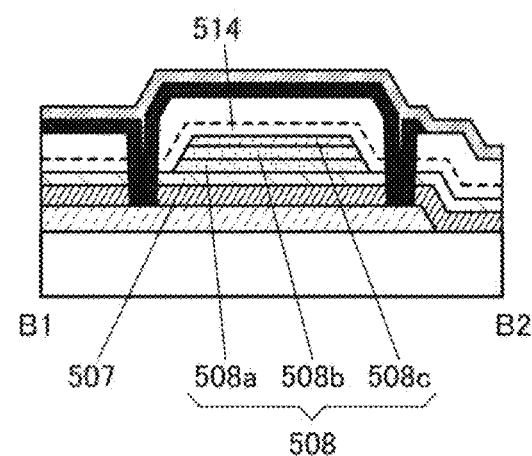

FIGS. 30(A) and (B) illustrate a cross-sectional view illustrating a modification example of the transistor 270 in FIGS. 29(B) and (C). Furthermore, FIGS. 30(C) and (D) illustrate a cross-sectional view illustrating a modification example of the transistor 270 in FIGS. 29(B) and 29(C).

A transistor 270A in FIGS. 30(A) and (B) is different from the transistor 270 in FIGS. 29(B) and (C) in that the oxide semiconductor film 508 has a three-layer structure. Specifically, the oxide semiconductor film 508 of the transistor 270A includes an oxide semiconductor film 508a, an oxide semiconductor film 508b, and an oxide semiconductor film 508c.

Figure 30C:
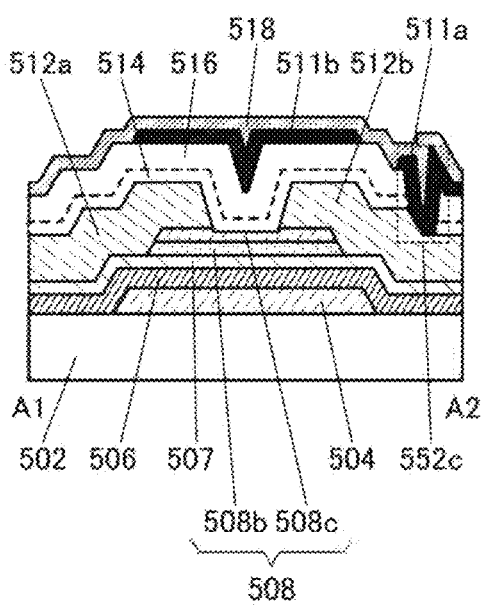
Figure 30D:
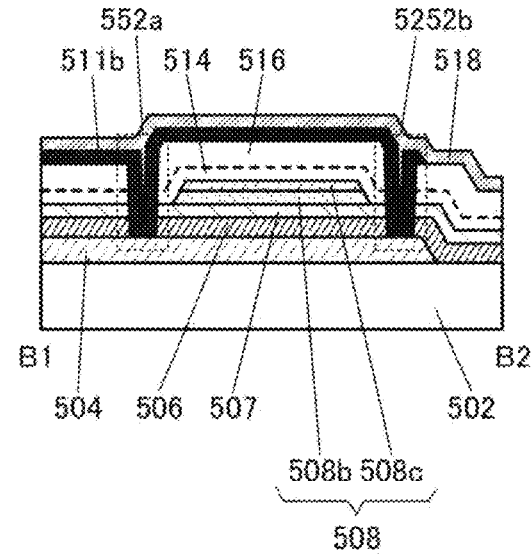

A transistor 270B in FIGS. 30(C) and (D) has the same structure as the transistor 270 in FIGS. 29(B) and (C) except that the oxide semiconductor film 508 has a two-layer structure. Specifically, the oxide semiconductor film 508 of the transistor 270B includes the oxide semiconductor film 508b and the oxide semiconductor film 508c.

Here, a band structure including the oxide semiconductor film 508 and insulating films in contact with the oxide semiconductor film 508 is described with reference to FIG. 31.

Figure 31A:
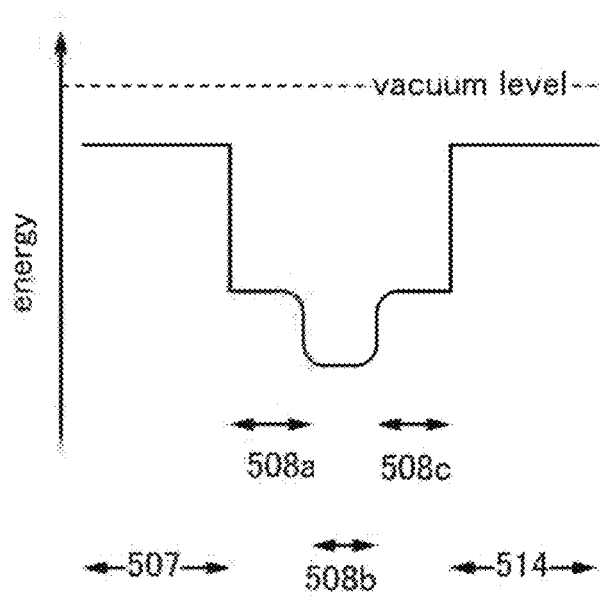
FIG. 31 Diagrams each illustrating a band structure.
Figure 31B:
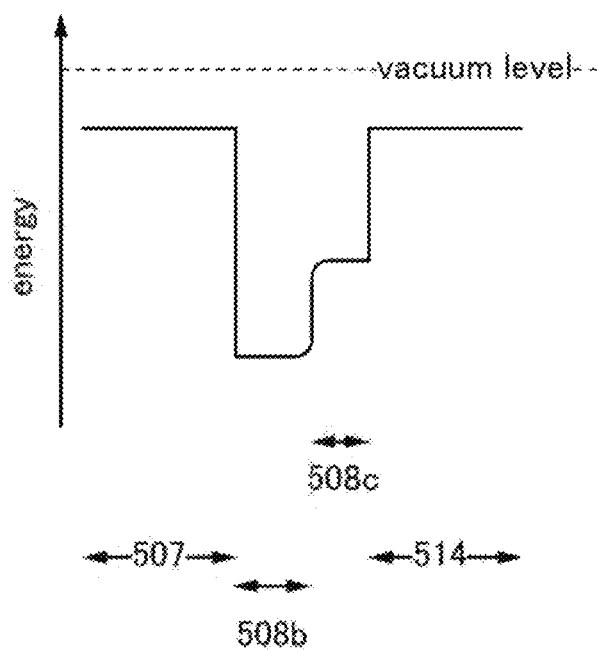

FIG. 31(A) shows an example of a band structure in the thickness direction of a layered structure including the insulating film 507, the oxide semiconductor films 508a, 508b, and 508c, and the insulating film 514. FIG. 31(B) shows an example of a band structure in the thickness direction of a layered structure including the insulating film 507, the oxide semiconductor films 508b and 508c, and the insulating film 514. Note that for easy understanding, the energy level of the conduction band minimum (Ec) of each of the insulating film 507, the oxide semiconductor films 508a, 508b, and 508c, and the insulating film 514 is shown in the band structures.

Furthermore, in the band structure of FIG. 31(A), a silicon oxide film is used as each of the insulating films 507 and 514, an oxide semiconductor film formed using a metal oxide target having an atomic ratio of metal elements, In:Ga:Zn=1:1:1.2, is used as the oxide semiconductor film 508a, an oxide semiconductor film formed using a metal oxide target having an atomic ratio of metal elements, In:Ga:Zn=4:2:4.1, is used as the oxide semiconductor film 508b, and an oxide semiconductor film formed using a metal oxide target having an atomic ratio of metal elements, In:Ga:Zn=1:1:1.2, is used as the oxide semiconductor film 508c.

Furthermore, in the band structure of FIG. 31(B), a silicon oxide film is used as each of the insulating films 507 and 514, an oxide semiconductor film formed using a metal oxide target having an atomic ratio of metal elements, In:Ga:Zn=4:2:4.1, is used as the oxide semiconductor film 508b, and an oxide semiconductor film formed using a metal oxide target having an atomic ratio of metal elements, In:Ga:Zn=1:1:1.2, is used as the oxide semiconductor film 508c.

As illustrated in FIGS. 31(A) and (B), the energy level of the conduction band minimum gradually changes between the oxide semiconductor films 508a and 508b and between 508b and 508c. In other words, the energy level of the conduction band minimum is continuously changed or continuously connected. To obtain such a band structure, there exists no impurity, which forms a defect state such as a trap center or a recombination center, at the interface between the oxide semiconductor film 508a and the oxide semiconductor film 508b or at the interface between the oxide semiconductor film 508b and the oxide semiconductor film 508c.

To form a continuous junction between the oxide semiconductor films 508a and 508b and between 508b and 508c, it is necessary to form the films successively without exposure to the air by using a multi-chamber deposition apparatus (sputtering apparatus) provided with a load lock chamber.

With the band structures of FIGS. 31(A) and (B), the oxide semiconductor film 508b serves as a well (well), and a channel region is formed in the oxide semiconductor film 508b in the transistor with the layered structure.

Note that by providing the oxide semiconductor films 508a and 508c, the oxide semiconductor film 508b can be distanced away from trap states.

In addition, the trap states might be more distant from the vacuum level than the energy level of the conduction band minimum (Ec) of the oxide semiconductor film 508b serving as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 508b. Such a structure inhibits accumulation of electrons in the trap states. As a result, the on-state current and the field-effect mobility of the transistor can be increased.

Furthermore, the energy level of the conduction band minimum of each of the oxide semiconductor films 508a and 508c is closer to the vacuum level than that of the oxide semiconductor film 508b. Typically, a difference in energy level between the conduction band minimum of the oxide semiconductor film 508b and the conduction band minimum of each of the oxide semiconductor films 508a and 508c is 0.15 eV or more or 0.5 eV or more and 2 eV or less or 1 eV or less. That is, the difference between the electron affinity of each of the oxide semiconductor films 508a and 508c and the electron affinity of the oxide semiconductor film 508b is 0.15 eV or more or 0.5 eV or more and 2 eV or less or 1 eV or less.

In such a structure, the oxide semiconductor film 508b serves as a main path of a current. In other words, the oxide semiconductor film 508b serves as a channel region, and the oxide semiconductor films 508a and 508c serve as oxide insulating films. In addition, since the oxide semiconductor films 508a and 508c each include one or more metal elements included in the oxide semiconductor film 508b in which a channel region is formed, interface scattering is less likely to occur at the interface between the oxide semiconductor film 508a and the oxide semiconductor film 508b or at the interface between the oxide semiconductor films 508b and the oxide semiconductor film 508c. Thus, the transistor can have high field-effect mobility because the movement of carriers is not hindered at the interface.

Furthermore, to prevent each of the oxide semiconductor films 508a and 508c from serving as part of a channel region, a material having sufficiently low conductivity is used. Thus, the oxide semiconductor films 508a and 508c can be referred to as oxide insulating films for such properties and/or functions. Alternatively, a material that has a smaller electron affinity (a difference in energy level between the vacuum level and the conduction band minimum) than the oxide semiconductor film 508b and has a difference in energy level in the conduction band minimum from the oxide semiconductor film 508b (band offset) is used for the oxide semiconductor films 508a and 508c. Furthermore, to inhibit generation of a difference in threshold voltage due to the value of the drain voltage, the energy level of the conduction band minimum of each of the oxide semiconductor films 508a and 508c is preferably closer to the vacuum level than the energy level of the conduction band minimum of the oxide semiconductor film 508b is. For example, a difference between the energy level of the conduction band minimum of the oxide semiconductor film 508b and the energy level of the conduction band minimum of each of the oxide semiconductor films 508a and 508c is preferably greater than or equal to 0.2 eV, more preferably greater than or equal to 0.5 eV.

Furthermore, it is preferable that the oxide semiconductor films 508a and 508c not have a spinel crystal structure. This is because if the oxide semiconductor films 508a and 508c have a spinel crystal structure, constituent elements of the conductive films 512a and 512b might be diffused to the oxide semiconductor film 508b at the interface between the spinel crystal structure and another region. Note that each of the oxide semiconductor films 508a and 508c is preferably a CAAC-OS film, in which case a higher blocking property against constituent elements of the conductive films 512a and 512b, for example, copper elements, can be obtained.

The thickness of each of the oxide semiconductor films 508a and 508c is greater than or equal to a thickness that is capable of inhibiting diffusion of the constituent elements of the conductive films 512a and 512b to the oxide semiconductor film 508b, and less than a thickness that inhibits supply of oxygen from the insulating film 514 to the oxide semiconductor film 508b. For example, when the thickness of each of the oxide semiconductor films 508a and 508c is greater than or equal to 10 nm, diffusion of the constituent elements of the conductive films 512a and 512b to the oxide semiconductor film 508b can be inhibited. Furthermore, when the thickness of each of the oxide semiconductor films 508a and 508c is less than or equal to 100 nm, oxygen can be effectively supplied from the insulating film 514 to the oxide semiconductor film 508b.

Furthermore, although the example where an oxide semiconductor film formed using a metal oxide target having an atomic ratio of metal elements, In:Ga:Zn=1:1:1.2, is used as each of the oxide semiconductor films 508a and 508c is described in this embodiment, one embodiment of the present invention is not limited thereto. For example, an oxide semiconductor film formed using a metal oxide target satisfying In:Ga:Zn=1:1:1 [atomic ratio], In:Ga:Zn=1:3:2 [atomic ratio], In:Ga:Zn=1:3:4 [atomic ratio], or In:Ga:Zn=1:3:6 [atomic ratio], may be used as each of the oxide semiconductor films 508a and 508c.

Note that when the oxide semiconductor films 508a and 508c are formed using a metal oxide target satisfying In:Ga:Zn=1:1:1 [atomic ratio], the oxide semiconductor films 508a and 508c satisfy In:Ga:Zn=1:$\beta$1 (0<$\beta$1≤2):$\beta$2 (0<$\beta$2≤3) in some cases. When the oxide semiconductor films 508a and 508c are formed using a metal oxide target satisfying In:Ga:Zn=1:3:4 [atomic ratio], the oxide semiconductor films 508a and 508c satisfy In:Ga:Zn=1:$\beta$3 (1≤$\beta$3≤5):$\beta$4 (2≤$\beta$4≤6) in some cases. When the oxide semiconductor films 508a and 508c are formed using a metal oxide target satisfying In:Ga:Zn=1:3:6 [atomic ratio], the oxide semiconductor films 508a and 508c satisfy 1:$\beta$5 (1≤$\beta$5≤5):$\beta$6 (4≤$\beta$6≤8) in some cases.

Figure 32A:
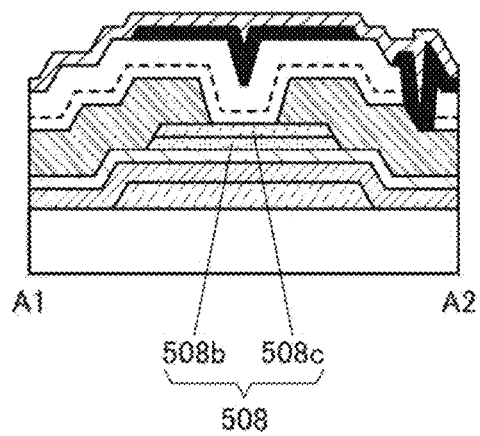
FIG. 32 Cross-sectional views illustrating examples of transistors.
Figure 32B:
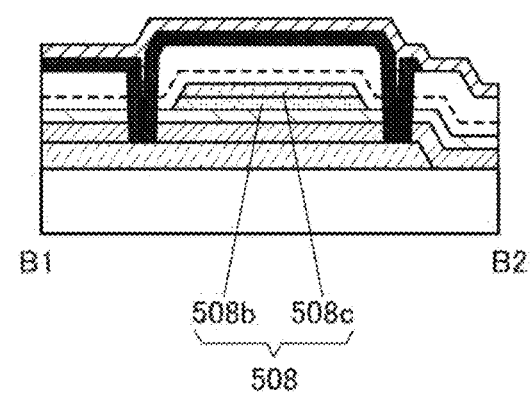

Furthermore, the drawings illustrate an example where the oxide semiconductor film 508 in the transistor 270 and the oxide semiconductor film 508c in the transistors 270A and 270B have a small thickness in a region that does not overlap with the conductive films 512a and 512b, that is, an example where part of the oxide semiconductor film has a depressed portion. However, one embodiment of the present invention is not limited thereto, and the oxide semiconductor film does not necessarily have a depressed portion in a region that does not overlap with the conductive films 512a and 512b. FIGS. 32(A) and (B) illustrate examples in this case. FIGS. 32(A) and (B) are cross-sectional views illustrating an example of the transistor. FIGS. 32(A) and (B) illustrate a structure where the oxide semiconductor film 508 in the transistor 270B does not have a depressed portion.

Figure 32C:
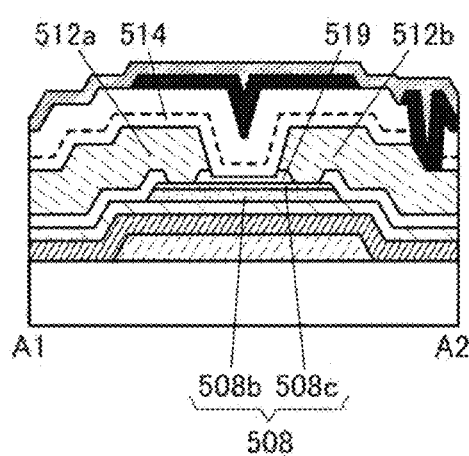
Figure 32D:
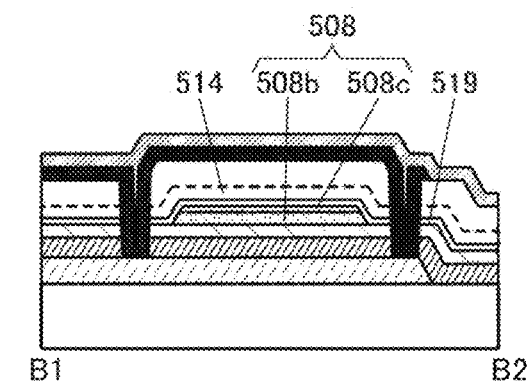

As illustrated in FIGS. 32(C) and (D), the oxide semiconductor film 508c may be formed thinner than the oxide semiconductor film 508b in advance, and an insulating film 519 may further be formed over the oxide semiconductor film 508c and the insulating film 507. In that case, openings for connecting the oxide semiconductor film 508c and the conductive films 512a and 512b are formed in the insulating film 519. The insulating film 519 can be formed with the same material and the same forming method as the insulating film 514.

The structures of the transistors of this embodiment can be freely combined with each other.

Embodiment 5

In this embodiment, an oxide semiconductor is described with reference to FIG. 33 to FIG. 37.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a CAAC-OS (c-axis-aligned crystalline oxide semiconductor), a polycrystalline oxide semiconductor, a nc-OS (nanocrystalline oxide semiconductor), an amorphous-like oxide semiconductor (a-like OS: amorphous-like oxide semiconductor), and an amorphous oxide semiconductor.

Furthermore, from another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous (completely amorphous) oxide semiconductor. Moreover, an oxide semiconductor that is not isotropic (for example, having a periodic structure in a microscopic region) cannot be regarded as a completely amorphous oxide semiconductor. In contrast, an a-like OS, which is not isotropic, has an unstable structure that includes a void (also referred to as a void). Because of its instability, an a-like OS has physical properties similar to those of an amorphous oxide semiconductor.

<CAAC-OS>

First, a CAAC-OS will be described.

The CAAC-OS is one of oxide semiconductors having a plurality of c-axis-aligned crystal parts (also referred to as pellets).

Figure 33A:
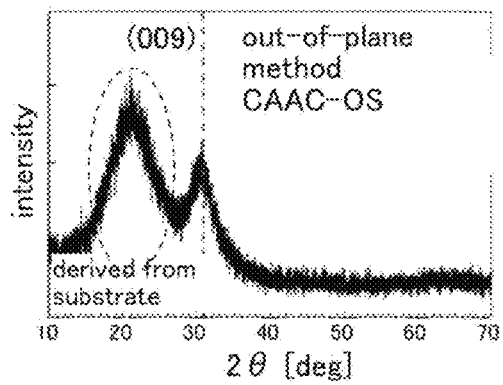
FIG. 33 Diagrams illustrating structural analysis of a CAAC-OS and a single crystal oxide semiconductor by XRD and diagrams illustrating selected-area electron diffraction patterns of a CAAC-OS.

Analysis of a CAAC-OS by X-ray diffraction (XRD: X-Ray Diffraction) will be described. For example, when the structure of a CAAC-OS including an InGaZnO$_4$ crystal, which is classified into the space group R-3m, is analyzed by an out-of-plane method, a peak appears at a diffraction angle (2θ) of around 31° as shown in FIG. 33(A). This peak is derived from the (009) plane of the InGaZnO$_4$ crystal, which indicates that crystals in the CAAC-OS have c-axis alignment, and that the c-axes are aligned in a direction substantially perpendicular to a surface over which a CAAC-OS film is formed (also referred to as a formation surface) or the top surface of the CAAC-OS film. Note that another peak may appear when 2θ is around 36°, in addition to the peak at 2θ of around 31°. The peak at 2θ of around 36° is attributed to a crystal structure classified into the space group Fd-3m. Therefore, this peak is preferably not exhibited in the CAAC-OS.

Figure 33B:
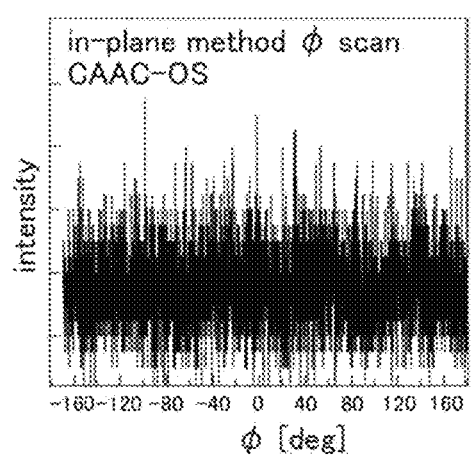
Figure 33C:
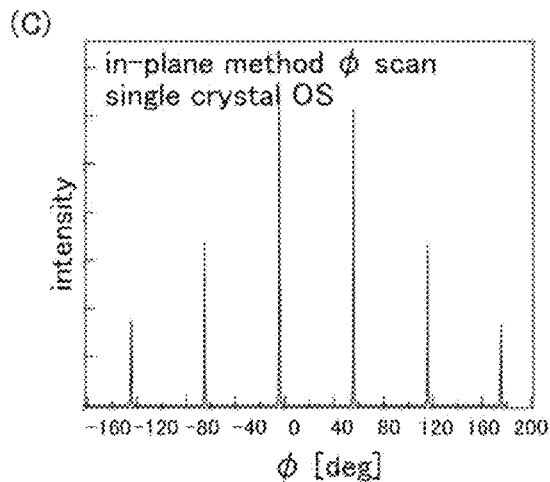
Figure 33D:
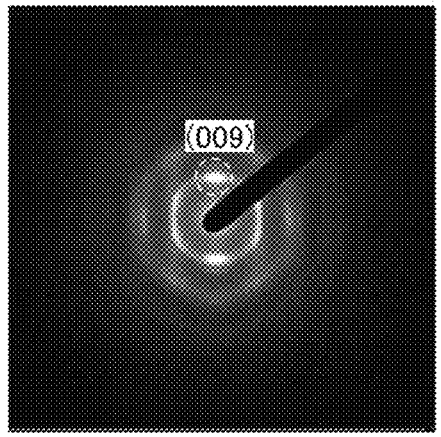

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the InGaZnO$_4$ crystal. When analysis (φ scan) is performed with 2θ fixed at around 56° while the sample is rotated around a normal vector to the sample surface as an axis (φ axis), as shown in FIG. 33(B), a peak is not clearly observed. In contrast, in the case where single crystal InGaZnO$_4$ is subjected to φ scan with 2θ fixed at around 56°, as shown in FIG. 33(C), six peaks which are derived from crystal planes equivalent to the (110) plane are observed. Accordingly, the structural analysis using XRD shows that the directions of the a-axes and b-axes are irregularly oriented in the CAAC-OS.

Figure 33E:
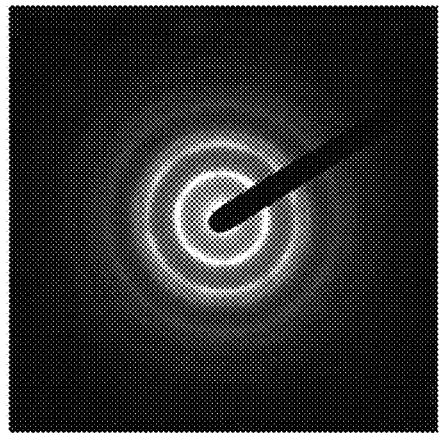

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern.) shown in FIG. 33(D) can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 33(E) shows a diffraction pattern obtained in such a manner that an electron beam with a probe diameter of 300 nm is incident on the same sample in a direction perpendicular to the sample surface. As shown in FIG. 33(E), a ring-like diffraction pattern is observed. Thus, the results of electron diffraction using an electron beam with a probe diameter of 300 nm also indicate that the a-axes and b-axes of the pellets included in the CAAC-OS do not have regular alignment. Note that the first ring in FIG. 33(E) is considered to be derived from the (010) plane, the (100) plane, and the like of the InGaZnO$_4$ crystal. The second ring in FIG. 33(E) is considered to be derived from the (110) plane and the like.

Furthermore, in a combined analysis image (also referred to as a high-resolution TEM image.) of a bright-field image and a diffraction pattern of a CAAC-OS, which is obtained using a transmission electron microscope (TEM: Transmission Electron Microscope), a plurality of pellets can be observed. However, in the high-resolution TEM image, a boundary between pellets, that is, a grain boundary (also referred to as a grain boundary.) is not clearly observed in some cases. Thus, in the CAAC-OS, a reduction in electron mobility due to the grain boundary is less likely to occur.

Figure 34A:
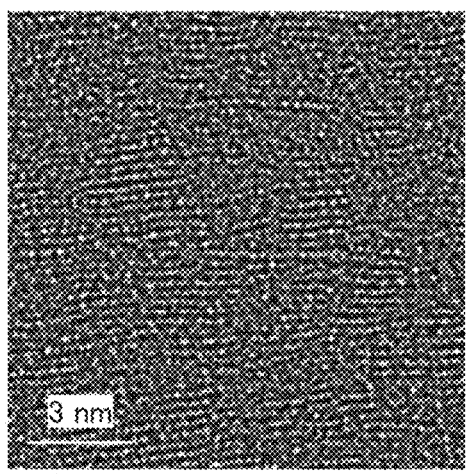
FIG. 34 A cross-sectional TEM image and plan-view TEM images of a CAAC-OS and images obtained through analysis thereof.

FIG. 34(A) shows a high-resolution TEM image of a cross section of the CAAC-OS which is observed in a direction substantially parallel to the sample surface. The high-resolution TEM image is obtained with a spherical aberration corrector (Spherical Aberration Corrector) function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

FIG. 34(A) shows pellets in which metal atoms are arranged in a layered manner. It is found that the size of a pellet is greater than or equal to 1 nm or greater than or equal to 3 nm. Therefore, the pellet can also be referred to as a nanocrystal (nc: nanocrystal). Furthermore, the CAAC-OS can also be referred to as an oxide semiconductor including CANC (C-Axis Aligned nanocrystals). A pellet reflects unevenness of a formation surface or a top surface of the CAAC-OS, and is parallel to the formation surface or the top surface of the CAAC-OS.

Figure 34B:
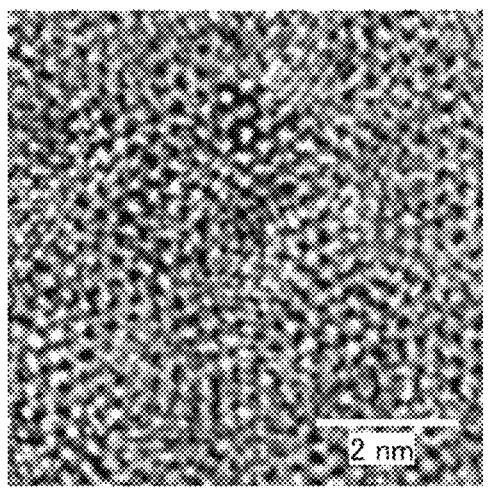
Figure 34C:
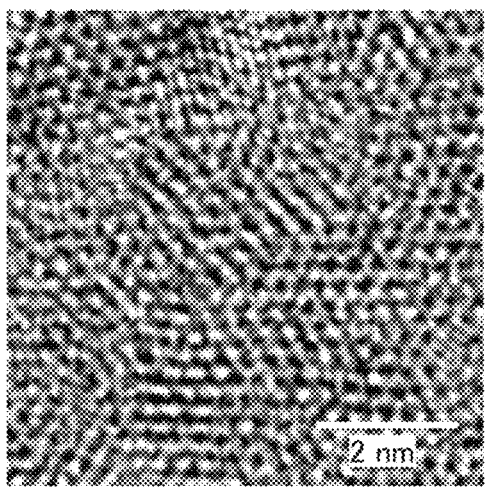
Figure 34D:
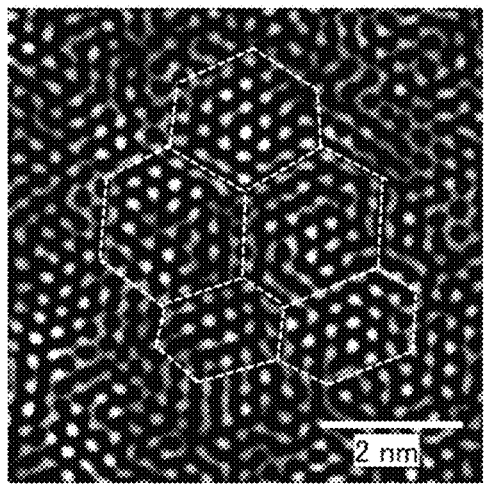
Figure 34E:
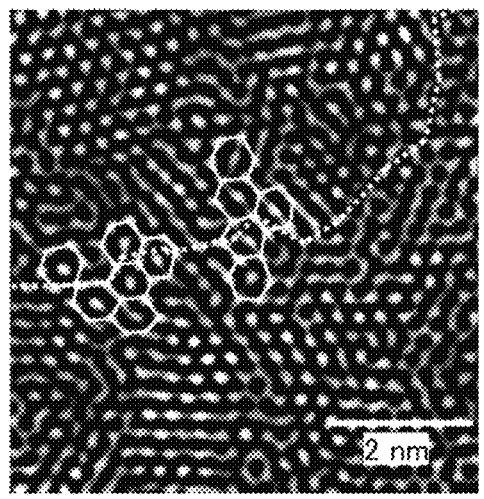

Furthermore, FIG. 34(B) and FIG. 34(C) show Cs-corrected high-resolution TEM images of a plane of the CAAC-OS observed in the direction substantially perpendicular to the sample surface. FIG. 34(D) and FIG. 34(E) are images obtained by image processing of FIG. 34(B) and FIG. 34(C). The method of image processing is as follows. First, the image in FIG. 34(B) is subjected to fast Fourier transform (FFT: Fast Fourier Transform) to obtain an FFT image. Then, mask processing is performed on the obtained FFT image such that part in the range from 2.8 nm$^{-1}$ to 5.0 nm$^{-1}$ from the reference point is left. After the mask processing, the FFT image is subjected to inverse fast Fourier transform (IFFT: Inverse Fast Fourier Transform) to obtain a processed image. The image obtained in this manner is referred to as an FFT filtering image. The FFT filtering image is a Cs-corrected high-resolution TEM image from which a periodic component is extracted and shows a lattice arrangement.

In FIG. 34(D), a portion in which the lattice arrangement is broken is shown by dashed lines. A region surrounded by dashed lines corresponds to one pellet. The portion shown by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 34(E), a dotted line denotes a portion between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, a change in interatomic bond distance by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as a CAAcrystal (c-axis-aligned a-b-plane-anchored crystal).

The CAAC-OS is an oxide semiconductor with high crystallinity. Entry of impurities, formation of defects, or the like might decrease the crystallinity of an oxide semiconductor. This means that the CAAC-OS has few impurities and defects (for example, oxygen vacancies).

Note that an impurity means an element other than the main components of an oxide semiconductor, such as hydrogen, carbon, silicon, or a transition metal element. For example, an element such as silicon having stronger bonding force to oxygen than a metal element constituting a part of an oxide semiconductor extracts oxygen from the oxide semiconductor, which results in a disordered atomic arrangement and reduced crystallinity of the oxide semiconductor. Furthermore, a heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor film with a low carrier density. Specifically, lower than $8 \times 10^{11}/cm^3$, preferably lower than $1 \times 10^{11}/cm^3$, and further preferably lower than $1 \times 10^{10}/cm^3$ and higher than or equal to $1 \times 10^{-9}/cm^3$. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. For example, when the structure of an nc-OS is analyzed by an out-of-plane method, a peak indicating orientation does not appear. That is, a crystal of an nc-OS does not have orientation.

Figure 35A:
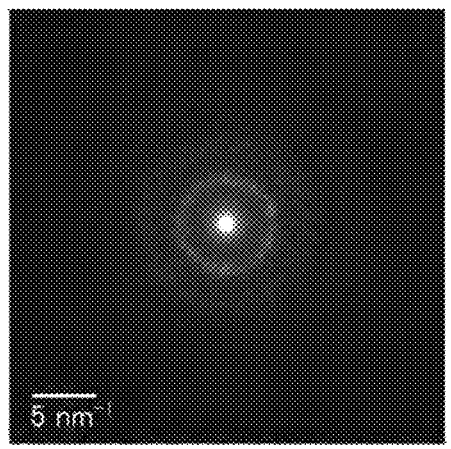
FIG. 35 Diagrams illustrating electron diffraction patterns of an nc-OS and a cross-sectional TEM image of an nc-OS.
Figure 35B:
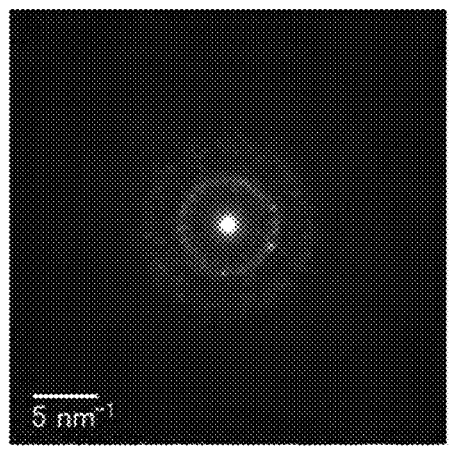

Furthermore, for example, when an electron beam with a probe diameter of 50 nm is incident on a 34-nm-thick region of thinned nc-OS including an InGaZnO$_4$ crystal in a direction parallel to the formation surface, a ring-shaped diffraction pattern (nanobeam electron diffraction pattern) shown in FIG. 35(A) is observed. Furthermore, FIG. 35(B) shows a diffraction pattern (nanobeam electron diffraction pattern) obtained when an electron beam with a probe diameter of 1 nm is incident on the same sample. As shown in FIG. 35(B), a plurality of spots are observed in a ring-like region. In other words, ordering in an nc-OS is not observed with an electron beam with a probe diameter of 50 nm but is observed with an electron beam with a probe diameter of 1 nm.

Figure 35C:
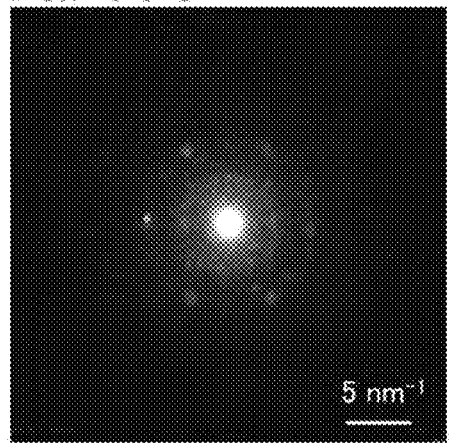

Furthermore, an electron diffraction pattern in which spots are arranged in an approximately regular hexagonal shape is observed in some cases as shown in FIG. 35(C) when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 35D:
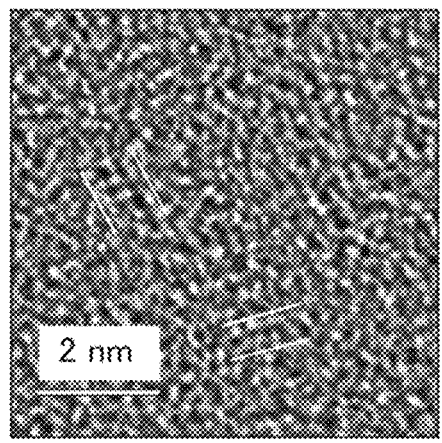

FIG. 35(D) shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor (microcrystalline oxide semiconductor). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Note that since there is no regularity of crystal orientation between the pellets (nanocrystals), the nc-OS can also be referred to as an oxide semiconductor including RANC (Random Aligned nanocrystals) or an oxide semiconductor including NANC (Non-Aligned nanocrystals).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<a-Like OS>

The a-like OS has a structure intermediate between those of the nc-OS and the amorphous oxide semiconductor.

Figure 36A:
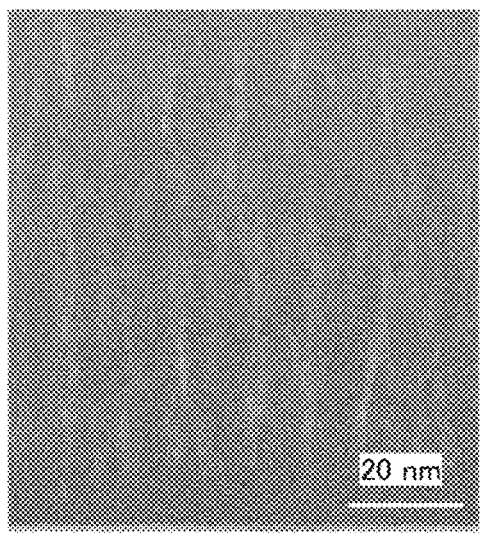
FIG. 36 Diagrams illustrating cross-sectional TEM images of an a-like OS.
Figure 36B:
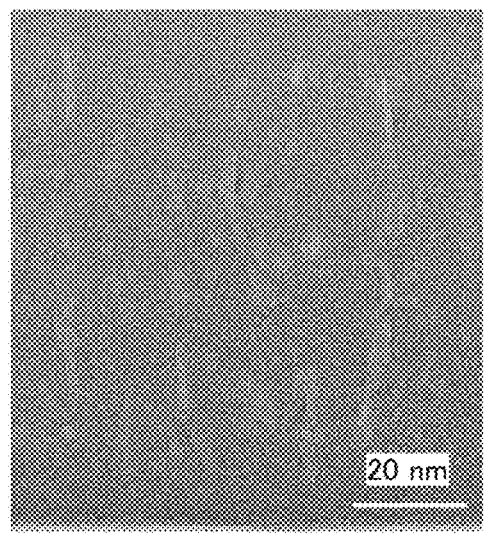

FIG. 36 show high-resolution cross-sectional TEM images of the a-like OS. FIG. 36(A) is the high-resolution cross-sectional TEM image of the a-like OS taken at the start of the electron irradiation. FIG. 36(B) is the high-resolution cross-sectional TEM image of the a-like OS taken after the irradiation with electrons (e$^-$) at $4.3 \times 10^8$ e$^-$/nm$^2$. FIGS. 36(A) and 36(B) show that striped bright regions extending vertically are observed in the a-like OS from the start of the electron irradiation. Furthermore, it can be also found that the shape of the bright region changes after the electron irradiation. Note that the bright region is presumably a void or a low-density region.

The a-like OS has an unstable structure because it includes a void. To verify that the a-like OS has an unstable structure as compared with the CAAC-OS and the nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value.) and the value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Note that each lattice fringe corresponds to the a-b plane of the InGaZnO$_4$ crystal.

Figure 37:
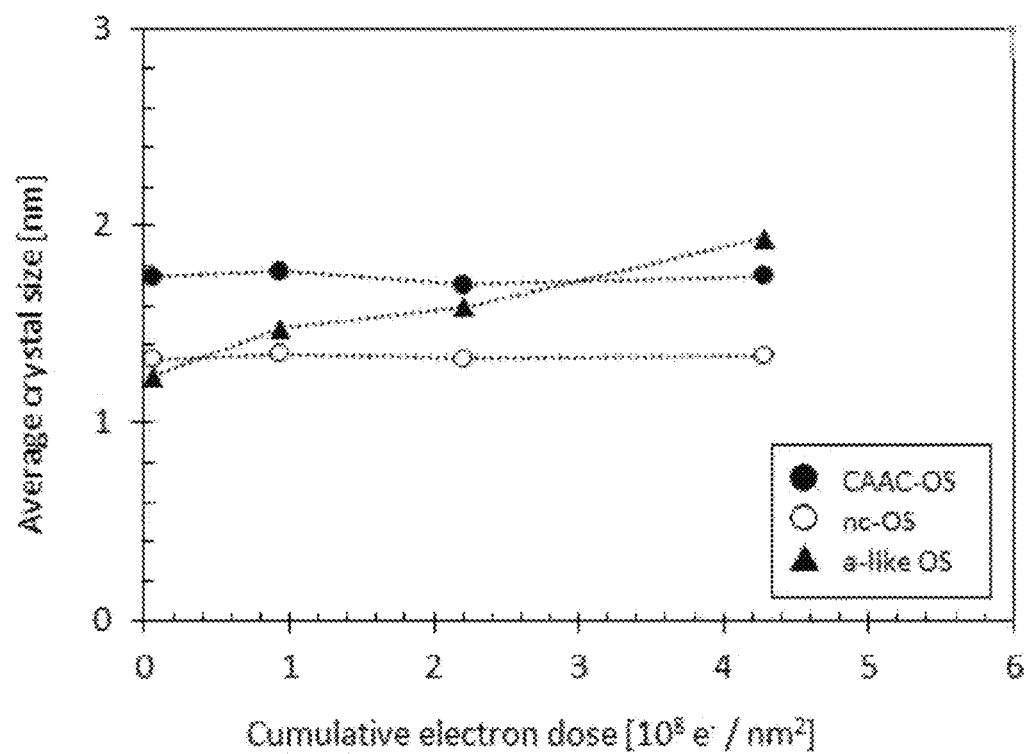
FIG. 37 A diagram illustrating a change in crystal part of an In—Ga—Zn oxide induced by electron irradiation.

FIG. 37 shows the average size of crystal parts (at 22 points to 30 points) in each sample. Note that the crystal part size corresponds to the length of a lattice fringe. FIG. 37 indicates that the crystal part size in the a-like OS increases with an increase in the cumulative electron dose in obtaining TEM images, for example. As shown in FIG. 37, a crystal part with a size of approximately 1.2 nm (also referred to as an initial nucleus.) at the start of TEM observation grows to a size of approximately 1.9 nm at a cumulative electron (e$^-$) dose of $4.2 \times 10^8$ e$^-$/nm$^2$. In contrast, the crystal part sizes in the nc-OS and the CAAC-OS show little change from the start of electron irradiation to a cumulative electron dose of $4.2 \times 10^8$ e/nm$^2$. As shown in FIG. 37, the crystal part sizes in the nc-OS and the CAAC-OS are approximately 1.3 nm and approximately 1.8 nm, respectively, regardless of the cumulative electron dose. Note that for the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e$^-$/(nm$^2 \cdot$s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

Furthermore, the a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. Furthermore, the density of each of the nc-OS and the CAAC-OS is higher than or equal to 92.3% and lower than 100% of the density of the single crystal oxide semiconductor having the same composition. It is difficult to deposit an oxide semiconductor having a density lower than 78% of the density of the single crystal oxide semiconductor.

For example, in the case of an oxide semiconductor satisfying In:Ga:Zn=1:1:1 [atomic ratio], the density of single crystal InGaZnO$_4$ with a rhombohedral crystal structure is 6.357 g/cm$^3$. Accordingly, for example, in the case of an oxide semiconductor satisfying In:Ga:Zn=1:1:1 [atomic ratio], the density of a-like OS is more than or equal to 5.0 g/cm$^3$ and less than 5.9 g/cm$^3$. Furthermore, for example, in the case of the oxide semiconductor satisfying In:Ga:Zn=1:1:1 [atomic ratio], the density of the nc-OS and the density of CAAC-OS is higher than or equal to 5.9 g/cm$^3$ and lower than 6.3 g/cm$^3$.

Note that in the case where an oxide semiconductor having a certain composition does not exist in a single crystal state, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition may be calculated using a weighted average with respect to the combination ratio of the single crystal oxide semiconductors with different compositions. Note that it is preferable to use as few kinds of single crystal oxide semiconductors as possible to calculate the density.

<Composition of CAC-OS>

Described below is the composition of a CAC (Cloud Aligned Complementary)-OS applicable to a transistor disclosed in one embodiment of the present invention.

In this specification and the like, a metal oxide (metal oxide) means an oxide of metal in a broad sense. Metal oxides are classified into an oxide insulator, an oxide conductor (including a transparent oxide conductor), an oxide semiconductor (Oxide Semiconductor or also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC(Cloud Aligned Complementary)-OS (Oxide Semiconductor) or a CAC-metal oxide.

That is, the CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. Furthermore, a material in which conductive regions and dielectric regions are mixed to form a mosaic pattern serves as a semiconductor.

That is, a metal oxide in one embodiment of the present invention is a kind of matrix composite (matrix composite) or metal matrix composite (metal matrix composite), in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO.) has a composition in which materials are separated into indium oxide (below, InO$_{X1}$ (X1 is a real number greater than 0.)) or indium zinc oxide (below, In$_{X2}$Zn$_{Y2}$O$_{Z2}$ (X2, Y2, and Z2 are real numbers greater than 0.)), and gallium oxide (below, GaO$_{X3}$ (where X3 is a real number greater than 0.)), gallium zinc oxide (below, Ga$_{X4}$Zn$_{Y4}$O$_{Z4}$ (where X4, Y4, and Z4 are real numbers greater than 0.)), or the like, and a mosaic pattern is formed. Then, InO$_{X1}$ or In$_{X2}$Zn$_{Y2}$O$_{Z2}$ forming the mosaic pattern is evenly distributed in the film (this composition is also referred to as a cloud-like composition.).

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by $In_{(1+x0)}Ga_{(1-x0)}O_3(ZnO)_{m0}$ ($-1 \leq x0 \leq 1$, m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of the oxide semiconductor. In a CAC-OS material including In, Ga, Zn, and O, regions where nanoparticles including Ga as a main component are partly observed and regions where nanoparticles including In as a main component are partly observed are randomly dispersed to form a mosaic pattern. Therefore, the crystal structure is a secondary element for the CAC-OS composition.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

Note that in the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

First, a glass substrate is used as the substrate. Next, over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (satisfying In:Ga:Zn=4:2:4.1 [atomic ratio]) is used as a target. Furthermore, the oxide target provided in the sputtering apparatus is supplied with an AC power of 2500 W.

Note that as for the conditions in the formation of the oxide, the substrate temperature is set to a temperature that is not increased by intentional heating (hereinafter such a temperature is also referred to as R.T.), to 130° C., and to 170° C. Furthermore, the ratio of a flow rate of an oxygen gas to a flow rate of a mixed gas of Ar and oxygen (also referred to as an oxygen gas flow rate ratio.) is set to 10%, 30%, and 100%.

<<Analysis by X-Ray Diffraction>>

In this section, results of X-ray diffraction (XRD: X-ray diffraction) measurement performed on the nine samples are described. Note that as an XRD apparatus, D8 ADVANCE manufactured by Bruker AXS is used. Furthermore, the conditions are as follows: scanning is performed by an Out-of-plane method at θ/2θ, the scanning range is 15 deg. to 50 deg., the step width is 0.02 deg., and the scanning speed is 3.0 deg./min.

Figure 41:
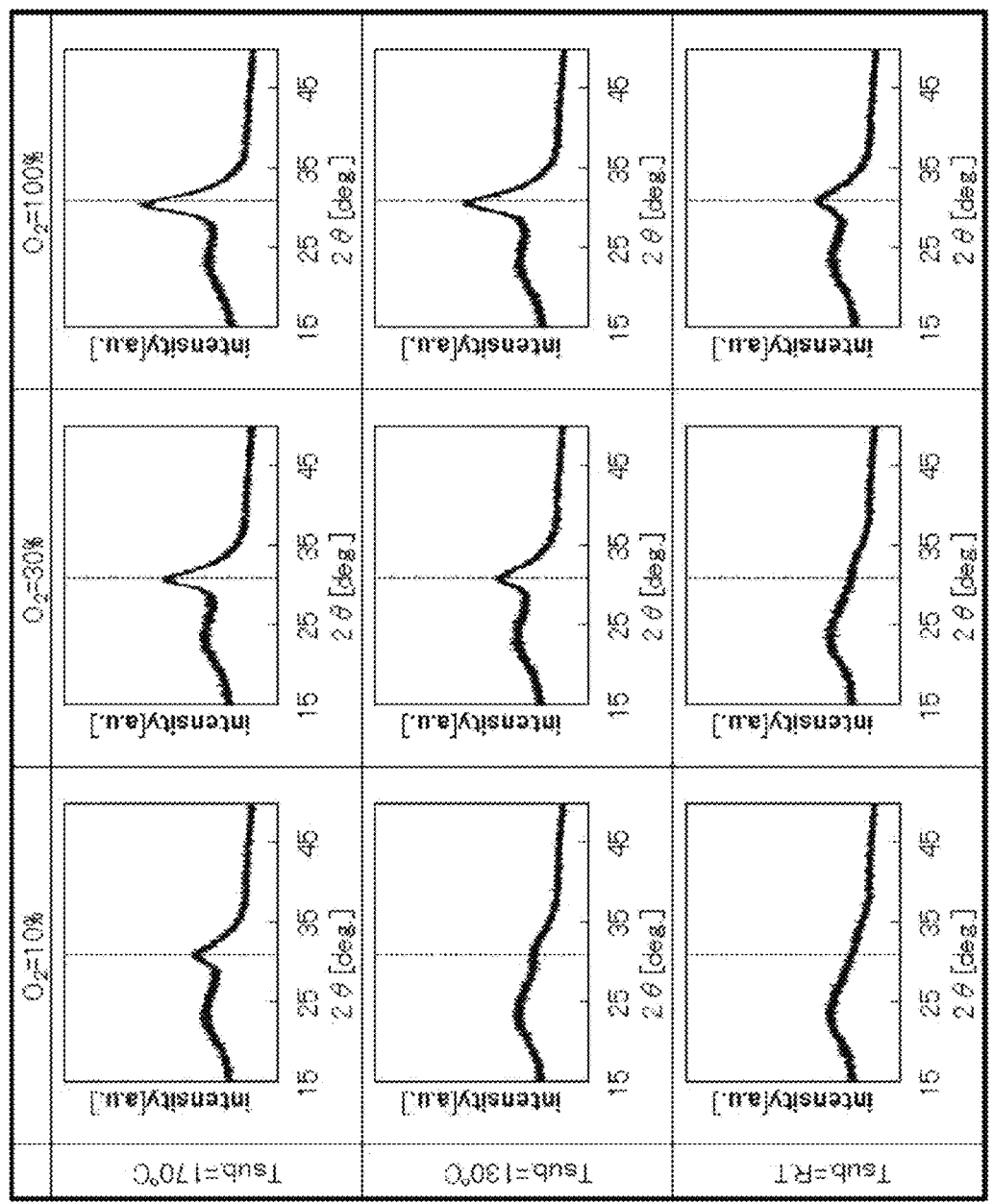
FIG. 41 A diagram illustrating measurement results of XRD spectra of samples.

FIG. 41 shows XRD spectra measured by an Out-of-plane method. Note that in FIG. 41, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. Furthermore, the left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 41, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound whose c-axes are aligned in a direction substantially perpendicular to a formation surface or a top surface of the crystalline IGZO compound (such a compound is also referred to as CAAC (c-axis aligned crystalline)-IGZO).

Furthermore, as shown in the XRD spectra in FIG. 41, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with an HAADF (High-Angle Annular Dark Field)-STEM (Scanning Transmission Electron Microscope) (an image obtained with an HAADF-STEM is also referred to as a TEM image.).

Described are the results of image analysis of plan-view images and cross-sectional images obtained with an HAADF-STEM (also referred to as plan-view TEM images.) (also referred to as cross-sectional TEM images.). Note that the TEM images are observed with a spherical aberration corrector function. Note that the HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nmφ is performed.

FIG. 42(A) is a plan-view TEM image of the sample formed at a substrate temperature of R.T. and with an oxygen gas flow rate ratio of 10%. FIG. 42(B) is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam.).

Electron diffraction patterns of points indicated by black dots a1, a2, a3, a4, and a5 in the plan-view TEM image in FIG. 42(A) of the sample formed at a substrate temperature of R.T. and an oxygen gas flow rate ratio of 10% are observed. Note that the electron diffraction patterns are observed while electron beam irradiation is performed at a constant rate for 35 seconds. FIG. 42(C) shows the result of the point indicated by the black dot a1, FIG. 42(D) shows the result of the point indicated by the black dot a2, FIG. 42(E) shows the result of the point indicated by the black dot a3, FIG. 42(F) shows the result of the point indicated by the black dot a4, and FIG. 42(G) shows the result of the point indicated by the black dot a5.

In FIGS. 42(C), 42(D), 42(E), 42(F), and 42(G), regions with high luminance in a circular (in a ring-like shape) pattern can be shown. Furthermore, a plurality of spots can be shown in a ring-like shape.

Furthermore, electron diffraction patterns of points indicated by black dots b1, b2, b3, b4, and b5 in the cross-sectional TEM image in FIG. 42(B) of the sample formed at a substrate temperature of R.T. and an oxygen gas flow rate ratio of 10% are observed. FIG. 42(H) shows the result of the point indicated by the black dot b1, FIG. 42(I) shows the result of the point indicated by the black dot b2, FIG. 42(J) shows the result of the point indicated by the black dot b3, FIG. 42(K) shows the result of the point indicated by the black dot b4, and FIG. 42(L) shows the result of the point indicated by the black dot b5.

In FIG. 42(H), FIG. 42(I), FIG. 42(J), FIG. 42(K), and FIG. 42(L), regions with high luminance in a ring-like shape can be shown. Furthermore, a plurality of spots can be shown in a ring-like shape.

Here, for example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor. Below, nc-OS) is subjected to electron diffraction using an electron beam with a large probe diameter (for example, 50 nm or larger). Meanwhile, bright spots are shown in a nanobeam electron diffraction pattern of the nc-OS obtained using an electron beam with a small probe diameter (for example, smaller than 50 nm). Furthermore, in a nanobeam electron diffraction pattern of the nc-OS, regions with high luminance in a circular (in a ring-like shape) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring-like shape and a plurality of bright spots appears in the ring-like shape. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX: Energy Dispersive X-ray spectroscopy), EDX mapping images are obtained. Note that an energy dispersive X-ray spectrometer AnalysisStation JED-2300T manufactured by JEOL Ltd. is used as an elementary analysis apparatus in the EDX measurement. Note that a Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 43A:
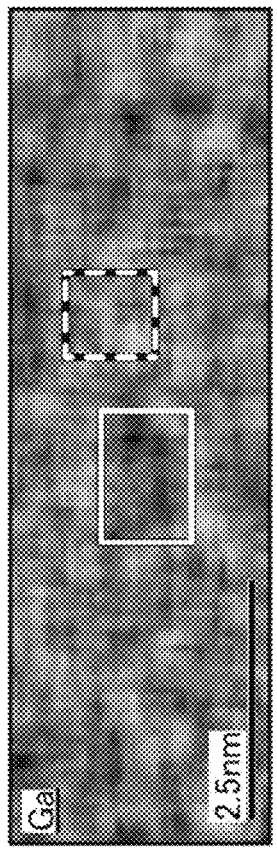
FIG. 43 Diagrams illustrating EDX mappings of a sample.
Figure 43B:
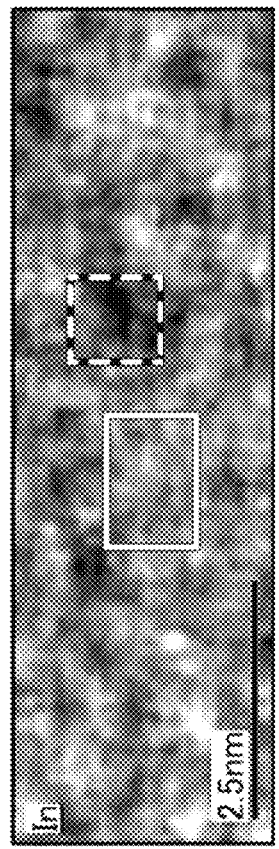
Figure 43C:
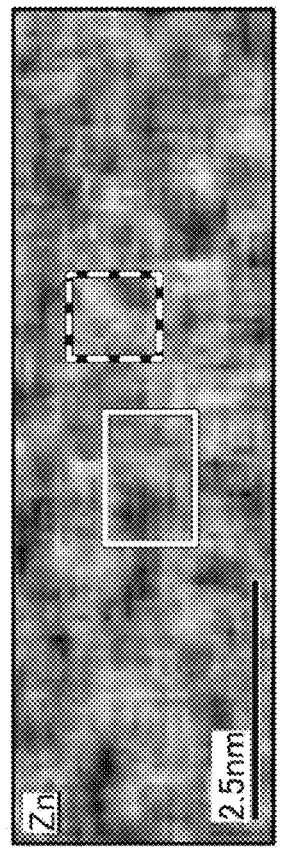

FIG. 43 show EDX mapping images in a cross section of the sample formed at a substrate temperature of R.T. and with an oxygen gas flow rate ratio of 10%. FIG. 43(A) shows an EDX mapping image of Ga atoms (the proportion of the Ga atoms in all the atoms is 1.18 to 18.64 [atomic %].). FIG. 43(B) shows an EDX mapping image of In atoms (the proportion of the In atoms in all the atoms is 9.28 to 33.74 [atomic %].). FIG. 43(C) shows an EDX mapping image of Zn atoms (the proportion of the Zn atoms in all the atoms is 6.69 to 24.99 [atomic %].). Furthermore, FIG. 43(A), FIG. 43(B), and FIG. 43(C) show the same region in the cross section of the sample formed at a substrate temperature of R.T. and with an oxygen flow rate ratio of 10%. Note that in the EDX mapping images, the proportion of an element is indicated by grayscale: the more measured atoms exist in a region, the brighter the region is; the less measured atoms exist in a region, the darker the region is. Furthermore, the magnification of the EDX mapping images in FIG. 43 is 7200000 times.

The EDX mapping images in FIGS. 43(A), 43(B), and 43(C) show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 43(A), 43(B), and 43(C) are examined.

In FIG. 43(A), a relatively dark region occupies a large area in a region surrounded by a solid line and a relatively bright region occupies a large area in a region surrounded by a dashed line. Furthermore, in FIG. 43(B), a relatively bright region occupies a large area in a region surrounded by a solid line and a relatively dark region occupies a large area in a region surrounded by a dashed line.

That is, the areas surrounded by the solid lines are regions including a relatively large number of In atoms and the areas surrounded by the dashed lines are regions including a relatively small number of In atoms. In FIG. 43(C), the right portion of the area surrounded by the solid line is relatively bright and the left portion thereof is relatively dark. Thus, the area surrounded by the solid line is a region including $In_{x2}Zn_{y2}O_{z2}$, $InO_{x1}$, and the like as main components.

Furthermore, the area surrounded by the solid line is a region including a relatively small number of Ga atoms and the area surrounded by the dashed line is a region including a relatively large number of Ga atoms. In FIG. 43(C), the upper left portion of the area surrounded by the dashed line is relatively bright and the lower right portion thereof is relatively dark. Thus, the area surrounded by the dashed line is a region including $GaO_{x3}$, $Ga_{x4}Zn_{y4}O_{z4}$, and the like as main components.

Furthermore, as shown in FIG. 43(A), FIG. 43(B), and FIG. 43(C), the In atoms are relatively more uniformly distributed than the Ga atoms, and regions including $InO_{x1}$ as a main component is seemingly joined to each other through a region including $In_{x2}Zn_{y2}O_{z2}$ as a main component. Thus, the regions including $In_{x2}Zn_{y2}O_{z2}$ and $InO_{x1}$ as a main component extend like a cloud.

An In—Ga—Zn oxide having a composition in which the regions including $GaO_{x3}$ as a main component and the regions including $In_{x2}Zn_{y2}O_{z2}$ or $InO_{x1}$ as a main component are unevenly distributed and mixed can be referred to as a CAC-OS.

Furthermore, the crystal structure of CAC-OS includes an nc structure. In an electron diffraction pattern of the CAC-OS with the nc structure, several or more bright spots appear in addition to bright spots (spot) derived from IGZO including a single crystal, a polycrystal, or a CAAC. Alternatively, in addition to the several or more bright spots (spot), the crystal structure is defined as having high luminance regions appearing in a ring-like shape.

Furthermore, as shown in FIGS. 43(A), 43(B), and 43(C), each of the regions including $GaO_{x3}$ as a main component and the regions including $In_{x2}Zn_{y2}O_{z2}$ or $InO_{x1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{x3}$ or the like as a main component and regions including $In_{x2}Zn_{y2}O_{z2}$ or $InO_{x1}$ as a main component are separated to form a mosaic pattern.

Here, the conductivity of a region including $In_{x2}Zn_{y2}O_{z2}$ or $InO_{x1}$ as a main component is higher than that of a region including $GaO_{x3}$ or the like as a main component. In other words, when carriers flow through regions including $In_{x2}Zn_{y2}O_{z2}$ or $InO_{x1}$ as a main component, the conductivity of an oxide semiconductor is exhibited. Accordingly, when regions including $In_{x2}Zn_{y2}O_{z2}$ or $InO_{x1}$ as a main component are distributed in an oxide semiconductor like a cloud, high field-effect mobility ($\mu$) can be achieved.

In contrast, the insulating property of a region including $GaO_{x3}$ or the like as a main component is higher than that of a region including $In_{x2}Zn_{y2}O_{z2}$ or $InO_{x1}$ as a main component. In other words, when regions including $GaO_{x3}$ or the like as a main component are distributed in an oxide semiconductor, leakage current can be suppressed and favorable switching operation can be achieved.

Accordingly, when CAC-OS is used for a semiconductor element, the insulating property derived from $GaO_{x3}$ or the like and the conductivity derived from $In_{x2}Zn_{y2}O_{z2}$ or $InO_{x1}$ complement each other, whereby high on-state current (Ion) and high field-effect mobility ($\mu$) can be achieved.

A semiconductor element including CAC-OS has high reliability. Thus, CAC-OS is suitably used in a variety of semiconductor devices typified by a display.

As described above, oxide semiconductors have various structures and various properties. Note that an oxide semiconductor may be a stacked film including two or more of an amorphous oxide semiconductor, an a-like OS, an nc-OS, a CAAC-OS, and a CAC-OS for example.

Embodiment 6

In this embodiment, a touch panel module and electronic devices that include the liquid crystal display device of one embodiment of the present invention will be described with reference to FIG. 38 to FIG. 40.

Figure 38:
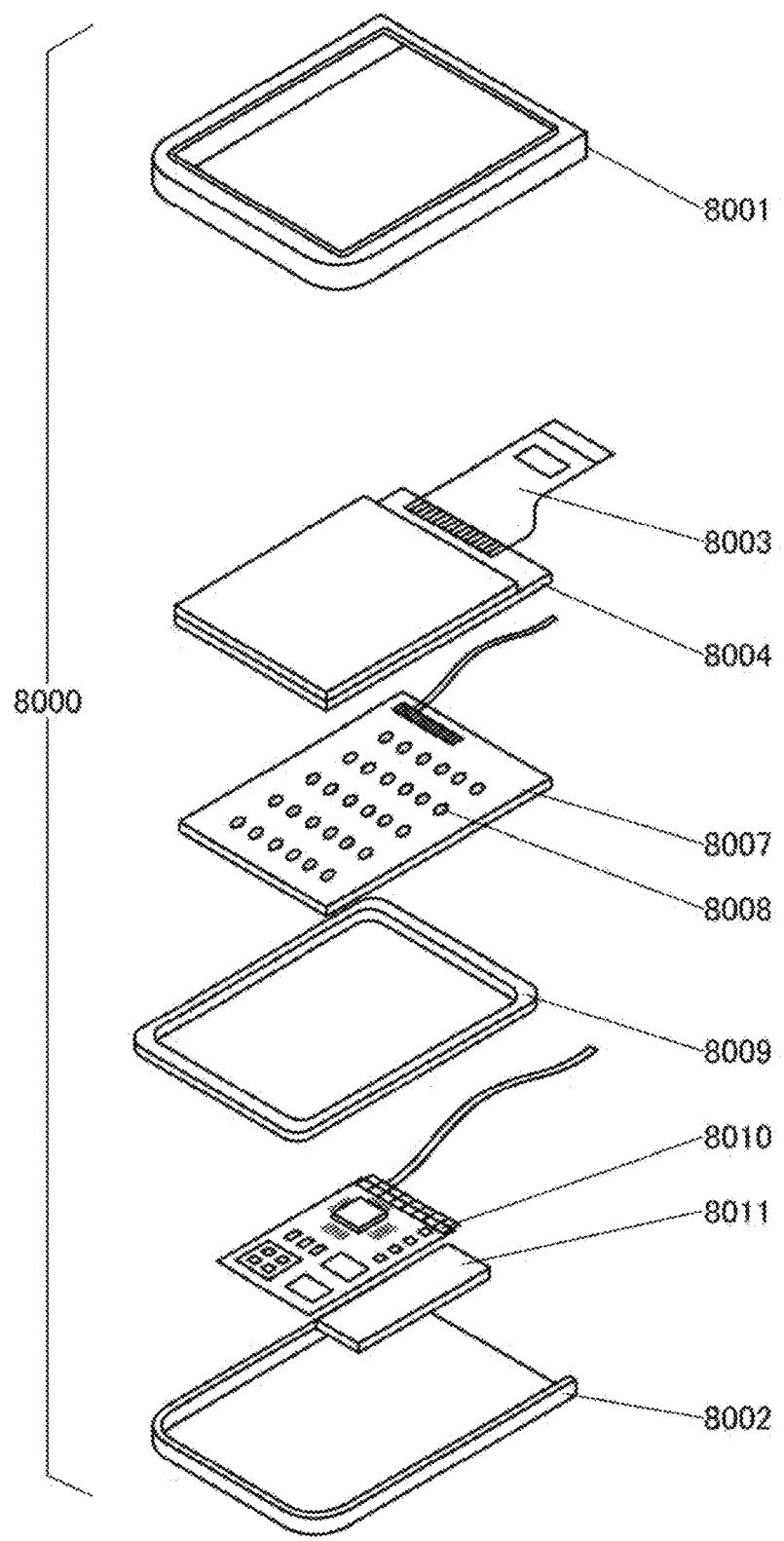
FIG. 38 A diagram illustrating examples of a touch panel module.

In a touch panel module 8000 illustrated in FIG. 38, a touch panel 8004 connected to an FPC 8003, a frame 8009, a printed board 8010, and a battery 8011 are provided between an upper cover 8001 and a lower cover 8002.

The liquid crystal display device of one embodiment of the present invention can be used for the touch panel 8004, for example.

The shapes and sizes of the upper cover 8001 and the lower cover 8002 can be changed as appropriate in accordance with the size of the touch panel 8004.

The touch panel 8004 can be a resistive touch panel or a capacitive touch panel and may be formed so as to overlap with a display panel. Furthermore, a counter substrate (sealing substrate) of the touch panel 8004 can have a touch panel function. Furthermore, a photosensor may be provided in each pixel of the touch panel 8004 so that an optical touch panel can be obtained.

Furthermore, in the case of a transmissive liquid crystal element, a backlight 8007 may be provided as illustrated in FIG. 38. The backlight unit 8007 includes a light source 8008. Note that although a structure in which the light sources 8008 are provided over the backlight 8007 is illustrated in FIG. 38, one embodiment of the present invention is not limited to this structure. For example, a structure in which a light source 8008 is provided at an end portion of the backlight unit 8007 and a light diffusion plate is further provided may be employed. Note that the backlight 8007 needs not be provided in the case where a self-luminous light-emitting element such as an organic EL element is used or in the case where a reflective panel or the like is employed.

The frame 8009 protects the touch panel 8004 and functions as an electromagnetic shield for blocking electromagnetic waves generated by the operation of the printed board 8010. Furthermore, the frame 8009 can also function as a radiator plate.

The printed board 8010 is provided with a power supply circuit and a signal processing circuit for outputting a video signal and a clock signal. As a power source for supplying electric power to the power supply circuit, an external commercial power source or a power source using the battery 8011 provided separately may be used. The battery 8011 can be omitted in the case of using a commercial power source.

The touch panel 8004 can be additionally provided with a component such as a polarizing plate, a retardation plate, or a prism sheet.

FIGS. 39(A) to (H) and FIG. 40 illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 39A:
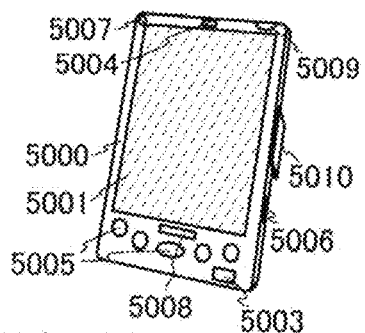
FIG. 39 Diagrams illustrating examples of electronic devices.
Figure 39B:
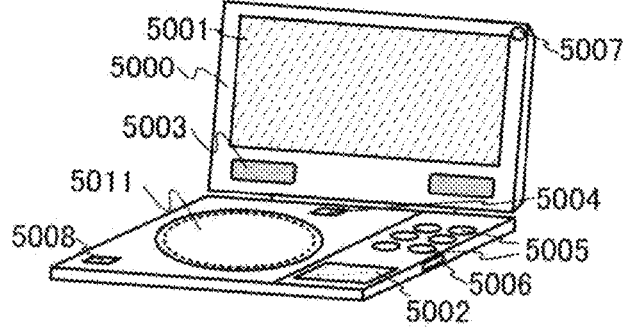
Figure 39C:
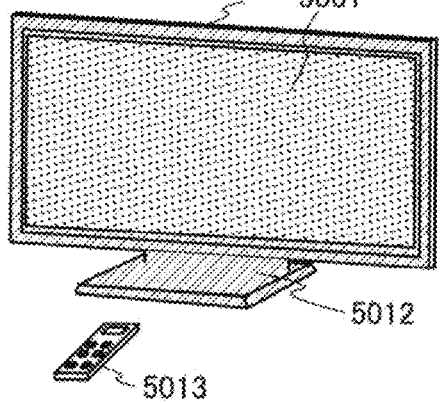
Figure 39D:
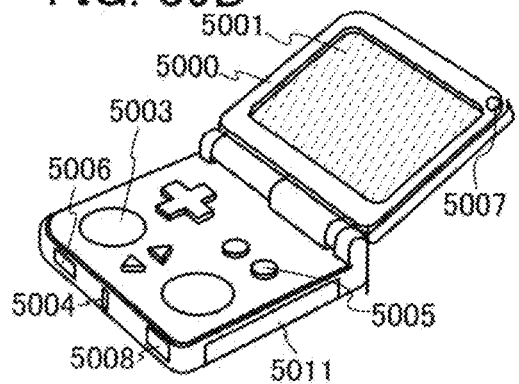
Figure 39E:
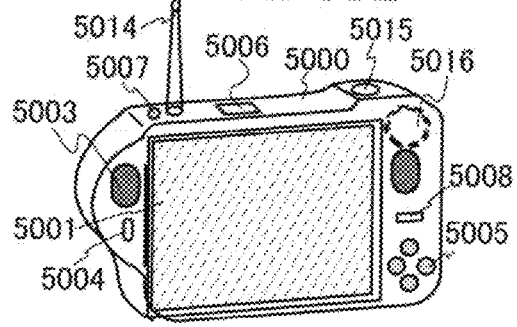
Figure 39F:
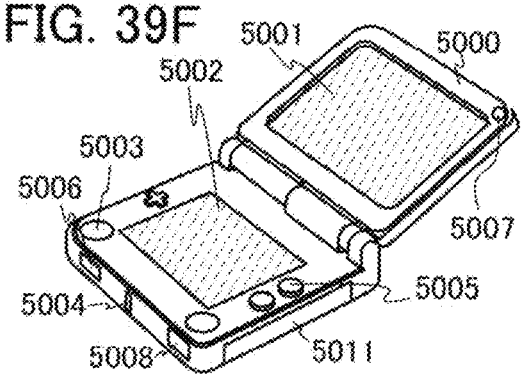
Figure 39G:
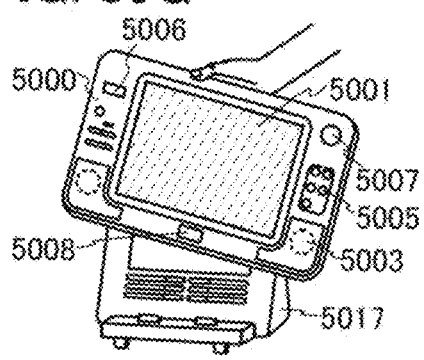
Figure 39H:
Figure 40A:
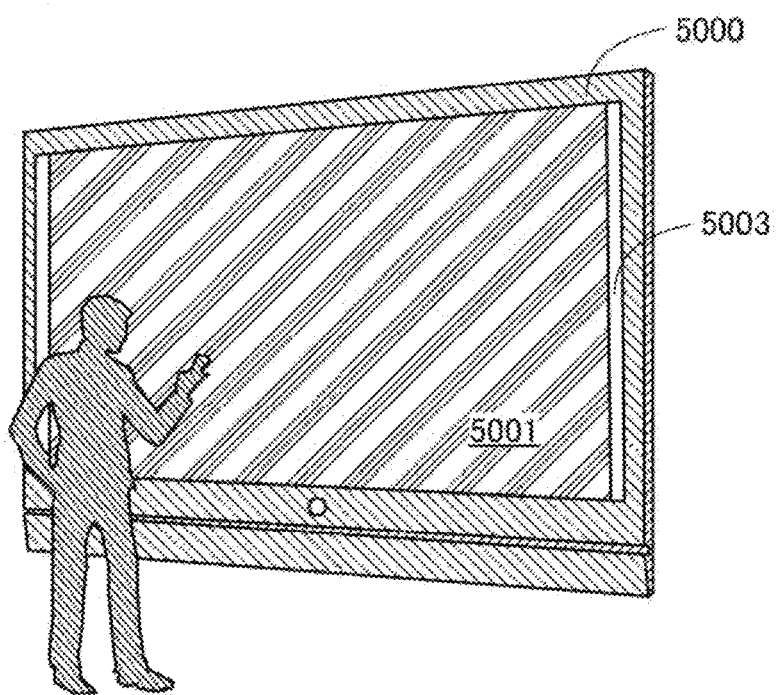
FIG. 40 Diagrams illustrating examples of electronic devices.
Figure 40B:
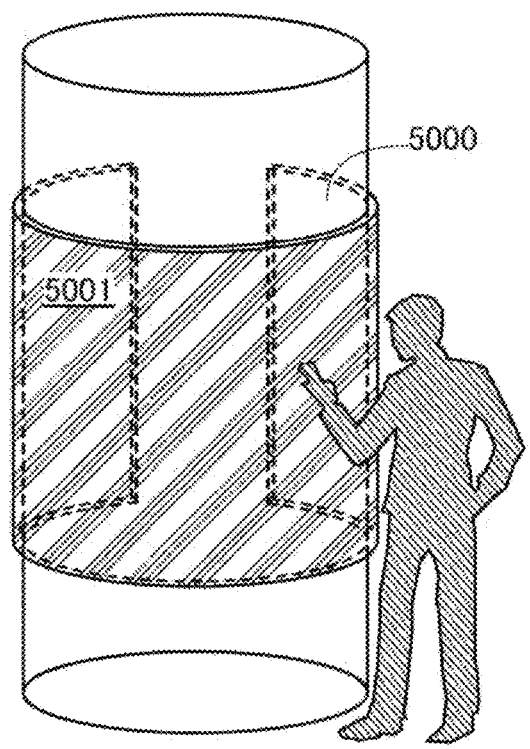

FIG. 39(A) illustrates a mobile computer, which can include a switch 5009, an infrared port 5010, and the like in addition to the above components. FIG. 39(B) illustrates a portable image reproducing device provided with a recording medium (for example, a DVD reproducing device), which can include a second display portion 5002, a recording medium reading portion 5011, and the like in addition to the above components. FIG. 39(C) illustrates a television device, which can include a stand 5012 and the like in addition to the above components. Furthermore, the television device can be operated by an operation switch of the housing 5000 or a separate remote controller 5013. With operation keys of the remote controller 5013, channels and volume can be controlled, and images displayed on the display portion 5001 can be controlled. Furthermore, the remote controller 5013 may be provided with a display portion for displaying data output from the remote controller 5013. FIG. 39(D) illustrates a portable game machine, which can include the recording medium reading portion 5011 and the like in addition to the above components. FIG. 39(E) illustrates a digital camera that has a television reception function and can include an antenna 5014, a shutter button 5015, an image receiving portion 5016, and the like in addition to the above components. FIG. 39(F) illustrates a portable game machine, which can include the second display portion 5002, the recording medium reading portion 5011, and the like in addition to the above components. FIG. 39(G) illustrates a portable television receiver, which can include a charger 5017 capable of transmitting and receiving signals, and the like in addition to the above components. FIG. 39(H) illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like. FIG. 40(A) illustrates a digital signage (Digital Signage: digital signage). FIG. 40(B) illustrates a digital signage mounted on a cylindrical pillar.

The electronic devices illustrated in FIGS. 39(A) to (H) and FIG. 40 can have a variety of functions, for example, a function of displaying a variety of information (for example, a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 39(A) to (H) and FIG. 40 are not limited thereto, and the electronic devices can have a variety of functions.

The electronic devices in this embodiment each include a display portion for displaying some kind of information. The liquid crystal display device of one embodiment of the present invention can be used in the display portion.

(Supplementary Notes on the Description in this Specification and the Like)

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that content (or may be part of the content) described in one embodiment may be applied to, combined with, or replaced by different content (or may be part of the different content) described in the embodiment and/or content (or may be part of the content) described in one or more different embodiments.

Note that in each embodiment, a content described in the embodiment is a content described with reference to a variety of diagrams or a content described with a text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in another embodiment or other embodiments, much more diagrams can be formed.

Furthermore, in each embodiment, one embodiment of the present invention has been described; however, one embodiment of the present invention is not limited to the described embodiment. The example in which a channel formation region of a transistor such as the transistor 203a includes polysilicon or an oxide semiconductor is described in Embodiment 2 as one embodiment of the present invention; however, one embodiment of the present invention is not limited thereto. Depending on circumstances or conditions, various semiconductors may be included in various transistors, a channel formation region of a transistor, a source region or a drain region of a transistor, or the like of one embodiment of the present invention. For example, at least one of silicon, germanium, silicon germanium, silicon carbide, gallium arsenide, aluminum gallium arsenide, indium phosphide, gallium nitride, an organic semiconductor, and the like may be included.

<Notes on the Description for Drawings>

In this specification and the like, terms for describing arrangement, such as "over" and "under," are used for convenience for describing the positional relation between components with reference to drawings. The positional relation between components is changed as appropriate in accordance with a direction in which the components are described. Thus, terms for describing arrangement are not limited to those used in this specification and can be changed to other terms as appropriate depending on the situation.

Furthermore, the term "over" or "under" does not necessarily mean that a component is placed directly above and in contact with or directly below and in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, blocks in a block diagram is not limited by any of the components described in the specification, and can be differently determined as appropriate depending on situations.

Furthermore, in drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or variation in signal, voltage, or current due to difference in timing.

Furthermore, in drawings such as a top view (also referred to as a plan view or a layout view) and a perspective view, some of components might not be illustrated for clarity of the drawings.

<Notes on Expressions that can be Rephrased>

In this specification or the like, in description of connection relation of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" or "wirings" formed in an integrated manner.

Furthermore, in this specification and the like, voltage and potential can be replaced with each other. The term, voltage refers to a potential difference from a reference potential. When the reference potential is a ground potential (ground potential), for example, voltage can be replaced with potential. The ground potential does not necessarily mean 0 V. Note that potentials are relative values, and the potential applied to a wiring or the like is changed depending on the reference potential, in some cases.

Note that in this specification and the like, the terms "film", "layer", and the like can be interchanged with each other depending on the case or circumstances. For example, the term "conductive layer" can be changed into the term "conductive film" in some cases. Also, the term "insulating film" can be changed into the term "insulating layer" in some cases.

Note that this specification and the like show a 1T-1C circuit configuration where one pixel has one transistor and one capacitor; however, one embodiment of the present invention is not limited to this example. It is possible to employ a circuit configuration where one pixel has two or more transistors and two or more capacitors. Moreover, a variety of circuit configurations can be obtained by formation of an additional wiring.

<Notes on Definitions of Terms>

The following are definitions of the terms that are not mentioned in the above embodiments.

[Switch]

In this specification and the like, a switch is in a conductive state (on state) or in a non-conductive state (off state) to determine whether current flows therethrough or not. Alternatively, a switch has a function of selecting and changing a current path.

Examples of the switch are an electrical switch, a mechanical switch, and the like. That is, any element can be used as a switch as long as it can control current, without limitation to a certain element.

Examples of the electrical switch are a transistor (for example, a bipolar transistor or a MOS transistor), a diode (for example, a PN diode, a PIN diode, a Schottky diode, an MIM (Metal Insulator Metal) diode, an MIS (Metal Insulator Semiconductor) diode, or a diode-connected transistor), and a logic circuit in which such elements are combined.

Note that in the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. Note that in the case where a transistor operates just as a switch, the polarity (conductivity type) of the transistor is not particularly limited to a certain type.

An example of the mechanical switch is a switch formed using an MEMS (micro electro mechanical systems) technology, such as a digital micromirror device (DMD). Such a switch includes an electrode which can be moved mechanically, and operates by controlling conduction and non-conduction in accordance with movement of the electrode.

[Channel Length]

In this specification and the like, the channel length refers to, for example, a distance between a source and a drain in a region where a semiconductor (or a portion where a current flows in a semiconductor when a transistor is in an on state) and a gate overlap with each other or a region where a channel is formed in a top view of the transistor.

Note that the channel length of a transistor is not necessarily constant in all regions. In other words, the channel length of a transistor is not limited to one value in some cases. Therefore, in this specification, the channel length is any one value, the maximum value, the minimum value, or the average value in a region where a channel is formed.

[Channel Width]

In this specification and the like, the channel width refers to, for example, the length of a portion where a source and a drain face each other in a region where a semiconductor (or a portion of the semiconductor in which current flows when a transistor is in the on state) and a gate electrode overlap with each other or in a region where a channel is formed.

Note that the channel width of a transistor is not necessarily constant in all regions. In other words, the channel width of a transistor is not limited to one value in some cases. Therefore, in this specification, the channel width is any one value, the maximum value, the minimum value, or the average value in a region where a channel is formed.

Note that depending on the transistor structure, the channel width in a region where a channel is actually formed (hereinafter referred to as an effective channel width) is different from the channel width shown in a top view of the transistor (hereinafter referred to as an apparent channel width.) in some cases. For example, in a transistor having a three-dimensional structure, the effective channel width is larger than the apparent channel width shown in a top view of the transistor, and an influence of the effective channel width cannot be ignored in some cases. For example, in a miniaturized transistor having a three-dimensional structure, the proportion of a channel region formed on a side surface of a semiconductor is high in some cases. In this case, the effective channel width obtained when a channel is actually formed is larger than the apparent channel width shown in a top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a "surrounded channel width (SCW: Surrounded Channel Width)" in some cases. Furthermore, in this specification, in the case where the term, channel width is simply used, it may represent a surrounded channel width or an apparent channel width. Alternatively, in this specification, in the case where the term, channel width is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

[Pixel]

In this specification and the like, one pixel refers to one element whose brightness can be controlled, for example. Therefore, for example, one pixel corresponds to one color element by which brightness is expressed. Accordingly, in a color display device using color elements of red (R), green (G), and blue (B), the smallest unit of an image is formed of three pixels of an R pixel, a G pixel, and a B pixel.

Note that the number of colors for color elements is not limited to three, and more colors may be used. For example, RGBW (W: white) or RGB added with yellow, cyan, or magenta may be employed.

[Display Element]

In this specification and the like, a display element such as a light-emitting element 104 includes a display medium whose contrast, luminance, reflectivity, transmittance, or the like is changed by electrical effect or magnetic effect. Examples of a display element include an EL (electroluminescence) element, an LED chip (a white LED chip, a red LED chip, a green LED chip, a blue LED chip, and the like), a transistor (a transistor that emits light depending on current), an electron-emissive element, a display element using a carbon nanotube, a liquid crystal element, electronic ink, an electrowetting element, an electrophoretic element, a plasma display (PDP), a display element using MEMS (microelectromechanical systems) (for example, a grating light valve (GLV), a digital micromirror device (DMD), a DMS (digital micro shutter), MIRASOL (registered trademark), an IMOD (interferometric modulation) element, an MEMS shutter display element, an optical-interference-type MEMS display element, a piezoelectric ceramic display), a carbon nanotube, and a display element using a quantum dot. Note that examples of display devices including EL elements include an EL display. Examples of display devices including electron-emissive elements are a field emission display (FED) and an SED-type flat panel display (SED: Surface-conduction Electron-emitter Display). Examples of display devices including liquid crystal elements include a liquid crystal display (a transmissive liquid crystal display, a transflective liquid crystal display, a reflective liquid crystal display, a direct-view liquid crystal display, and a projection liquid crystal display), and the like. Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight. The use of quantum dots enables display with high color purity. Note that in the case of a transflective liquid crystal display or a reflective liquid crystal display, some of or all of pixel electrodes function as reflective electrodes. For example, some or all of pixel electrodes are formed to contain aluminum, silver, or the like. Furthermore, in such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. Note that the GaN semiconductor layers included in the LED chip may be formed by MOCVD. Note that when the graphene is provided, the GaN semiconductor layers included in the LED chip can also be formed by a sputtering method. Furthermore, in the base of a display element including MEMS (microelectromechanical systems), a dry agent may be provided in a space where the display element is sealed (for example, between an element substrate over which the display element is placed and a counter substrate opposed to the element substrate). Providing a dry agent can prevent MEMS and the like from becoming difficult to move or deteriorating easily because of moisture or the like.

[Connection]

In this specification and the like, when it is described that A and B are connected to each other, the case where A and B are electrically connected to each other is included in addition to the case where A and B are directly connected to each other. Here, the expression A and B are electrically connected means the case where electric signals can be transmitted and received between A and B when an object having any electric action exists between A and B.

Note that, for example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expression includes, for example, "X, Y, and a source (or a first terminal or the like) and a drain (or a second terminal or the like) of the transistor are electrically connected to each other, and X, the source (or the first terminal or the like) of the transistor, the drain (or the second terminal or the like) of the transistor, and Y are electrically connected to each other in this order". Furthermore, the expression includes, for example, "a source of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Furthermore, the expression includes, for example, "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Furthermore, other examples of the expression include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." Furthermore, the expression includes, for example, "a source (or a first terminal or the like) of a transistor is electrically connected to X through at least Z1 on a first connection path, the first connection path does not include a second connection path, the second connection path includes a connection path on which the transistor is provided, a drain (or a second terminal or the like) of the transistor is electrically connected to Y at least through Z2 on a third connection path, and the third connection path does not include the second connection path". Furthermore, the expression includes, for example, "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (for example, a device, an element, a circuit, a wiring, an electrode, a terminal, a conductive film, or a layer).

REFERENCE NUMERALS

A1-A2 dashed-dotted line
B1-B2 dashed-dotted line
D1 data
D2 data
DL_n data line
DL_1 data line
DL_2 data line
DL_3 data line
GL_m gate line
GL_1 gate line
GL_2 gate line
$N_{LC1}$ node
$N_{LC2}$ node
P1 period
P2 period
P11 period
P12 period
P13 period
10_A pixel
10_B pixel
10_1 pixel
10_2 pixel
10_3 pixel
10_4 pixel
10_5 pixel
10_6 pixel
10_7 pixel
10_8 pixel
10_9 pixel
10_10 pixel
10_11 pixel 10_12 pixel
11 transistor
11_1 transistor
11_2 transistor
13_0 curve
13_1 curve
15 data transition period
16 period
21 display portion
22 gate line driver circuit
22B gate line driver circuit
23 data line driver circuit
24 control line driver circuit
31 conductive film
32 semiconductor film
33A conductive film
33B conductive film
34 conductive film
35 opening portion
36 conductive film
41 conductive film
42 slit
51 substrate
52 insulating film
53 insulating film
54 insulating film
55 insulating film
56 insulating film
102 substrate
104 light-emitting element
106 insulating film
107 insulating film
114 insulating film
116 insulating film
141 opening
142 opening
193 target
194 plasma
201a transistor
203a transistor
205a connection portion
207a liquid crystal element
211 substrate
213 insulating film
215 insulating film
217 insulating film
219 insulating film
221 gate electrode
223 oxide semiconductor film
225a source electrode
225b drain electrode
226 conductive film
227 oxide conductor film
227a oxide semiconductor film
231 conductive film
233 conductive film
235 conductive film
241 coloring film
243 light-blocking film
245 insulating film
247 spacer
249 liquid crystal
251 conductive film
252 conductive film
253 insulating film
254 conductive film
255 conductive film
257 connector
259 FPC
261 substrate
265 bonding layer
267 connector
268 IC
269 FPC
270 transistor
270A transistor
270B transistor
300 liquid crystal display device
301 display portion
302 gate line driver circuit
303 pixel
502 substrate
504 conductive film
506 insulating film
507 insulating film
508 oxide semiconductor film
508a oxide semiconductor film
508b oxide semiconductor film
508c oxide semiconductor film
511a oxide semiconductor film
511b oxide conductor film
512a conductive film
512b conductive film
514 insulating film
516 insulating film
518 insulating film
519 insulating film
552a opening portion
552b opening portion
552c opening portion
5000 housing
5001 display portion
5002 display portion
5003 speaker
5004 LED lamp
5005 operation key
5006 connection terminal
5007 sensor
5008 microphone
5009 switch
5010 infrared port
5011 recording medium reading portion
5012 stand
5013 remote controller
5014 antenna
5015 shutter button
5016 image receiving portion
5017 charger
5018 band
5019 clasp
5020 icon
5021 icon
6500 touch panel module
6501 circuit unit
6502 data line driver circuit
6503 sensor driver circuit
6504 sensing circuit
6505 timing controller
6506 image processing circuit
6510 touch panel
6511 display portion
6512 input portion
6513 gate line driver circuit
6520 IC 6530 IC
6531 substrate
6532 counter substrate
6533 FPC
6534 PCB
6540 CPU
8000 touch panel module
8001 upper cover
8002 lower cover
8003 FPC
8004 touch panel
8007 backlight
8008 light source
8009 frame
8010 printed board
8011 battery

The invention claimed is:

1. A liquid crystal display device comprising:
a first pixel, a second pixel, a first wiring, a second wiring, a third wiring, and a fourth wiring,
wherein the first pixel comprises a first transistor and a first liquid crystal element,
wherein the second pixel comprises a second transistor and a second liquid crystal element,
wherein the first transistor comprises a first gate and a second gate,
wherein one of a source and a drain of the first transistor is electrically connected to the first wiring,
wherein the other of the source and the drain of the first transistor is electrically connected to the first liquid crystal element,
wherein the first gate of the first transistor is electrically connected to the second wiring,
wherein the second gate of the first transistor is electrically connected to the third wiring,
wherein the second transistor comprises a first gate and a second gate,
wherein one of a source and a drain of the second transistor is electrically connected to the first wiring,
wherein the other of the source and the drain of the second transistor is electrically connected to the second liquid crystal element,
wherein the first gate of the second transistor is electrically connected to the second wiring,
wherein the second gate of the second transistor is electrically connected to the fourth wiring,
wherein the first wiring is configured to transmit a video voltage to the first pixel and the second pixel,
wherein the second wiring is configured to transmit a scan signal to the first pixel and the second pixel,
wherein the third wiring is configured to transmit a first control signal for controlling a threshold voltage of the first transistor, and
wherein the fourth wiring is configured to transmit a second control signal for controlling a threshold voltage of the second transistor.

2. The liquid crystal display device according to claim 1, wherein the third wiring and the fourth wiring are configured to transmit light.

3. The liquid crystal display device according to claim 1, wherein a frequency of each of the first control signal and the second control signal is smaller than a frequency of the scan signal.

4. The liquid crystal display device according to claim 1, wherein a voltage amplitude of the video voltage is smaller than a voltage amplitude of the first control signal or the second control signal.

5. An electronic device comprising the liquid crystal display device of claim 1.

6. A liquid crystal display device comprising:
a first pixel, a second pixel, a first wiring, a second wiring, a third wiring, and a fourth wiring,
wherein the first pixel comprises a first transistor and a first liquid crystal element,
wherein the second pixel comprises a second transistor and a second liquid crystal element,
wherein the first transistor comprises a first gate and a second gate,
wherein one of a source and a drain of the first transistor is electrically connected to the first wiring,
wherein the other of the source and the drain of the first transistor is electrically connected to the first liquid crystal element,
wherein the first gate of the first transistor is electrically connected to the second wiring,
wherein the second gate of the first transistor is electrically connected to the third wiring,
wherein the second transistor comprises a first gate and a second gate,
wherein one of a source and a drain of the second transistor is electrically connected to the first wiring,
wherein the other of the source and the drain of the second transistor is electrically connected to the second liquid crystal element,
wherein the first gate of the second transistor is electrically connected to the second wiring,
wherein the second gate of the second transistor is electrically connected to the fourth wiring,
wherein the first wiring is configured to transmit a video voltage to the first pixel and the second pixel,
wherein the second wiring is configured to transmit a scan signal to the first pixel and the second pixel,
wherein the third wiring is configured to transmit a first control signal for controlling a threshold voltage of the first transistor,
wherein the fourth wiring is configured to transmit a second control signal for controlling a threshold voltage of the second transistor, and
wherein the first transistor and the second transistor are transistors each comprising an oxide semiconductor in a channel formation region.

7. The liquid crystal display device according to claim 6, wherein the third wiring and the fourth wiring are configured to transmit light.

8. The liquid crystal display device according to claim 7, wherein the first gate of the first transistor comprises a region overlapping with the second gate of the first transistor, and
wherein the first gate of the second transistor comprises a region overlapping with the second gate of the second transistor.

9. The liquid crystal display device according to claim 6, wherein a frequency of each of the first control signal and the second control signal is smaller than a frequency of the scan signal.

10. The liquid crystal display device according to claim 6, wherein a voltage amplitude of the video voltage is smaller than a voltage amplitude of the first control signal or the second control signal.

11. An electronic device comprising the liquid crystal display device of claim 6.

* * * * *